(12) United States Patent
Oh et al.

(10) Patent No.: US 9,825,081 B2
(45) Date of Patent: Nov. 21, 2017

(54) SEMICONDUCTOR DEVICES HAVING A PAD STRUCTURE

(71) Applicant: Samsung Electronics Co., Ltd., Suwon-si (KR)

(72) Inventors: Taeseok Oh, Seoul (KR); Junetaeg Lee, Suwon-si (KR); Seung-Hun Shin, Suwon-si (KR); Jaesang Yoo, Seoul (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/229,265

(22) Filed: Aug. 5, 2016

(65) Prior Publication Data
US 2017/0040374 A1  Feb. 9, 2017

(30) Foreign Application Priority Data
Aug. 5, 2015 (KR) .................. 10-2015-0110701

(51) Int. Cl.
*H01L 31/0232* (2014.01)
*H01L 27/146* (2006.01)
*H01L 23/48* (2006.01)
*H01L 25/065* (2006.01)
*H01L 23/532* (2006.01)

(52) U.S. Cl.
CPC ...... *H01L 27/14636* (2013.01); *H01L 23/481* (2013.01); *H01L 25/0657* (2013.01); *H01L 27/14621* (2013.01); *H01L 27/14627* (2013.01); *H01L 23/53223* (2013.01); *H01L 23/53238* (2013.01); *H01L 23/53266* (2013.01)

(58) Field of Classification Search
CPC .......... H01L 25/0657; H01L 27/14636; H01L 25/50; H01L 27/14621; H01L 27/14627
USPC ........................................................ 257/432
See application file for complete search history.

(56) References Cited

U.S. PATENT DOCUMENTS

| | | | |
|---|---|---|---|
| 7,633,165 B2 | 12/2009 | Hsu et al. | |
| 8,278,152 B2 | 10/2012 | Liu et al. | |
| 8,426,938 B2 | 4/2013 | Park et al. | |
| 8,890,274 B2 | 11/2014 | Yu et al. | |
| 8,963,272 B2 | 2/2015 | Maekawa et al. | |
| 2006/0256222 A1 | 11/2006 | Tsai | |
| 2009/0085143 A1* | 4/2009 | Park | H01L 27/14603 257/459 |
| 2010/0244175 A1* | 9/2010 | Park | H01L 27/14636 257/459 |

(Continued)

FOREIGN PATENT DOCUMENTS

JP    2006-339566    12/2006

*Primary Examiner* — Andy Huynh
(74) *Attorney, Agent, or Firm* — Muir Patent Law, PLLC

(57) ABSTRACT

A semiconductor device includes a substrate, a circuit layer formed on a first surface of the substrate and including a via pad and an interlayer insulating layer covering the via pad, a via structure configured to fully pass through the substrate, partially pass through the interlayer insulating layer and be in contact with the via pad, a via isolation insulating layer configured to pass through the substrate and be spaced apart from outer side surfaces of the via structure in a horizontal direction and a pad structure buried in the substrate and exposed on a second surface of the substrate opposite the first surface of the substrate.

19 Claims, 43 Drawing Sheets

(56) References Cited

U.S. PATENT DOCUMENTS

2013/0181317 A1 7/2013 Wakiyama et al.
2013/0323875 A1 12/2013 Park et al.
2014/0151840 A1 6/2014 Cheng

* cited by examiner

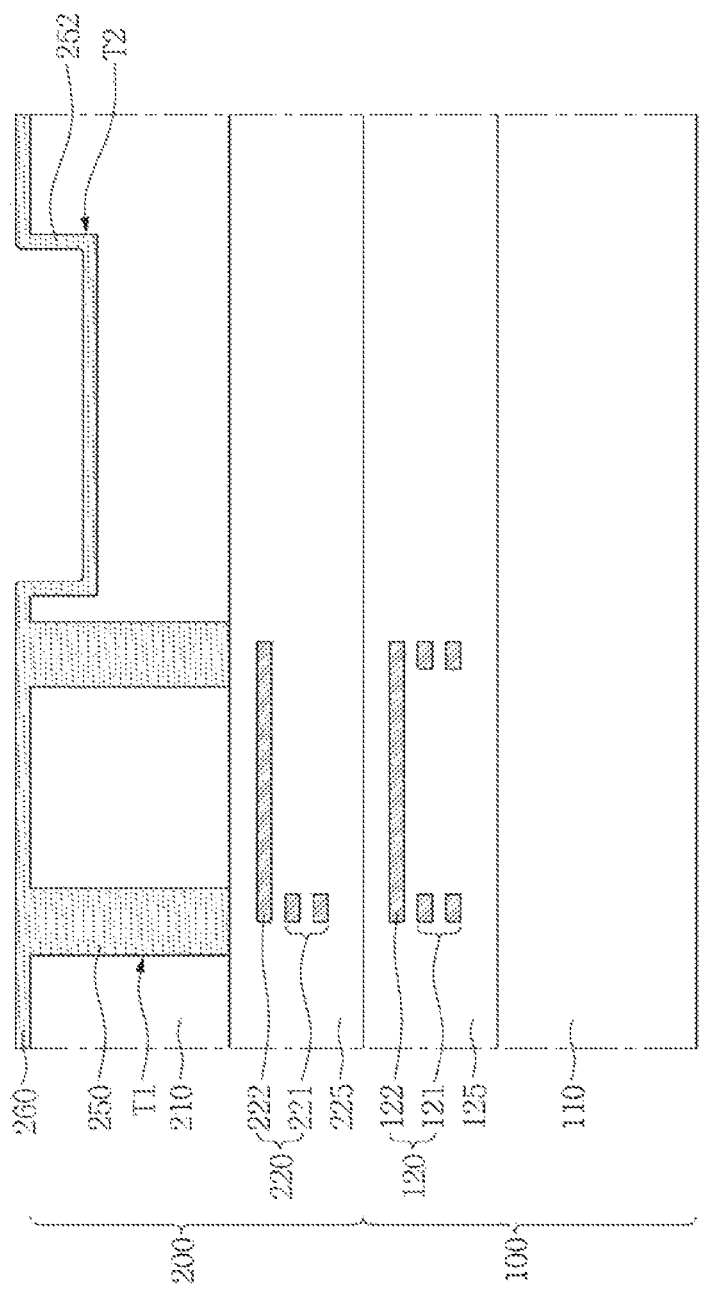

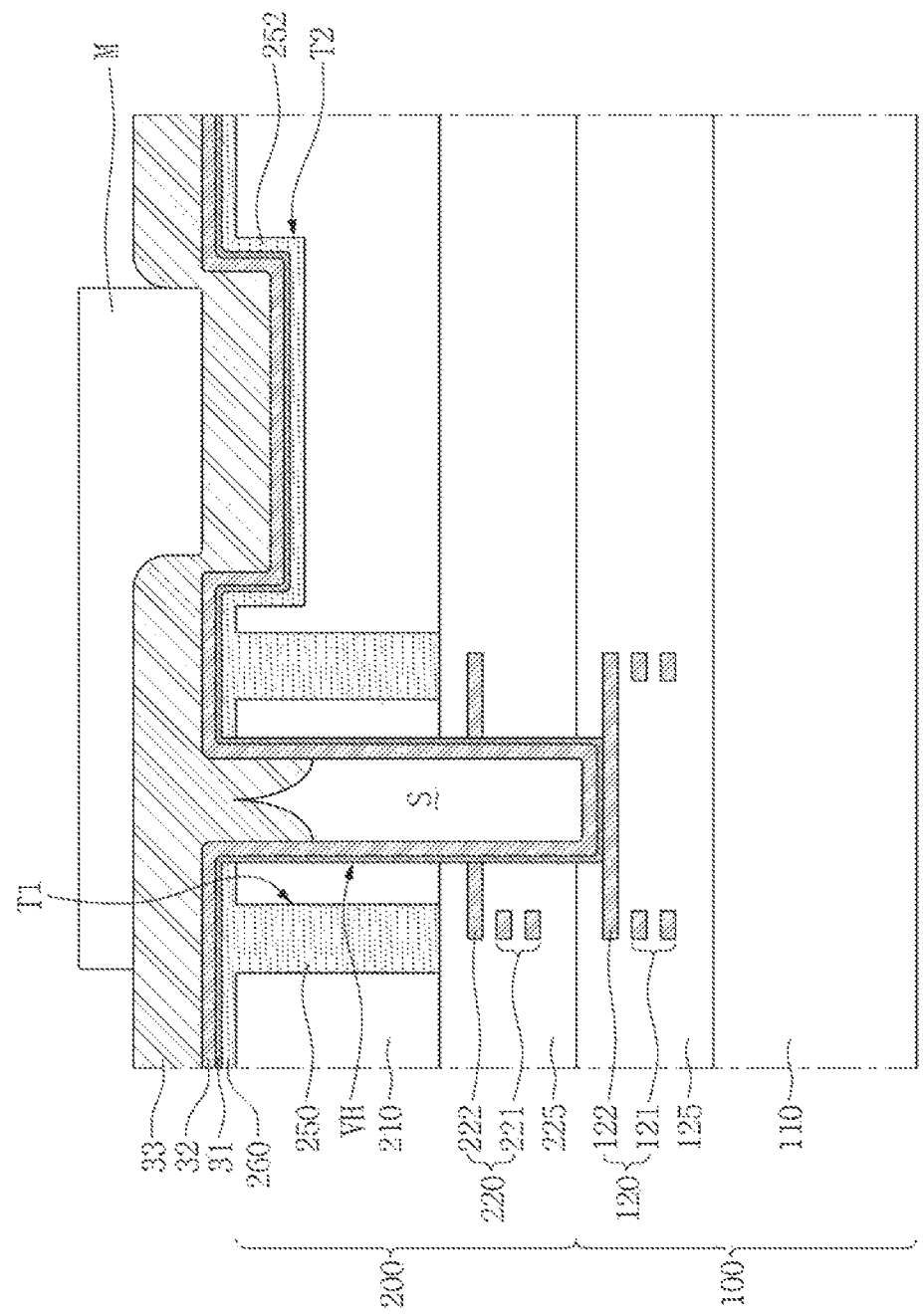

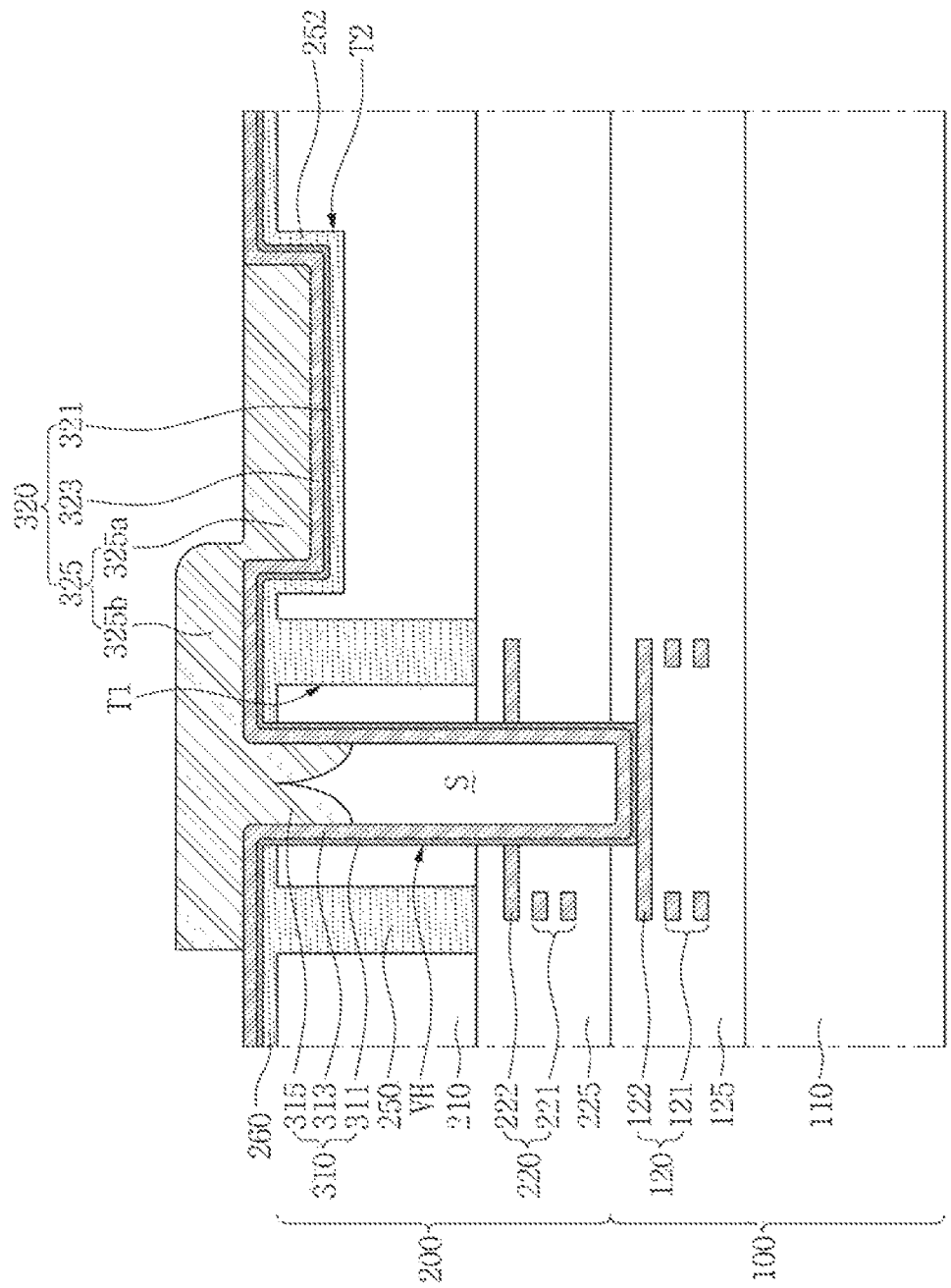

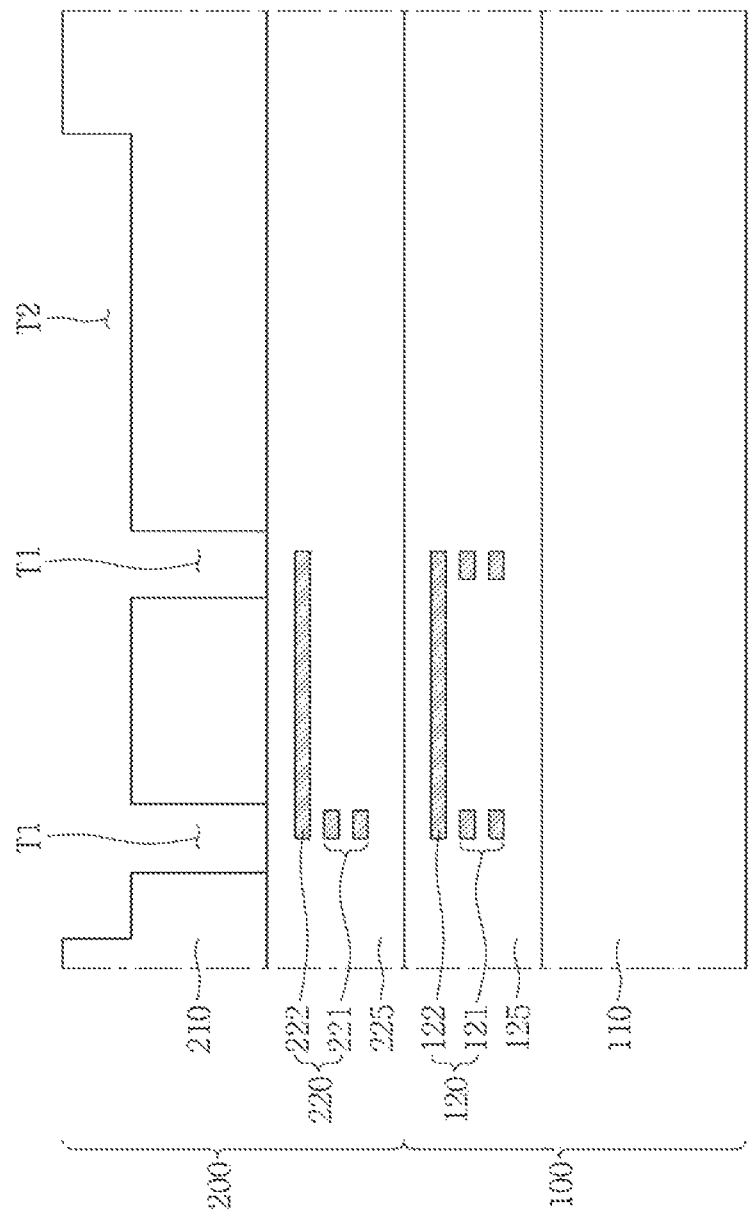

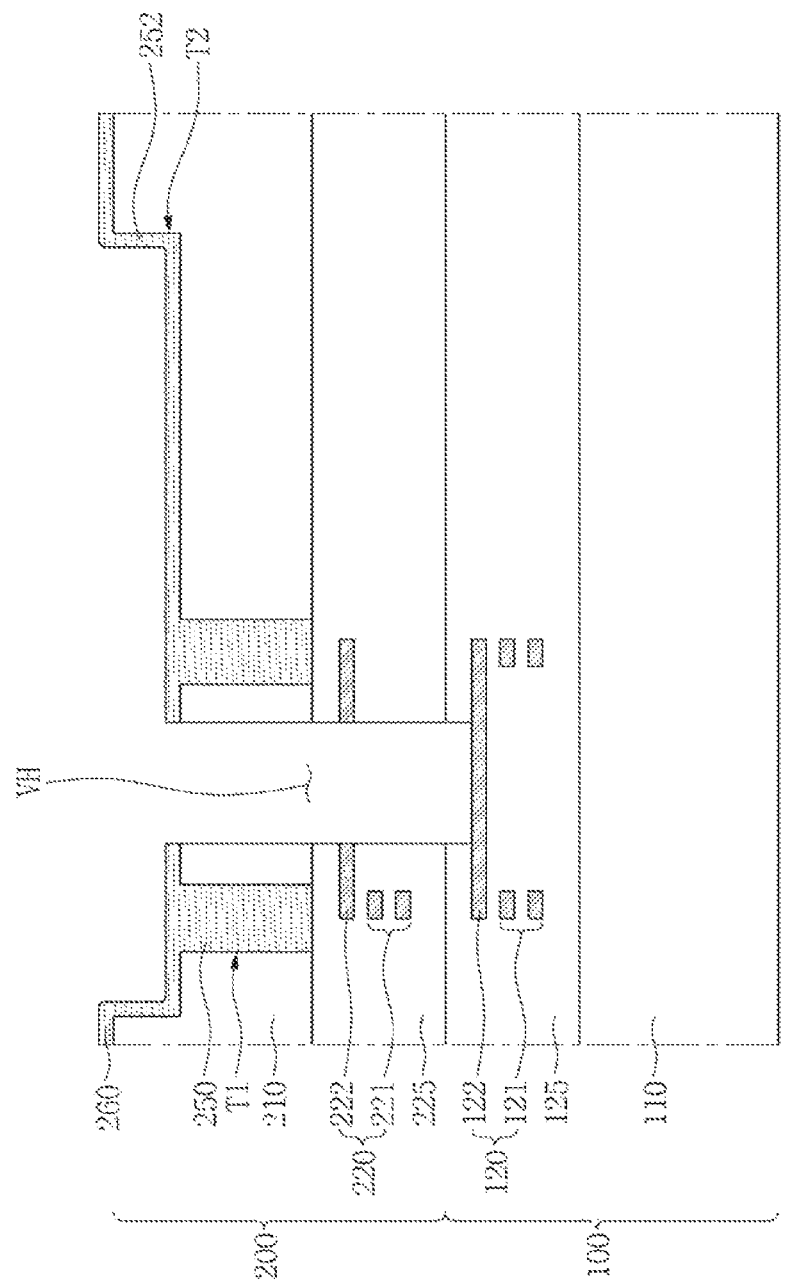

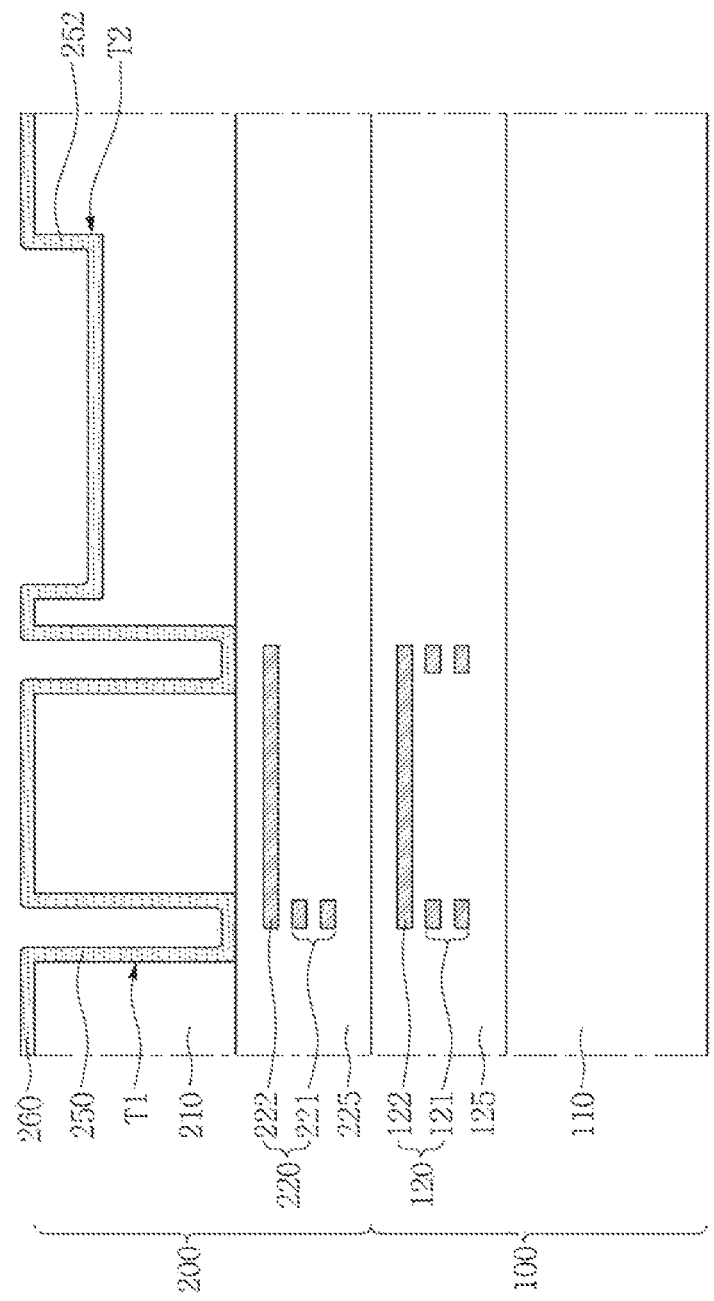

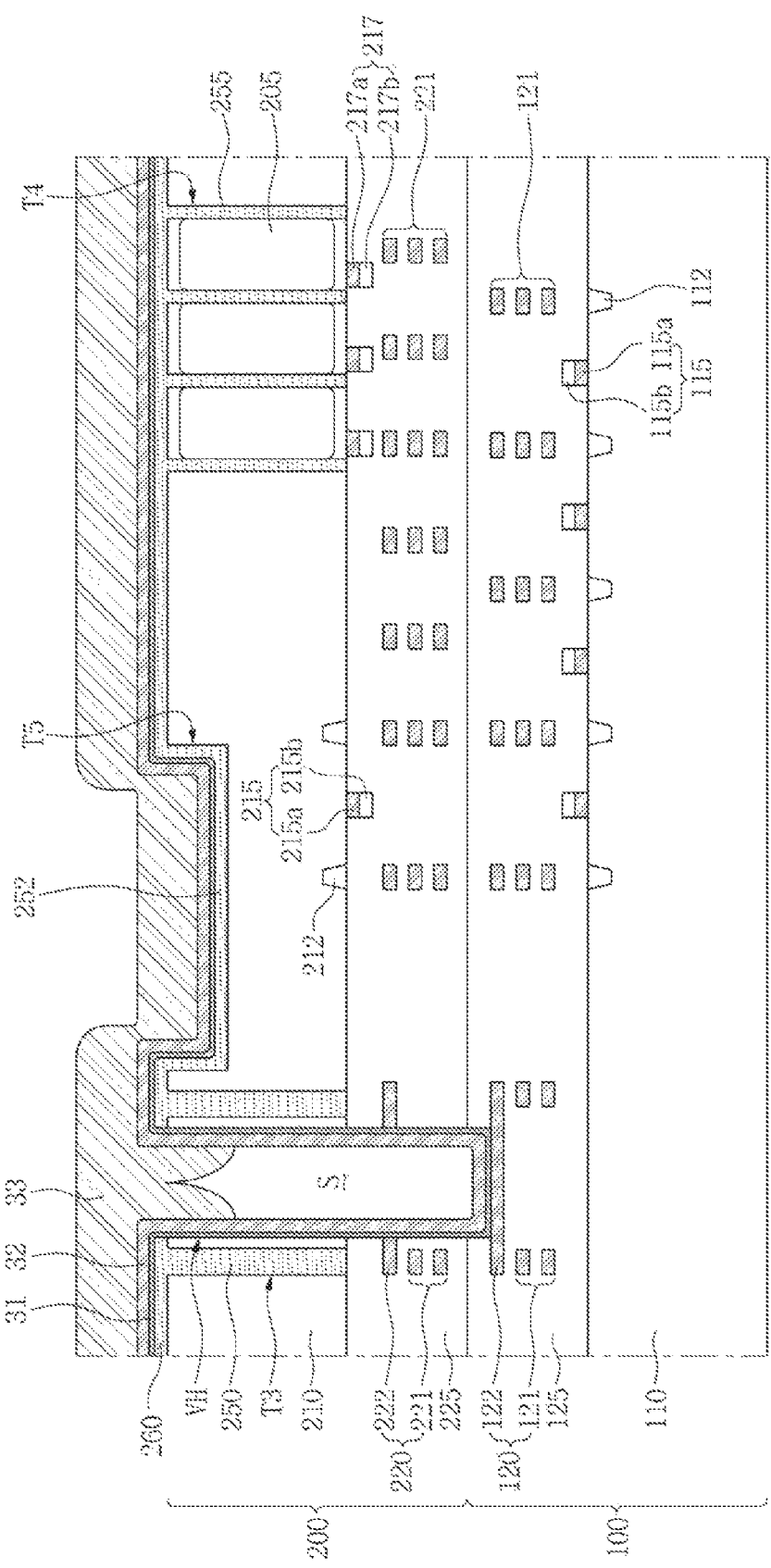

SEMICONDUCTOR DEVICES HAVING A PAD STRUCTURE

CROSS-REFERENCE TO RELATED APPLICATION

This application claims the benefit of priority under 35 U.S.C. §119 to Korean Patent Application No. 10-2015-0110701, filed on Aug. 5, 2015, in the Korean Intellectual Property Office, the disclosure of which is incorporated herein by reference in its entirety.

BACKGROUND

Technical Field

The disclosed concepts relate to a semiconductor device having a pad structure and a method of manufacturing the same.

Description of Related Art

A backside illuminated image sensor includes an upper device and a lower device, which are bonded to each other, and a through-silicon via (TSV). A landing pad for connection to the outside can be formed on the through-silicon via (TSV). The landing pad is formed to protrude from a substrate of the upper device. Accordingly, a level difference between the landing pad and a surface of the substrate occurs.

SUMMARY

Example embodiments of the disclosed concepts provide semiconductor devices capable of minimizing a level difference between a substrate and a pad.

Example embodiments of the disclosed concepts provide methods of fabricating the semiconductor devices.

Example embodiments of the disclosed concepts provide a backside illuminated image sensor capable of minimizing a level difference between a substrate and a pad.

Example embodiments of the disclosed concepts provide a method of manufacturing the backside illuminated image sensor.

Example embodiments of the disclosed concepts provide a camera system and electronic system having the backside illuminated image sensor.

The technical objectives of the disclosed concepts are not limited to the above disclosure, and other objectives may become apparent to those of ordinary skill in the art based on the following descriptions.

In accordance with an aspect of the disclosed embodiments, a semiconductor device includes a substrate, a circuit layer formed on a first surface of the substrate and including a via pad and an interlayer insulating layer covering the via pad, a via structure configured to fully pass through the substrate, partially pass through the interlayer insulating layer and be in contact with the via pad, a via isolation insulating layer configured to pass through the substrate and be spaced apart from outer side surfaces of the via structure in a horizontal direction and a pad structure buried in the substrate and exposed on a second surface of the substrate opposite the first surface of the substrate.

In accordance with an aspect of the disclosed embodiments, a semiconductor device includes a lower substrate, a lower interlayer insulating layer on the lower substrate, wherein the lower interlayer insulating layer includes a lower via pad, an upper interlayer insulating layer on the lower interlayer insulating layer, wherein the upper interlayer insulating layer includes an upper via pad, an upper substrate on the upper interlayer insulating layer, a via structure configured to fully pass through the upper substrate and the upper interlayer insulating layer, partially pass through the lower interlayer insulating layer, and be in contact with the upper via pad and the lower via pad, a via isolation insulating layer configured to pass through and be spaced apart from outer side surfaces of the via structure, a pad structure having a buried part buried in the upper substrate and a protruding part that protrudes from a top surface of the upper substrate, a pad insulating layer disposed between a bottom and side surfaces of the pad structure and a surface of the upper substrate, a passivation layer formed on the top surface of the upper substrate to expose a portion of a top surface of the pad structure, a photodiode formed in the upper substrate, a color filter disposed on the passivation layer and vertically aligned with the photodiode, and a microlens disposed on the color filter.

In accordance with an aspect of the disclosed embodiments, a semiconductor device includes a lower device including a lower substrate and a lower circuit and a lower interlayer insulating layer on the lower substrate, an upper device disposed on the lower device and including an upper substrate, and an upper circuit and an upper interlayer insulating layer under the upper substrate, a via structure configured to fully pass through the upper substrate and the upper interlayer insulating layer, partially pass through the lower interlayer insulating layer and be electrically connected to the upper circuit and the lower circuit, a via isolation insulating layer configured to pass through and be spaced apart from outer side surfaces of the via structure, a pad structure almost buried in the upper substrate, a pad insulating layer disposed between a bottom and side surfaces of the pad structure and a surface of the upper substrate, a passivation layer on the top surface of the upper substrate to expose a portion of a top surface of the pad structure, a photodiode formed in the upper substrate, a color filter disposed on the passivation layer and vertically aligned with the photodiode, and a microlens disposed on the color filter.

According to certain embodiments, the disclosure is directed to a semiconductor device comprising: a substrate; a circuit layer formed on a first surface of the substrate and including a via pad and an interlayer insulating layer covering the via pad; a via structure passing fully through the substrate, passing partially through the interlayer insulating layer, and contacting the via pad; a via isolation insulating layer passing through the substrate and spaced apart from outer side surfaces of the via structure in a horizontal direction; and a pad structure buried in the substrate and exposed at a second surface of the substrate opposite the first surface of the substrate.

In some aspects, the disclosure further includes wherein the pad structure is spaced apart from the via isolation insulating layer in a horizontal direction.

In some aspects, the disclosure further includes wherein the via structure includes: a via barrier pattern conformally formed on a bottom surface and inner sidewalls of a via hole which fully passes through the substrate and partially passes through the interlayer insulating layer; a first via pattern conformally formed on the via barrier pattern; and a second via pattern formed on the first via pattern, and wherein the pad structure includes: a pad barrier pattern conformally formed on a bottom surface and inner sidewalls of a pad trench formed in the substrate; a first pad pattern conformally formed on the pad barrier pattern; and a second pad pattern formed on the first pad pattern.

In some aspects, the disclosure further includes wherein: the via barrier pattern is in material continuity with the pad barrier pattern; and the first via pattern is in material continuity with the first pad pattern.

In some aspects, the disclosure further includes wherein the second via pattern partially fills the via hole.

In some aspects, the disclosure further includes wherein the second pad pattern includes: a first portion spaced apart from the via isolation insulating layer in a horizontal direction and buried in the pad trench; and a second portion extending onto the via structure.

In some aspects, the disclosure further includes wherein the second via pattern fully fills the via hole.

In some aspects, the disclosure further includes wherein the via barrier pattern, the first via pattern, the pad barrier pattern, and the first pad pattern extend onto the second surface of the substrate.

In some aspects, the disclosure further includes wherein the pad structure vertically overlaps the via structure and the via isolation insulating layer.

In some aspects, the disclosure further includes further comprising: a pad insulating layer formed between the substrate and the pad structure; and a capping insulating layer formed on the second surface of the substrate, wherein the via isolation insulating layer, the pad insulating layer, and the capping insulating layer are in continuity materially.

In some aspects, the disclosure further includes wherein the pad structure includes a buried part buried in the substrate and a protruding part that protrudes from the second surface of the substrate.

In some aspects, the disclosure further includes wherein the interlayer insulating layer is a lower insulating layer and the via pad is a lower via pad, the semiconductor device further comprising: a lower substrate; and an upper interlayer insulating layer on the lower interlayer insulating layer, wherein the upper interlayer insulating layer includes an upper via pad, and wherein the lower insulating layer is on the lower substrate.

According to certain embodiments, the disclosure is directed to a semiconductor device comprising: a substrate; a via structure passing fully through the substrate and contacting a via pad; a via isolation insulating layer passing through the substrate and spaced apart from outer side surfaces of the via structure; a pad structure having a buried part buried in the substrate and a protruding part protruding from a top surface of the substrate; a pad insulating layer between a bottom and side surfaces of the pad structure and a surface of the substrate; a passivation layer on the top surface of the substrate and formed to expose a portion of a top surface of the pad structure; a photodiode in the substrate; a color filter disposed on the passivation layer and vertically aligned with the photodiode; and a microlens on the color filter.

In some aspects, the disclosure further includes a circuit layer formed on a first surface of the substrate and including the via pad and an interlayer insulating layer covering the via pad.

In some aspects, the disclosure further includes wherein the pad structure is spaced apart from the via isolation insulating layer in a horizontal direction.

According to certain embodiments, the disclosure is directed to a semiconductor device comprising: an upper substrate on the upper interlayer insulating layer; a via structure passing fully through the upper substrate and the upper interlayer insulating layer, passing partially through the lower interlayer insulating layer, and contacting the upper via pad and the lower via pad; a via isolation insulating layer passing through the upper substrate and spaced apart from outer side surfaces of the via structure; a pad structure having a buried part buried in the upper substrate and a protruding part that protrudes from a top surface of the upper substrate; a pad insulating layer between a bottom and side surfaces of the pad structure and a surface of the upper substrate; a passivation layer on the top surface of the upper substrate and formed to expose a portion of a top surface of the pad structure; a photodiode in the upper substrate; a color filter disposed on the passivation layer and vertically aligned with the photodiode; and a microlens on the color filter.

In some aspects, the disclosure further includes: a lower substrate; a lower interlayer insulating layer on the lower substrate, wherein the lower interlayer insulating layer includes a lower via pad; and an upper interlayer insulating layer on the lower interlayer insulating layer, wherein the upper interlayer insulating layer includes an upper via pad.

In some aspects, the disclosure further includes wherein the pad structure is spaced apart from the via isolation insulating layer in a horizontal direction.

In some aspects, the disclosure further includes wherein the pad structure vertically overlaps the via structure and the via isolation insulating layer.

In some aspects, the disclosure further includes wherein a portion of the pad structure extends onto the via structure.

BRIEF DESCRIPTION OF THE DRAWINGS

The foregoing and other features and advantages will be apparent from the accompanying drawings in which like reference numerals denote the same respective parts throughout the different views. The drawings are not necessarily to scale, emphasis instead being placed upon illustrating the principles of the inventive concepts. In the drawings:

FIGS. 3A to 10F are views for describing methods of fabricating semiconductor devices according to some example embodiments;

DETAILED DESCRIPTION

Figure 1A:
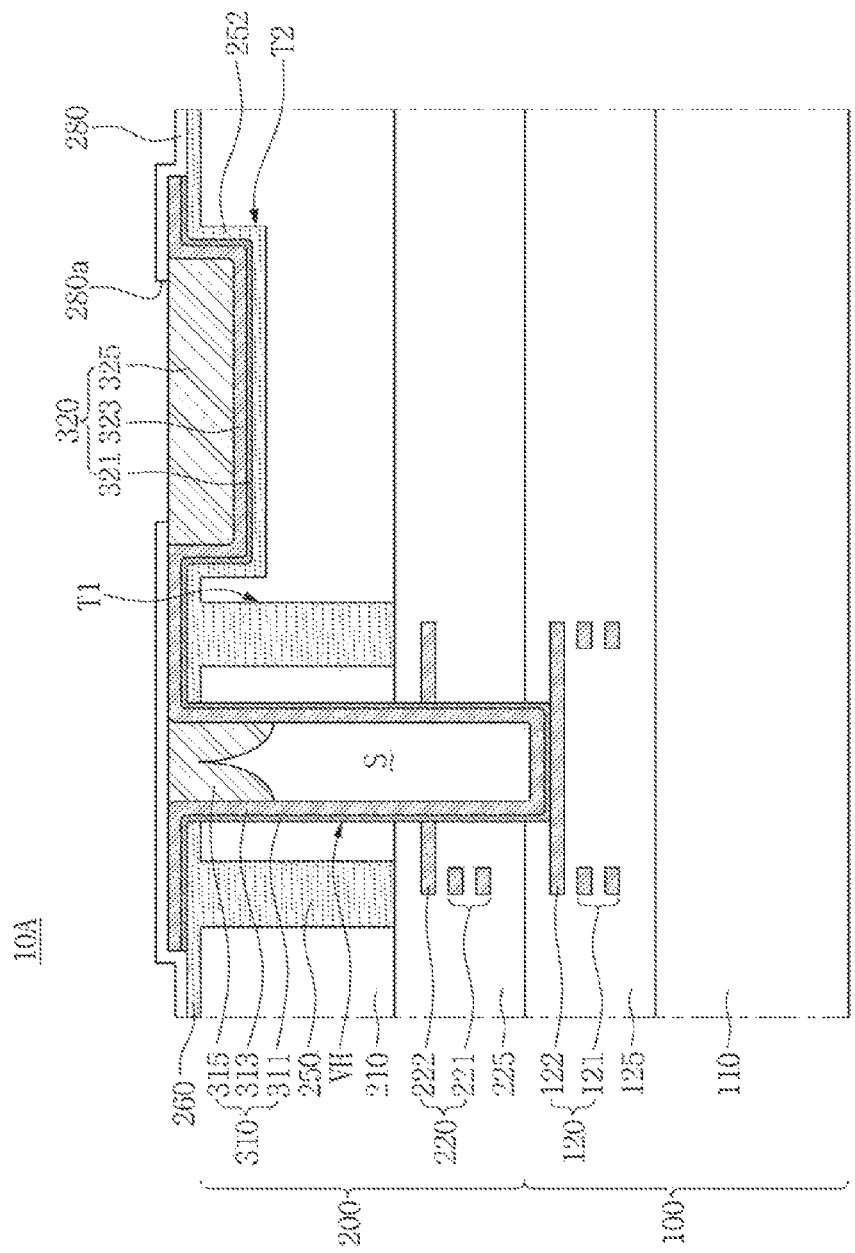
FIGS. 1A to 1G are longitudinal cross-sectional views of semiconductor devices according to some example embodiments.

The present disclosure now will be described more fully hereinafter with reference to the accompanying drawings, in which various embodiments are shown. The invention may, however, be embodied in many different forms and should not be construed as limited to the example embodiments set forth herein. These example embodiments are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

In the drawings, the size and relative sizes of layers and regions may be exaggerated for clarity. Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole.

The terminology used herein to describe embodiments is not intended to limit the scope of the disclosed concepts. The articles "a," "an," and "the" are singular in that they have a single referent; however, the use of the singular form in the present document should not preclude the presence of more than one referent. In other words, elements referred to in the singular form may number one or more, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on," "connected to," or "coupled to" another element or layer, it can be directly on, connected to, or coupled to the other element or layer or intervening elements or layers may be present. In contrast, when an element is referred to as being "directly on," "directly connected to," or "directly coupled to" another element or layer, or as "contacting" or "in contact with" another element or layer, there are no intervening elements or layers present. In the following explanation, the same reference numerals denote the same components throughout the specification.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Spatially relative terms, such as "beneath," "below," "lower," "above," "upper," and the like may be used herein to describe the relationship of one element or feature to another, as illustrated in the drawings. It will be understood that such descriptions are intended to encompass different orientations in use or operation in addition to orientations depicted in the drawings. For example, if a device is turned over, elements described as "below" or "beneath" other elements or features would then be oriented "above" the other elements or features. Thus, the term "below" is intended to mean both above and below, depending upon overall device orientation.

Embodiments are described herein with reference to cross-sectional and/or planar illustrations that are schematic illustrations of idealized embodiments and intermediate structures. In the drawings, the sizes and relative sizes of layers and regions may be exaggerated for clarity. Therefore, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present inventive concept.

Terms such as "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes.

Like numerals refer to like elements throughout the specification. Accordingly, the same numerals and similar numerals can be described with reference to other drawings, even if not specifically shown in a corresponding drawing. Further, when a numeral is not marked in a drawing, the numeral can be described with reference to other drawings. Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

The semiconductor devices described herein may be part of an electronic device, such as a semiconductor memory chip or semiconductor logic chip, a stack of such chips, a semiconductor package including a package substrate and one or more semiconductor chips, a package-on-package device, or a semiconductor memory module, for example. In the case of memory, the semiconductor device may be part of a volatile or non-volatile memory.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

In the specification, "a via structure" may refer to a through-substrate via, which may be, for example, a through-silicon via (TSV), passing through a silicon wafer (or substrate) and silicon oxide (that is on the substrate). As used herein, the terms "material continuity" and "materially in continuity" may refer to structures, patterns, and/or layers that are formed at the same time and of the same material, without a break in the continuity of the material of which they are formed. As one example, structures, patterns, and/or layers that are in "material continuity" or "materially in continuity" may be homogeneous monolithic structures. The term "buried" may refer to structures, patterns, and/or layers that are formed at least partially below a top surface of another structure, pattern, and/or layer. In some embodiments, when a first structure, pattern, and/or layer is "buried" in a second structure, pattern, and/or layer, the second structure, pattern, and/or layer may surround at least a portion of the first structure, pattern, and/or layer. For example, a first structure, pattern, and/or layer first may be considered to be buried when it is at least partially embedded in a second structure, pattern, and/or layer.

FIG. 1A is a longitudinal cross-sectional view of a semiconductor device, according to certain exemplary embodiments.

Referring to FIG. 1A, a semiconductor device 10A may include a lower device 100, an upper device 200, a via isolation insulating layer 250, a pad insulating layer 252, a capping insulating layer 260, a via structure 310, a pad structure 320, and a passivation layer 280.

The lower device 100 may include a lower substrate 110 and a lower circuit 120 formed on the lower substrate 110.

The lower substrate 110 may include a bulk single crystalline silicon wafer, a silicon-on-insulator (SOI) wafer, a compound semiconductor wafer including, for example, a silicon germanium (SiGe), a wafer on which a silicon epitaxial layer is grown, etc.

The lower circuit 120 may include lower interconnections 121 and a lower via pad 122. The lower via pad 122 may be in contact with and electrically connected to a lower end of the via structure 310. For example, the lower via pad 122 may be under and in contact with a bottom surface of the via structure 310. The lower interconnections 121 and the lower via pad 122 may include a metal (e.g., tungsten, aluminum, copper, etc.), a metal silicide (e.g., tungsten silicide, titanium silicide, etc.), a metal compound (e.g., tungsten nitride, titanium nitride, etc.), or a doped polycrystalline silicon (e.g., poly-Si).

The lower device 100 may include a lower interlayer insulating layer 125 surrounding and covering the lower interconnection 121 and the lower via pad 122. The lower interlayer insulating layer 125 may include silicon oxide.

The upper device 200 may be stacked on the lower device 100. The upper device 200 and the lower device 100 may be bonded.

The upper device 200 may include an upper substrate 210 and an upper circuit 220 on the upper substrate 210. For example, the upper circuit 220 may be between the upper substrate 210 and the lower circuit 120. The upper circuit 220, including the upper interlayer insulating layer 225 and the circuit components included therein, may be referred to as a circuit layer. Similarly, the lower circuit 120, including the lower interlayer insulating layer 125 and circuits included therein, may be referred to as a circuit layer. In some embodiments, the upper circuit 220 and the lower circuit 120, including their respective upper and lower interlayer insulating layers 225 and 125 and included circuits, may be referred to as a circuit layer.

The upper substrate 210 may include a bulk single crystalline silicon wafer, an SOI wafer, a compound semiconductor wafer including, for example, a silicon germanium (SiGe), a wafer on which a silicon epitaxial layer is grown, etc.

A via isolation trench T1 and a pad trench T2 may be formed in the upper substrate 210. The via isolation trench T1 may be formed to pass through the upper substrate 210 and expose the upper interlayer insulating layer 225. The pad trench T2 may be formed to be spaced apart from the via isolation trench T1 in a horizontal direction. The via isolation trench T1 may have a shape that surrounds the via structure 310 when viewed from a top view. A bottom surface of the pad trench T2 may be located at a level higher than a bottom surface of the via isolation trench T1. A horizontal width of the pad trench T2 may be greater than a horizontal width of the via isolation trench T1.

The upper circuit 220 may include upper interconnection 221 and upper via pad 222. Though one upper interconnection 221 and upper via pad 222 is shown, a plurality of upper interconnections and upper via pads maybe included in upper circuit 220. The upper via pad 222 may be in contact with a bottom surface of the via structure 310 or side surfaces of the via structure 310, and may be electrically connected to the via structure 310. In some embodiments, the upper via pad 222 may be spaced apart and electrically insulated from the via structure 310.

The upper interconnection 221 and the upper via pad 222 may include a metal (such as, e.g., tungsten, aluminum, or copper), a metal silicide (such as, e.g., tungsten silicide or titanium silicide), a metal compound (such as, e.g., tungsten nitride or titanium nitride), or doped poly-Si.

The upper device 200 may include an upper interlayer insulating layer 225 surrounding and covering the upper interconnection 221 and the upper via pad 222. The upper interlayer insulating layer 225 may include silicon oxide.

The via isolation insulating layer 250 may be formed to fill the via isolation trench T1 passing through the upper substrate 210. Accordingly, a bottom surface of the via isolation insulating layer 250 may be in contact with the upper interlayer insulating layer 225. The via isolation insulating layer 250 may be spaced apart from outer side surface of the via structure 310 in a horizontal direction. For example, the via isolation insulating layer 250 may be disposed between the via structure 310 and the pad structure 320. The via isolation insulating layer 250 may surround the via structure 310 when viewed from a top view. Accordingly, the via structure 310 may be electrically insulated from the upper substrate 210.

The pad insulating layer 252 may be conformally formed on a bottom surface and inner sidewalls of the pad trench T2 formed in the upper substrate 210.

The capping insulating layer 260 may be conformally formed on a top surface of the upper substrate 210.

The via isolation insulating layer 250, the pad insulating layer 252, and the capping insulating layer 260 may be materially in continuity with each other. For example, the via isolation insulating layer 250, the pad insulating layer 252, and the capping insulating layer 260 may include, for example, silicon oxide, silicon nitride, etc.

The via structure 310 may be formed to fully pass through the upper device 200, including the upper substrate 210 and the upper circuit 220, and partially pass through an upper portion of the lower interlayer insulating layer 125 of the lower device 100. The via structure 310 may be electrically connected to the upper via pad 222 of the upper device 200 and the lower via pad 122 of the lower device 100.

The via structure 310 may include a via barrier pattern 311, a first via pattern 313, and a second via pattern 315. The via hole VH may pass through the upper device 200 and expose the lower via pad 122 of the lower device 100.

The via barrier pattern 311 may be conformally formed on a bottom surface and inner sidewalls of the via hole VH that passes through the upper device 200 and exposes the lower via pad 122. For example, the via barrier pattern 311 may be in contact with the lower via pad 122. The via barrier pattern 311 may include barrier metals, such as, for example, titanium (Ti), titanium nitride (TiN), tantalum (Ta), tantalum nitride (TaN), titanium tungsten (TiW), etc. The via barrier pattern 311 may extend onto a portion of a top surface of the capping insulating layer 260 on a top surface of the upper substrate 210.

The first via pattern 313 may be conformally formed on the via barrier pattern 311. The first via pattern 313 may include a metal, such as tungsten (W), aluminum (Al), cobalt (Co), nickel (Ni), or copper (Cu). For example, the first via pattern 313 may include tungsten (W). The first via pattern 313 may extend onto a portion of a top surface of the capping insulating layer 260 on a top surface of the upper substrate 210. In some embodiments, at least a portion of the via barrier pattern 311 may be between the first via pattern 313 and the top surface of the capping insulating layer 260.

The second via pattern 315 may be formed to partially fill the via hole VH on the first via pattern 313. For example, the second via pattern 315 may be formed in an upper portion of the via hole VH. Accordingly, an air space S may be formed in a lower portion of the via hole VH. In some embodiments, the air space S may form more than one-half the space in the via hole VH. The air space S may be defined by the second via pattern 315 and the first via pattern 313. For example, the first via pattern 313 and the second via pattern 315 may surround and enclose the air space S. As is understood in the art, an "air space" is not required to comprise air in the space, but may include other gasses or a gap with no or substantially no gas (i.e., a vacuum). The second via pattern 315 may include a metal, such as tungsten (W), aluminum (Al), cobalt (Co), nickel (Ni), or copper (Cu). The second via pattern 315 may include a different metal material from that of the first via pattern 313. For example, when the first via patter 313 includes tungsten (W), the second via pattern 315 may include aluminum (Al).

The pad structure 320 may be formed to fill the pad trench T2 of the upper substrate 210. A large portion of the pad structure 320 may be buried in the upper substrate 210. For example, a portion of the pad structure 320 may be buried in the upper substrate 210 and another portion of the pad structure 320 may protrude above a top surface of the upper substrate 210. The volume of the pad structure 320 protruding above the top surface of the upper substrate 210 may be smaller than the volume of the pad structure 320 buried in the upper substrate 210. In some embodiments, for example, at least 80% of the pad structure 320 may be buried in the upper substrate 210. Here, a vertical length of the pad structure 320 protruding from the top surface of the upper substrate 210 may be smaller than a vertical length of the pad structure 320 buried in the upper substrate 210. The pad structure 320 may not vertically overlap the via structure 310. The pad structure 320 may be spaced apart from the via structure 310 in a horizontal direction. The pad structure 320 may include a pad barrier pattern 321, a first pad pattern 323, and a second pad pattern 325.

The pad barrier pattern 321 may be conformally formed on the pad insulating layer 252 in the pad trench T2. The pad barrier pattern 321 may include a barrier metal, such as, for example, titanium (Ti), titanium nitride (TiN), tantalum (Ta), tantalum nitride (TaN), titanium tungsten (TiW), etc. The pad barrier pattern 321 may be materially in continuity with the via barrier pattern 311. The pad barrier pattern 321 may extend onto a portion of a top surface of the capping insulating layer 260 on the top surface of the upper substrate 210.

The first pad pattern 323 may be conformally formed on the pad barrier pattern 321. The first pad pattern 323 may include a metal such as tungsten (W), aluminum (Al), cobalt (Co), nickel (Ni), or copper (Cu). The first pad pattern 323 may be materially in continuity with the first via pattern 313. The first pad pattern 323 may extend onto a portion of a top surface of the capping insulating layer 260 on the top surface of the upper substrate 210.

The second pad pattern 325 may be formed on the first pad pattern 323 in the pad trench T2. Side and bottom surfaces of the second pad pattern 325 may be surrounded by the first pad pattern 323. For example, the interior side and top surfaces of the first pad pattern 323 may surround and be in contact with the exterior side and bottom surfaces of the second pad pattern 325. The second pad pattern 325 may include the same metal material as the second via pattern 315. The pad structure 320 may be electrically connected to the via structure 310 through the first pad pattern 323 and the first via pattern 313, which may be materially in continuity with each other, and/or the pad barrier pattern 321 and the via barrier pattern 311, which may be materially in continuity with each other. For example, the first pad pattern 323 and the first via pattern 313 may be in material continuity with one another and provide an electrical connection from the pad structure 320 to the via structure 310. In certain embodiments, the first pad pattern 323 and the first via pattern 313 may be a homogeneous monolithic structure. For example, the first pad pattern 323 and the first via pattern 313 may be a single, continuous later formed of a same material. Additionally and/or alternatively, the pad barrier pattern 321 and the via barrier pattern 311 may be in material continuity with one another and provide an electrical connection from the pad structure 320 to the via structure 310. In certain embodiments, the pad barrier pattern 321 and the via barrier pattern 311 may be a homogeneous monolithic structure. For example, the pad barrier pattern 321 and the via barrier pattern 311 may be a single, continuous later formed of a same material.

A top surface of the via structure 310 may be coplanar with a top surface of the pad structure 320. For example, a top surface of the second via pattern 315, a top surface of the second pad pattern 325, and a surface of the first via pattern 313 extending onto the top surface of the capping insulating layer 260 may be coplanar with each other. The via structure 310 may protrude from the top surface of the upper substrate 210 by a height corresponding to the sum of a thickness of the capping insulating layer 260, a thickness of the via barrier pattern 311, and a thickness of the first via pattern 313. For example, a height of the via structure 310 above the top surface of the upper substrate 210 may be equal to a sum of the thicknesses of the capping insulating layer 260, the via barrier pattern 311, and the first via pattern 313. Further, the pad structure 320 may protrude from the top surface of the upper substrate 210 by a height corresponding to the sum of a thickness of the capping insulating layer 260, a thickness of the pad barrier pattern 321, and a thickness of the first pad pattern 323. For example, a height of the pad structure 320 above the top surface of the upper substrate 210 may be equal to a sum of the thicknesses of the capping insulating layer 260, the pad barrier pattern 321, and the first pad pattern 323.

The passivation layer 280 may be formed on the capping insulating layer 260, the via structure 310, and the pad structure 320. The passivation layer 280 may include an opening 280a exposing a surface of the second pad pattern 325 of the pad structure 320. The passivation layer 280 may include silicon nitride.

In some embodiments, the semiconductor device 10A may include a pad structure 320 almost buried in the upper substrate 210. For instance, a large proportion of the pad structure 320 of the semiconductor device 10A may be formed in the upper substrate 210. In some embodiments, for example, at least 80% of the pad structure 320 may be formed in the upper substrate 210. As a result, a level difference between the pad structure 320 and the top surface of the upper substrate 210 can be minimized.

Figure 1B:
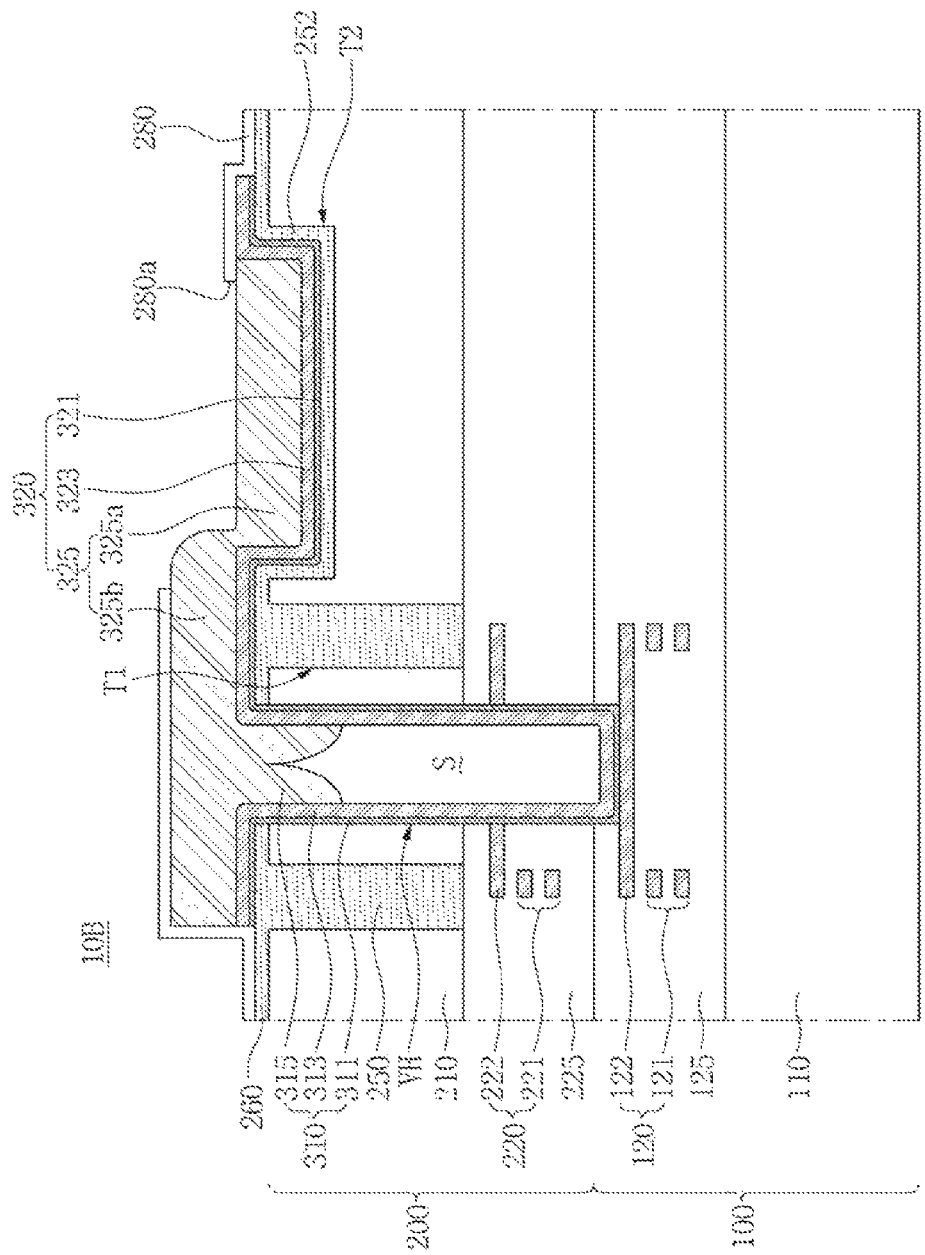

FIG. 1B is a longitudinal cross-sectional view of a semiconductor device according to certain example embodiments. In the embodiment illustrated in FIG. 1B, detailed descriptions of the same content as those of the above-described embodiments will be omitted.

Referring to FIG. 1B, the semiconductor device 10B may include a pad structure 320 that includes a second pad pattern 325 having a first portion 325a that is buried in the upper substrate 210 and does not vertically overlap a via structure 310. The semiconductor device 10B may further include a second portion 325b that extends onto a via structure 310 and is formed on a top surface of the upper substrate 210, as compared to, for example, the semiconductor device 10A in FIG. 1A. A top surface of the first portion 325a of the second pad pattern 325 may be located at a lower level than a top surface of the second portion 325b of the second pad pattern 325. A portion of the second portion 325b of the second pad pattern 325 may be materially in continuity with a second via pattern 315 of the via structure 310.

Figure 1C:
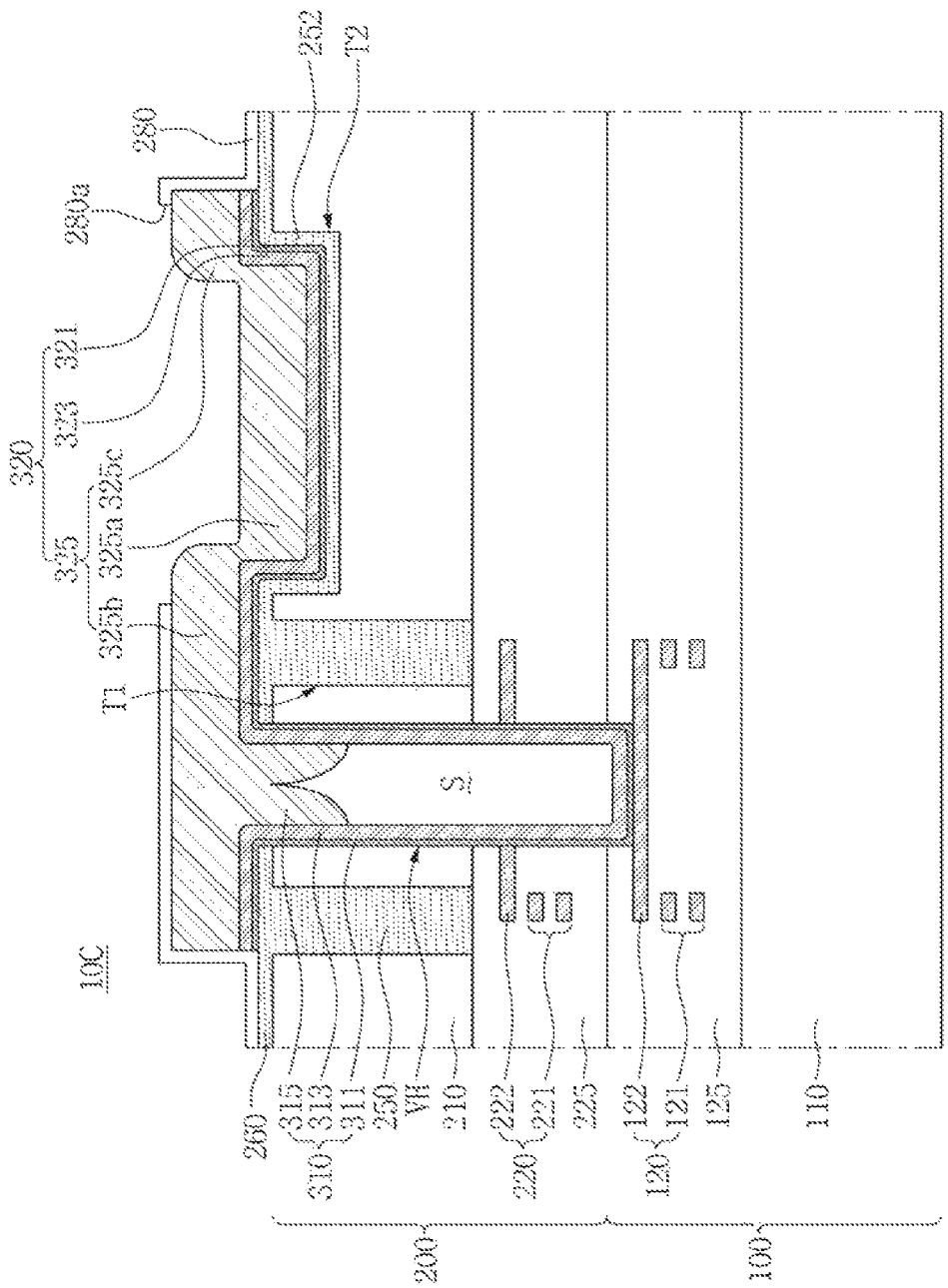

FIG. 1C is a longitudinal cross-sectional view of a semiconductor device according to certain example embodiments. In the embodiment illustrated in FIG. 1C, detailed descriptions of the same content as those of the above-described embodiments will be omitted.

Referring to FIG. 1C, in the semiconductor device 10C, a second pad pattern 325 of a pad structure 320 may include a first portion 325a buried in an upper substrate 210, a second portion 325b formed on a via structure 310, and a third portion 325c formed on the upper substrate 210 around the first portion 325a.

Figure 1D:
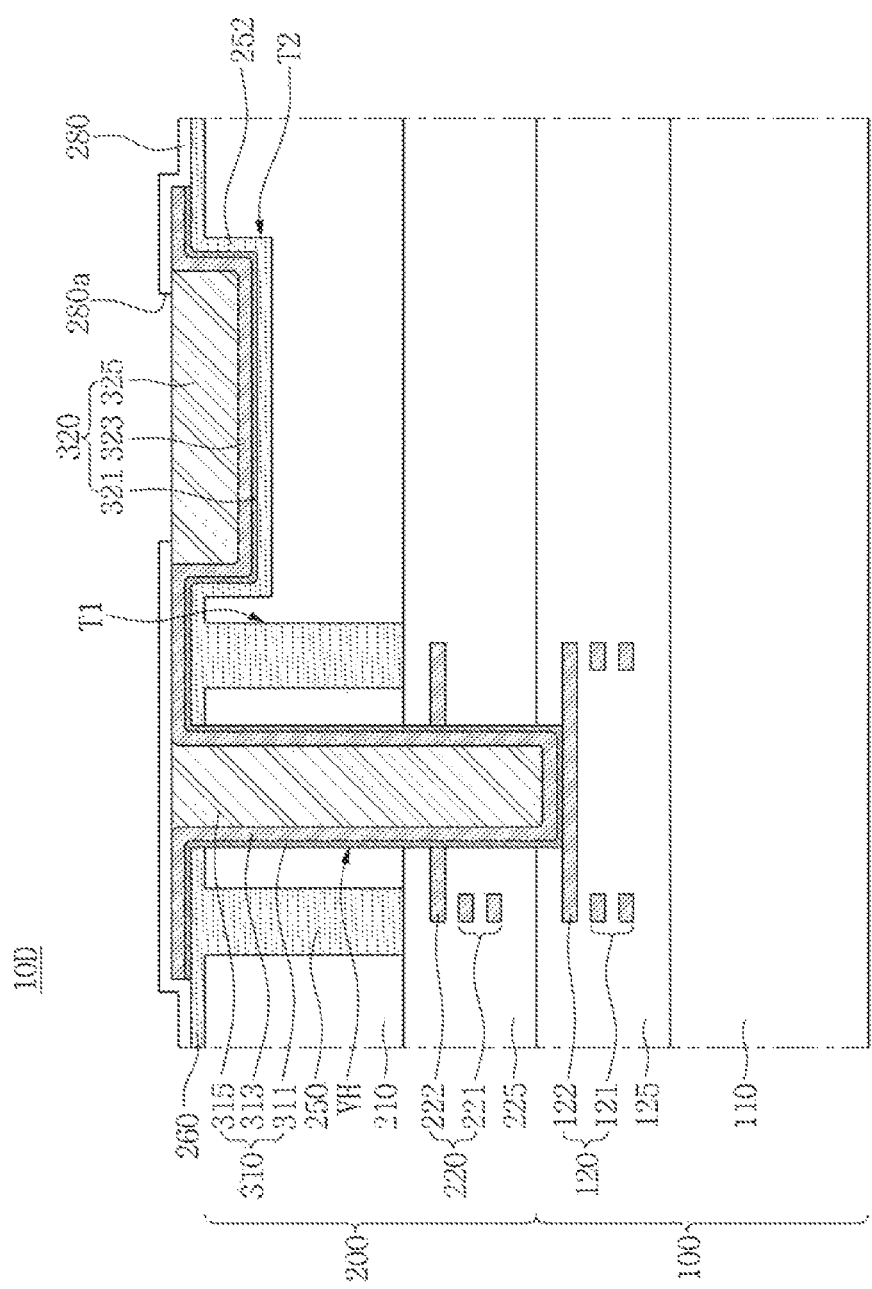

FIG. 1D is a longitudinal cross-sectional view of a semiconductor device according to certain example embodiments. In the embodiment illustrated in FIG. 1D, detailed descriptions of the same content as those of the above-described embodiments will be omitted.

Referring to FIG. 1D, the semiconductor device 10D may include a via structure 310 having a second via pattern 315 which fully fills a via hole VH, as compared to, for example, the semiconductor device 10A in FIG. 1A. The second via pattern 315 may include a different metal material from a second via pattern 315 of the semiconductor device 10A in FIG. 1A. For example, the second via pattern 315 may include copper (Cu).

Figure 1E:
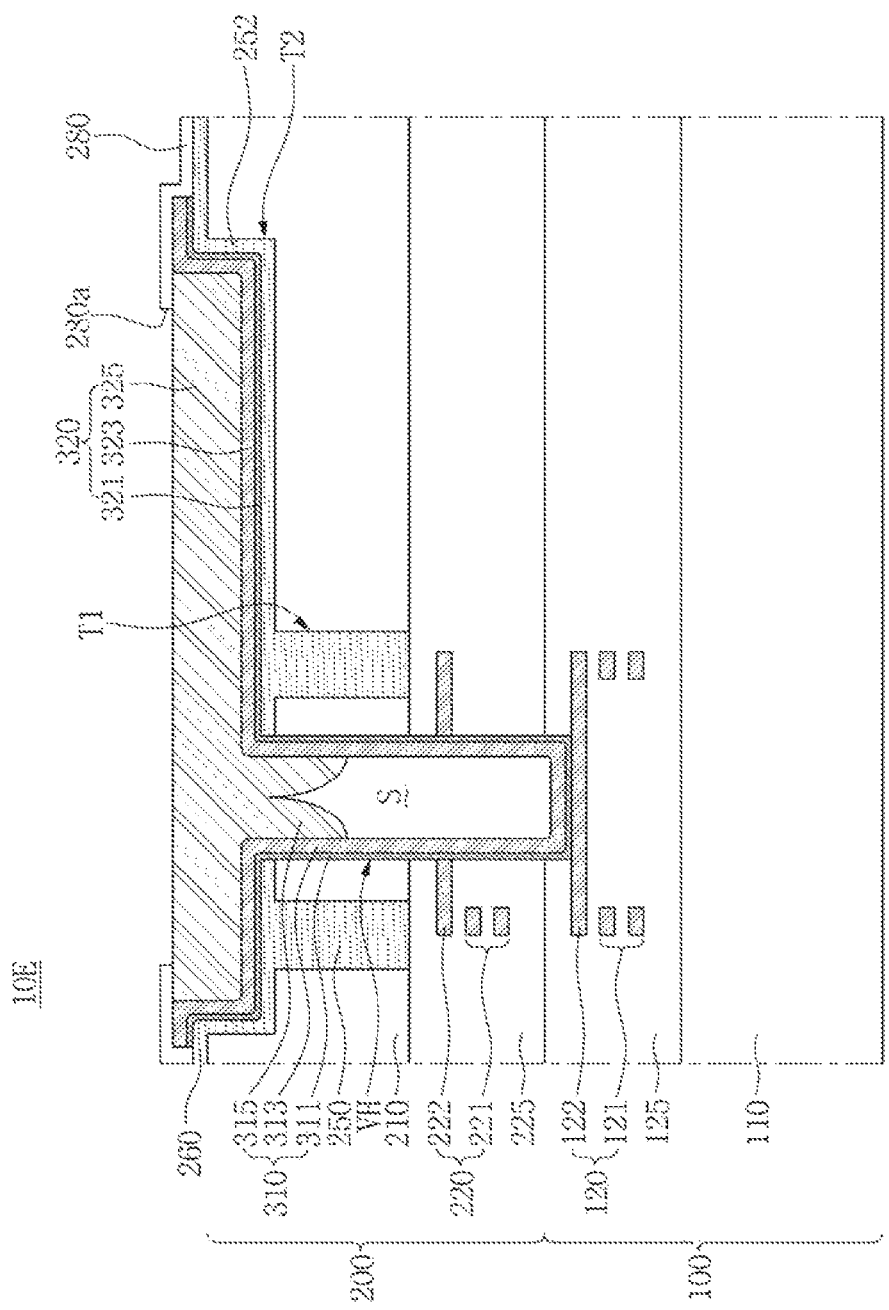

FIG. 1E is a longitudinal cross-sectional view of a semiconductor device according to certain exemplary embodiments. In the embodiment illustrated in FIG. 1E, detailed descriptions of the same content as those of the above-described embodiments will be omitted.

Referring to FIG. 1E, the semiconductor device 10E may include a pad structure 320 vertically overlapping a via structure 310, as compared to, for example, the semiconductor device 10A in FIG. 1A. A portion of a second pad pattern 325 of the pad structure 320 may be materially in continuity with a second via pattern 315 of the via structure 310.

Figure 1F:
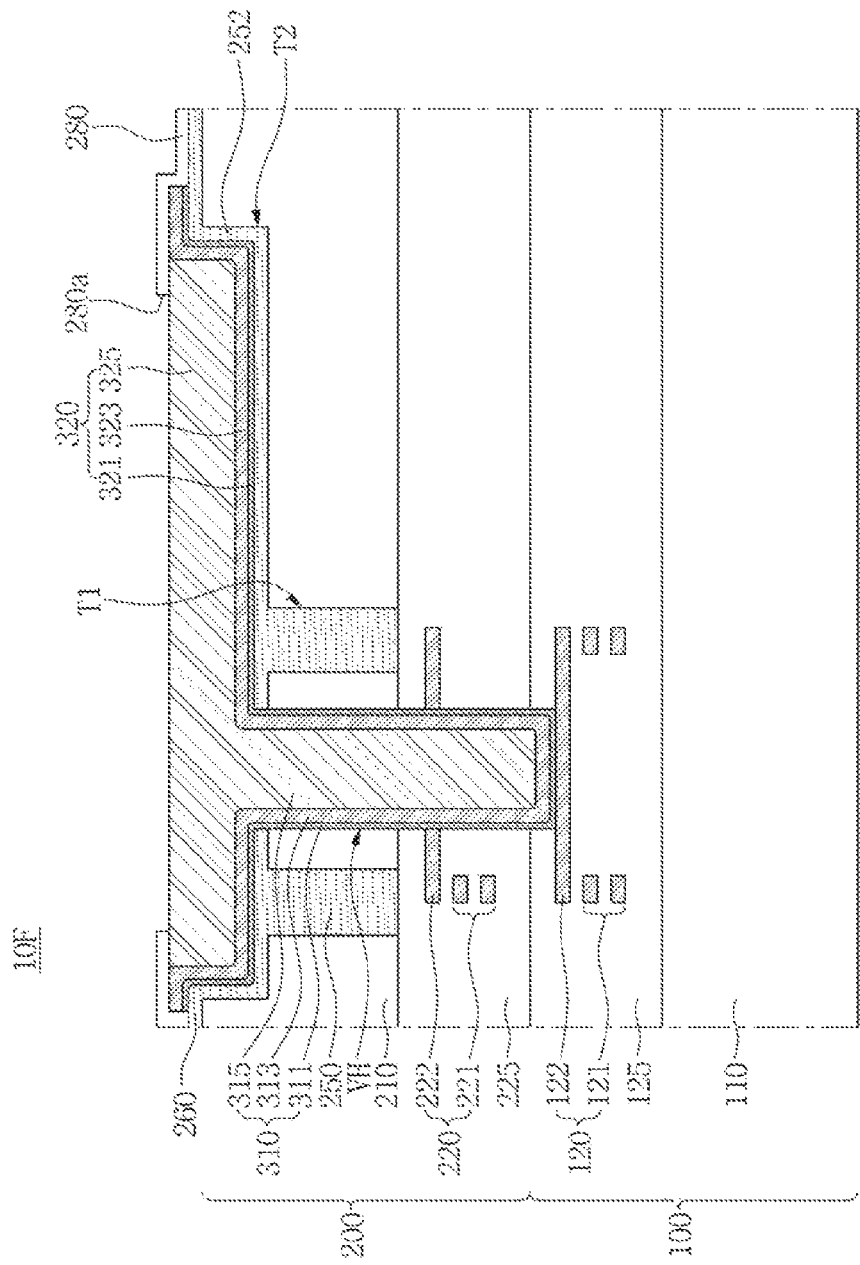

FIG. 1F is a longitudinal cross-sectional view of a semiconductor device according to certain example embodiments. In the embodiment illustrated in FIG. 1F, detailed descriptions of the same content as those of the above-described embodiments will be omitted.

Referring to FIG. 1F, the semiconductor device 10F according to the embodiment may include a via structure 310 having a second via pattern 315 which fully fills a via hole VH, as compared to, for example, the semiconductor device 10E in FIG. 1E. For example, the second via pattern 315 may include copper (Cu).

Figure 1G:
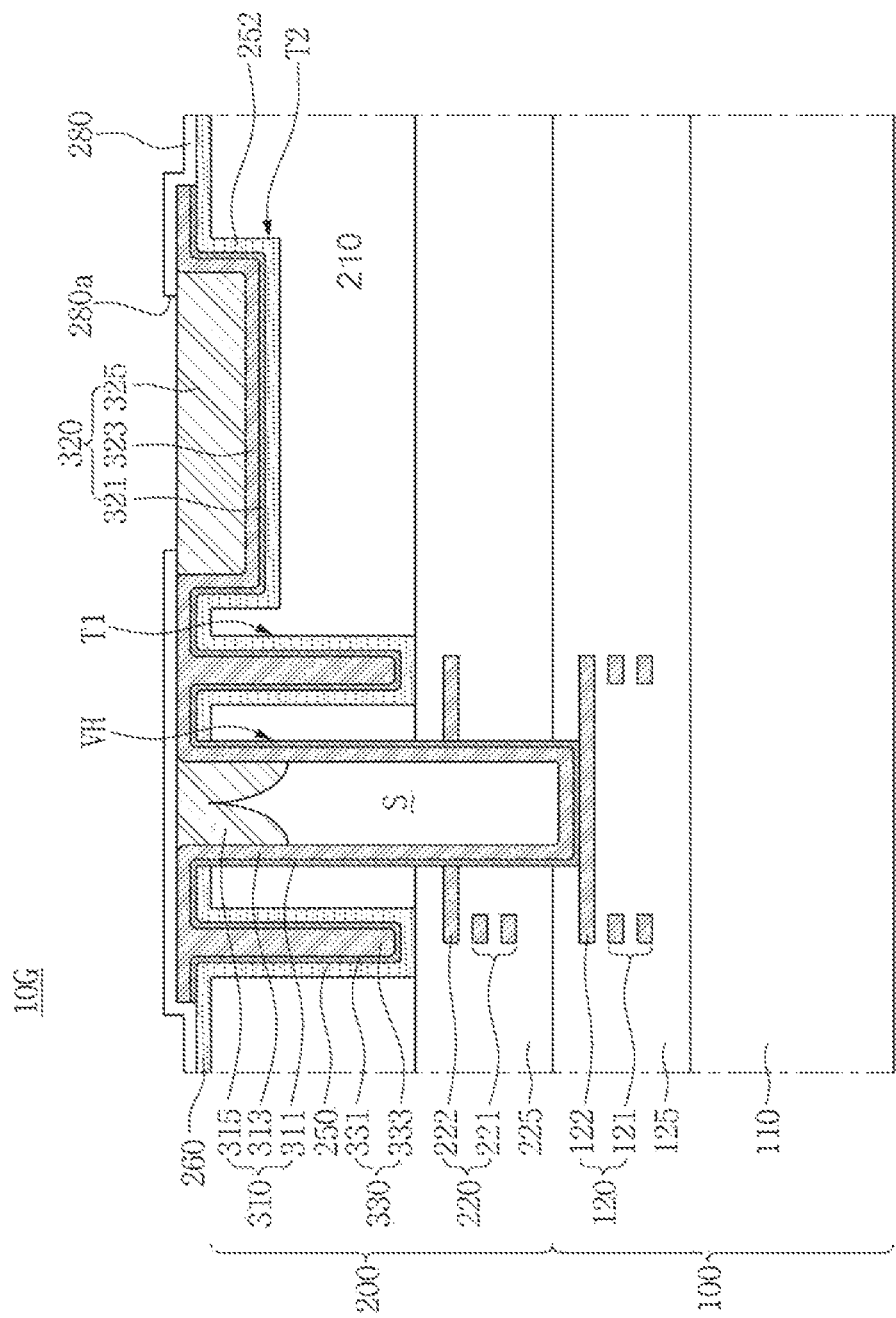

FIG. 1G is a longitudinal cross-sectional view of a semiconductor device according to certain example embodiments. In the embodiment illustrated in FIG. 1G, detailed descriptions of the same content as those of the above-described embodiments will be omitted.

Referring to FIG. 1G, the semiconductor device 10G may include a via isolation insulating layer 250 conformally formed on a bottom surface and inner sidewalls of a via isolation trench T1, and a conductive via isolation core 330 filling inside of the via isolation trench T1, as compared to, for example, the semiconductor device 10A in FIG. 1A. The via isolation core 330 may include a via isolation barrier pattern 331 and a via isolation pattern 333. The via isolation barrier pattern 331 may be conformally formed on the via isolation insulating layer 250, and the via isolation pattern 333 may be formed to fill the via isolation trench T1. In some embodiments, the via isolation pattern 333 may fully fill the via isolation trench T1 and protrude above the upper substrate 210.

The via isolation barrier pattern 331 may be materially in continuity with a via barrier pattern 311 of the via structure 310 and a pad barrier pattern 321 of the pad structure 320. Further, the via isolation pattern 333 may be materially in continuity with a first via pattern 313 of the via structure 310 and a first pad pattern 323 of the pad structure 320.

Figure 2A:
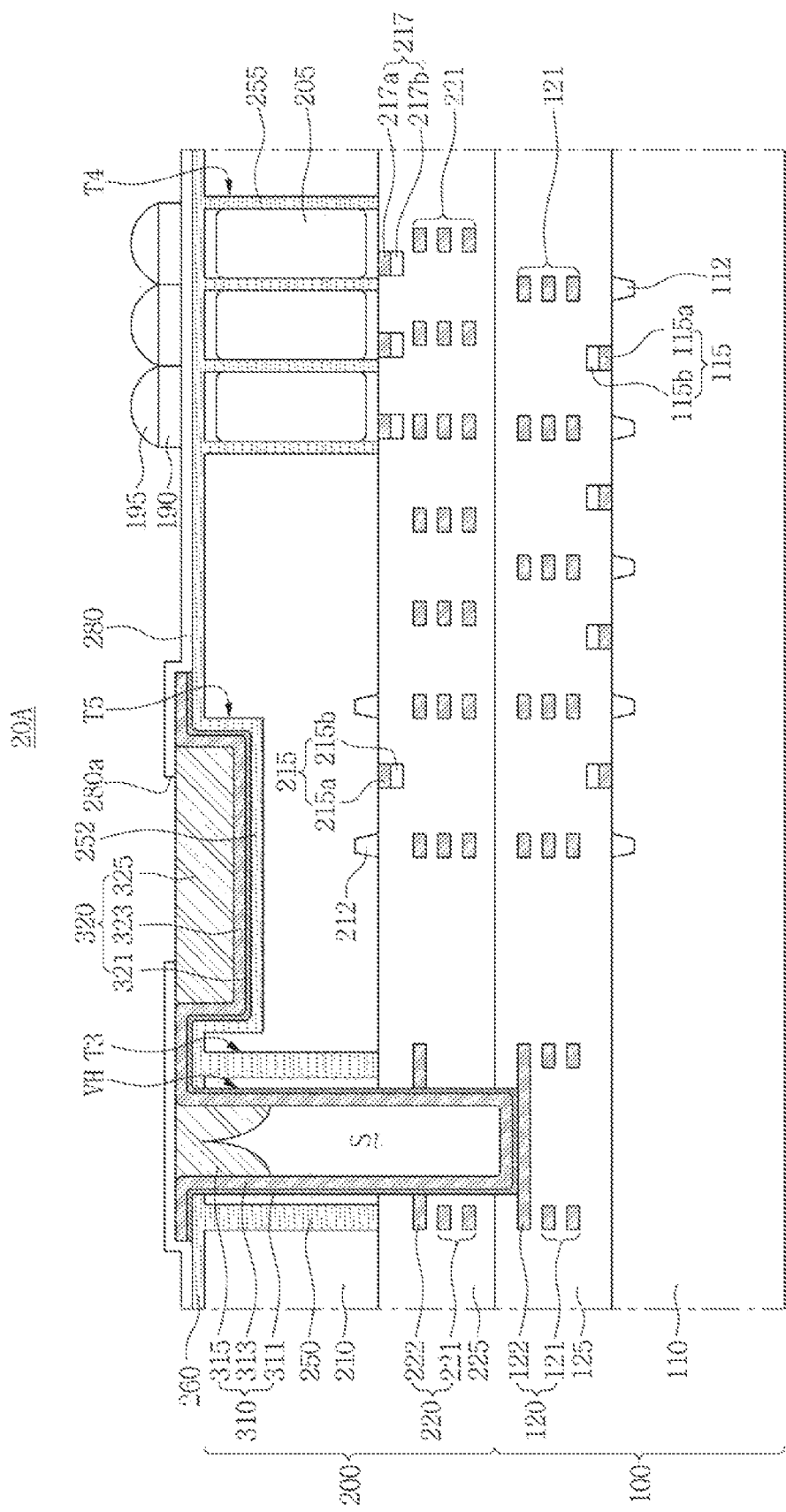
FIGS. 2A to 2F are longitudinal cross-sectional views of semiconductor devices according to some example embodiments.

FIG. 2A is a longitudinal cross-sectional view of a semiconductor device according to certain exemplary embodiments. In the embodiment illustrated in FIG. 2A, the semiconductor device may be a backside illuminated image sensor.

Referring to FIG. 2A, the semiconductor device 20A may include a lower device 100, an upper device 200, a via isolation insulating layer 250, a pad insulating layer 252, a pixel isolation insulating layer 255, a capping insulating layer 260, a via structure 310, a pad structure 320, and a passivation layer 280. The semiconductor device 20A may further include a color filter 190 and a microlens 195 on the upper device 200. The microlens 195 may be formed on a top surface of the color filter 190, and the color filter 190 may be formed on a top surface of the passivation layer 280.

The lower device 100 may include a lower substrate 110, a lower gate structure 115 and a lower circuit 120 formed on the lower substrate 110, and a lower interlayer insulating layer 125 configured to surround and cover the lower gate structure 115 and the lower circuit 120. A lower device isolation region 112 may be formed in the lower substrate 110.

The lower gate structure 115 may include a lower gate electrode 115a and a lower gate capping layer 115b. The lower gate electrode 115a may include a conductor such as poly-Si, a metal silicide, or a metal. The lower gate capping layer 115b may include silicon nitride.

The lower circuit 120 may include lower interconnections 121 and a lower via pad 122. The lower via pad 122 may be in contact with and electrically connected to a lower end portion of the via structure 310. For example, the lower via pads 122 may be under and in contact with a bottom surface of the via structure 310. The lower interconnections 121 and the lower via pad 122 may include a conductor such as a metal, a metal silicide, a metal compound, or doped poly-Si. The lower interlayer insulating layer 125 may include silicon oxide.

The upper device 200 may be stacked on the lower device 100. The upper device 200 and the lower device 100 may be bonded.

The upper device 200 may include an upper substrate 210, an upper gate structure 215, a transmission gate structure 217, and an upper circuit 220 formed on the upper substrate 210 and an upper interlayer insulating layer 225 configured to surround and cover the upper gate structure 215, the transmission gate structure 217, and the upper circuit 220.

An upper device isolation region 212 may be formed in the upper substrate 210. Further, photodiodes 205 may be formed in the upper substrate 210.

A via isolation trench T3, a pixel isolation trench T4, and a pad trench T5 may be formed in the upper substrate 210. The via isolation trench T3 and the pixel isolation trench T4 may be formed to pass through the upper substrate 210 and expose the upper interlayer insulating layer 225. The via isolation trench T3 may be formed to be spaced apart from side surface of the via structure 310. The pixel isolation trench T4 may be formed between the photodiodes 205. The pad trench T5 may be formed to be spaced apart from the via isolation trench T3 and the pixel isolation trench T4 in a horizontal direction.

A bottom surface of the pad trench T5 may be located at a higher level than bottom surface of the via isolation trench T3 and a bottom surface of the pixel isolation trench T4. A horizontal width of the pad trench T5 may be greater than horizontal widths of the via isolation trench T3 and pixel isolation trench T4. The horizontal width of the via isolation trench T3 may be greater than the horizontal width of the pixel isolation trench T4.

The upper gate structure 215 may include an upper gate electrode 215a and an upper gate capping layer 215b. The upper gate electrode 215a may include a conductor such as, for example, poly-Si, a metal silicide, a metal, etc. The upper gate capping layer 215b may include an insulator such as, for example, silicon nitride, etc.

The transmission gate structure 217 may include a transmission gate electrode 217a and a transmission gate capping layer 217b. The transmission gate electrode 217a may include a conductor such as, for example, poly-Si, a metal silicide, a metal, etc. The transmission gate capping layer 217b may include an insulator such as, for example, silicon nitride, etc. The transmission gate structure 217 may be disposed adjacent to the photodiode 205. For example, the transmission gate structure 217 may be disposed below and near the photodiode 205.

The upper circuit 220 may include upper interconnections 221 and an upper via pad 222. The upper interconnections 221 and the upper via pad 222 may include, for example, a metal, a metal silicide, a doped-poly silicon, etc. The upper interlayer insulating layer 225 may include, for example, silicon oxide, etc.

The via isolation insulating layer 250 may be formed to fill the via isolation trench T3 passing through the upper substrate 210.

The pad insulating layer 252 may be conformally formed on a bottom surface and inner sidewalls of the pad trench T5 that is formed in the upper substrate 210.

The pixel isolation insulating layer 255 may be formed to fill the pixel isolation trench T4 passing through the upper substrate 210. In some embodiments, the pixel isolation insulating layer 255 may fully fill the pixel isolation trench T4 and protrude above the upper substrate 210.

The capping insulating layer 260 may be conformally formed on the top surface of the upper substrate 210.

The via isolation insulating layer 250, the pad insulating layer 252, the pixel isolation insulating layer 255, and the capping insulating layer 260 may include silicon oxide.

The via structure 310 may be formed to fully pass through the upper device 200, partially pass through the lower interlayer insulating layer 125 of the lower device 100, and be in contact with the lower via pad 122. The via structure 310 may be electrically connected to the upper circuit 220 of the upper device 200 and the lower circuit 120 of the lower device 100. The via structure 310 may include a via barrier pattern 311, a first via pattern 313, and a second via pattern 315.

The via barrier pattern 311 may be conformally formed on the bottom surface and inner sidewalls of the via hole VH that passes through the upper device 200 and exposes the lower via pad 122. For example, the via barrier pattern 311 may be in contact with the lower via pad 122. The via barrier pattern 311 may include barrier metals, such as, for example, titanium (Ti), titanium nitride (TiN), tantalum (Ta), tantalum nitride (TaN), titanium tungsten (TiW), etc. The via barrier pattern 311 may extend onto a portion of a top surface of the capping insulating layer 260 on the top surface of the upper substrate 210.

The first via pattern 313 may be conformally formed on the via barrier pattern 311. The first via pattern 313 may include a metal, such as tungsten (W), aluminum (Al), cobalt (Co), nickel (Ni), or copper (Cu). For example, the first via pattern 313 may include tungsten (W). The first via pattern 313 may extend onto a portion of a top surface of the capping insulating layer 260 on the top surface of the upper substrate 210. In some embodiments the via barrier pattern 311 may be between the first via pattern 313 and the top surface of the capping insulating layer 260.

The second via pattern 315 may be formed to partially fill the via hole VH on the first via pattern 313. For example, the second via pattern 315 may be formed in an upper portion of the via hole VH. Accordingly, an air space S may be formed in a lower portion of the via hole VH. In some embodiments, the air space S may form more than one-half the space in the via hole VH. The air space S may be defined by the second via pattern 315 and the first via pattern 313. For example, the first via pattern 313 and the second via pattern 315 may surround and enclose the air space S. The second via pattern 315 may include a metal, such as tungsten (W), aluminum (Al), cobalt (Co), nickel (Ni), or copper (Cu). The second via pattern 315 may include a different metal material from the first via pattern 313. For example, when the first via patter 313 includes tungsten (W), the second via pattern 315 may include aluminum (Al).

The pad structure 320 may be formed to fill the pad trench T5 of the upper substrate 210. The pad structure 320 may be almost buried in the upper substrate 210. For example, a portion of the pad structure 320 may be buried in the upper substrate 210 and another portion of the pad structure 320 may protrude above a top surface of the upper substrate 210. Here, a vertical length of the pad structure 320 protruding from the top surface of the upper substrate 210 may be smaller than a vertical length of the pad structure 320 buried in the upper substrate 210. For example, the volume of the pad structure 320 protruding above the top surface of the upper substrate 210 may be smaller than the volume of the pad structure 320 buried in the upper substrate 210. The pad structure 320 may not vertically overlap the via structure 310. The pad structure 320 may be spaced apart from the via structure 310 in a horizontal direction. The pad structure 320 may include a pad barrier pattern 321, a first pad pattern 323, and a second pad pattern 325.

The pad barrier pattern 321 may be conformally formed on the pad insulating layer 252 in the pad trench T5. The pad barrier pattern 321 may include a barrier metal, such as, for example, titanium (Ti), titanium nitride (TiN), tantalum (Ta), tantalum nitride (TaN), titanium tungsten (TiW), etc. The pad barrier pattern 321 may be materially in continuity with the via barrier pattern 311. The pad barrier pattern 321 may extend onto a portion of a top surface of the capping insulating layer 260 on the top surface of the upper substrate 210.

The first pad pattern 323 may be conformally formed on the pad barrier pattern 321. The first pad pattern 323 may include a metal, such as tungsten (W), aluminum (Al), cobalt (Co), nickel (Ni), or copper (Cu). The first pad pattern 323 may be materially in continuity with the first via pattern 313. The first pad pattern 323 may extend onto a portion of a top surface of the capping insulating layer 260 on the top surface of the upper substrate 210.

The second pad pattern 325 may be formed on the first pad pattern 323 in the pad trench T5. The first pad pattern 323 may surround side surfaces and a bottom surface of the second pad pattern 325. For example, the interior side and top surfaces of the first pad pattern 323 may surround and be in contact with the exterior side and bottom surfaces of the second pad pattern 325. The second pad pattern 325 may include the same metal material as the second via pattern 315.

The pad structure 320 may be electrically connected to the via structure 310 through the first pad pattern 323 and the first via pattern 313, which are materially in continuity with each other, and/or the pad barrier pattern 321 and the via barrier pattern 311, which are materially in continuity with each other. For example, the first pad pattern 323 and the first via pattern 313 may be in material continuity with one another and provide an electrical connection from the pad structure 320 to the via structure 310. Additionally and/or alternatively, the pad barrier pattern 321 and the via barrier pattern 311 may be in material continuity with one another and provide an electrical connection from the pad structure 320 to the via structure 310.

A top surface of the via structure 310 may be coplanar with a top surface of the pad structure 320. For example, a top surface of the second via pattern 315, a top surface of the second pad pattern 325, and a surface of the first via pattern 313 extending onto the top surface of the capping insulating layer 260 may be coplanar with each other. The via structure 310 may protrude from the top surface of the upper substrate 210 by a height corresponding to the sum of a thickness of the capping insulating layer 260, a thickness of the via barrier pattern 311, and a thickness of the first via pattern 313. For example, a height of the via structure 310 above the top surface of the upper substrate 210 may be equal to a sum of the thicknesses of the capping insulating layer 260, the via barrier pattern 311, and the first via pattern 313. Further, the pad structure 320 may protrude from the top surface of the upper substrate 210 by a height corresponding to the sum of a thickness of the capping insulating layer 260, a thickness of the pad barrier pattern 321, and a thickness of the first pad pattern 323. For example, a height of the pad structure 320 above the top surface of the upper substrate 210 may be equal to a sum of the thicknesses of the capping insulating layer 260, the pad barrier pattern 321, and the first pad pattern 323.

The passivation layer 280 may be conformally formed on the capping insulating layer 260, the via structure 310, and the pad structure 320. The passivation layer 280 may include the opening 280a exposing a surface of the second pad pattern 325 of the pad structure 320. The passivation layer 280 may include silicon nitride.

The color filter 190 and the microlens 195 may be disposed on the passivation layer 280 to be vertically aligned with the photodiode 205. For instance, the color filter 190 and microlens 195 may be formed above the photodiode 205.

In some embodiments, the semiconductor device 20A according to the embodiment may include a pad structure 320 almost buried in the upper substrate 210. For instance, a large proportion of the pad structure 320 of the semiconductor device 10A may be formed in the upper substrate 210. As a result, a level difference between the pad structure 320 and the top surface of the upper substrate 210 can be minimized.

Accordingly, when performing a coating process for forming a photoresist pattern, a color filter 190, or the like on the top surface of the upper substrate 210 in a subsequent process, a uniform coating layer (not shown) can be formed. For example, a coating process may be performed such that a top surface of the uniform coating layer is substantially planar across the semiconductor device. As a result, a pattern defect and an image defect can be prevented.

Furthermore, since a level difference between the pad structure 320 and the top surface of the upper substrate 210 is minimized, the disclosed embodiments may prevent light reflected from the surface of the upper substrate 210 from being reflected by the surfaces of the pad structure 320 and being incident onto the photodiode 205.

Figure 2B:
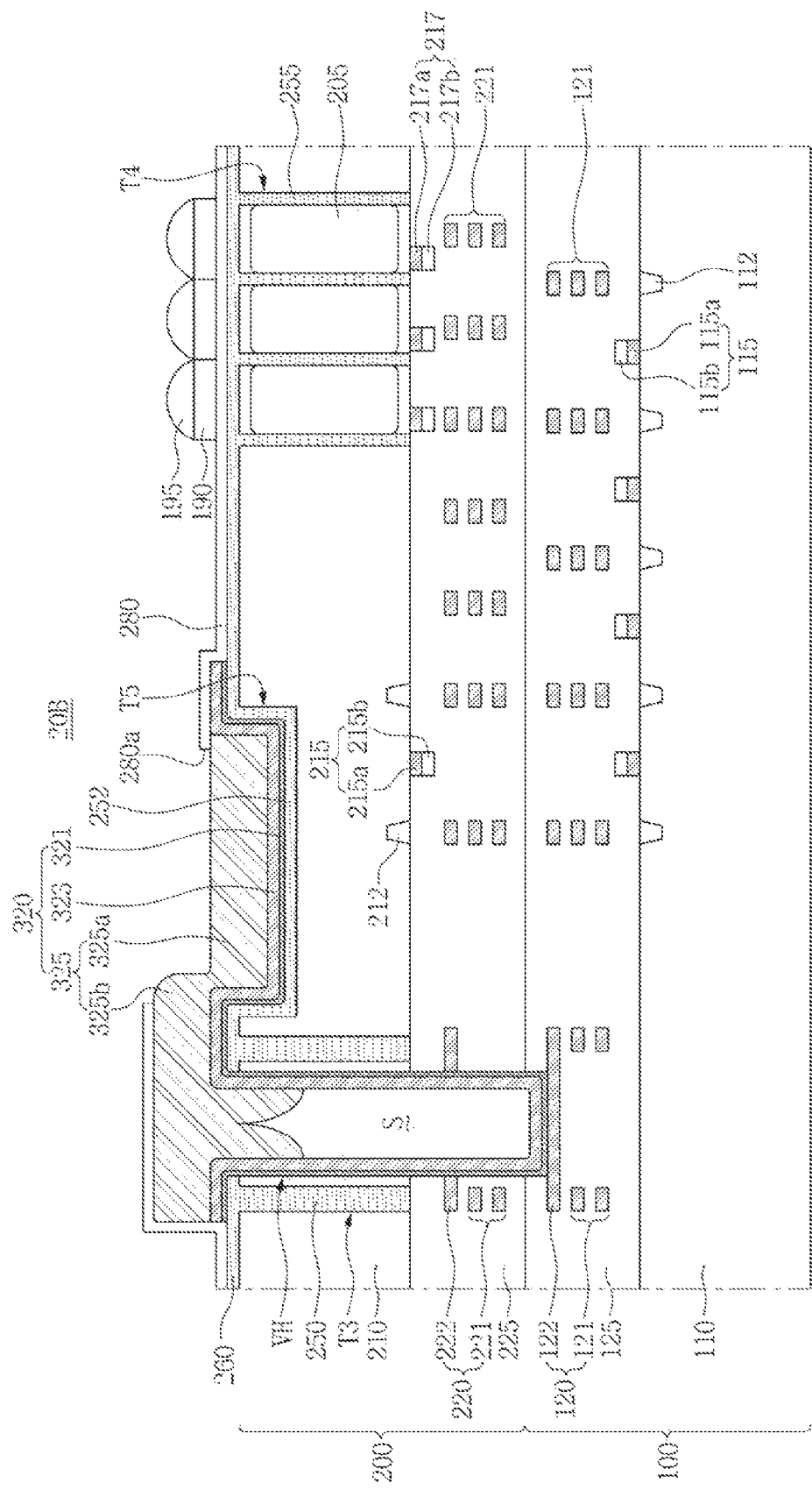

FIG. 2B is a longitudinal cross-sectional view of a semiconductor device according to certain exemplary embodiments. In the embodiment illustrated in FIG. 2B, detailed descriptions of the same content as those of the above-described embodiments will be omitted.

Referring to FIG. 2B, the semiconductor device 20B may include a pad structure 320 that includes a second pad pattern 325 having a first portion 325a that is buried in the upper substrate 210 and does not vertically overlap a via structure 310. The semiconductor device 20B may further include a second portion 325b that extends onto a via structure 310 and is formed on a top surface of the upper substrate 210, as compared to, for example, the semiconductor device 20A in FIG. 2A. A top surface of the first portion 325a of the second pad pattern 325 may be located at a lower level than a top surface of the second portion 325b of the second pad pattern 325. A portion of the second portion 325b of the second pad pattern 325 may be materially in continuity with a second via pattern 315 of the via structure 310.

Figure 2C:
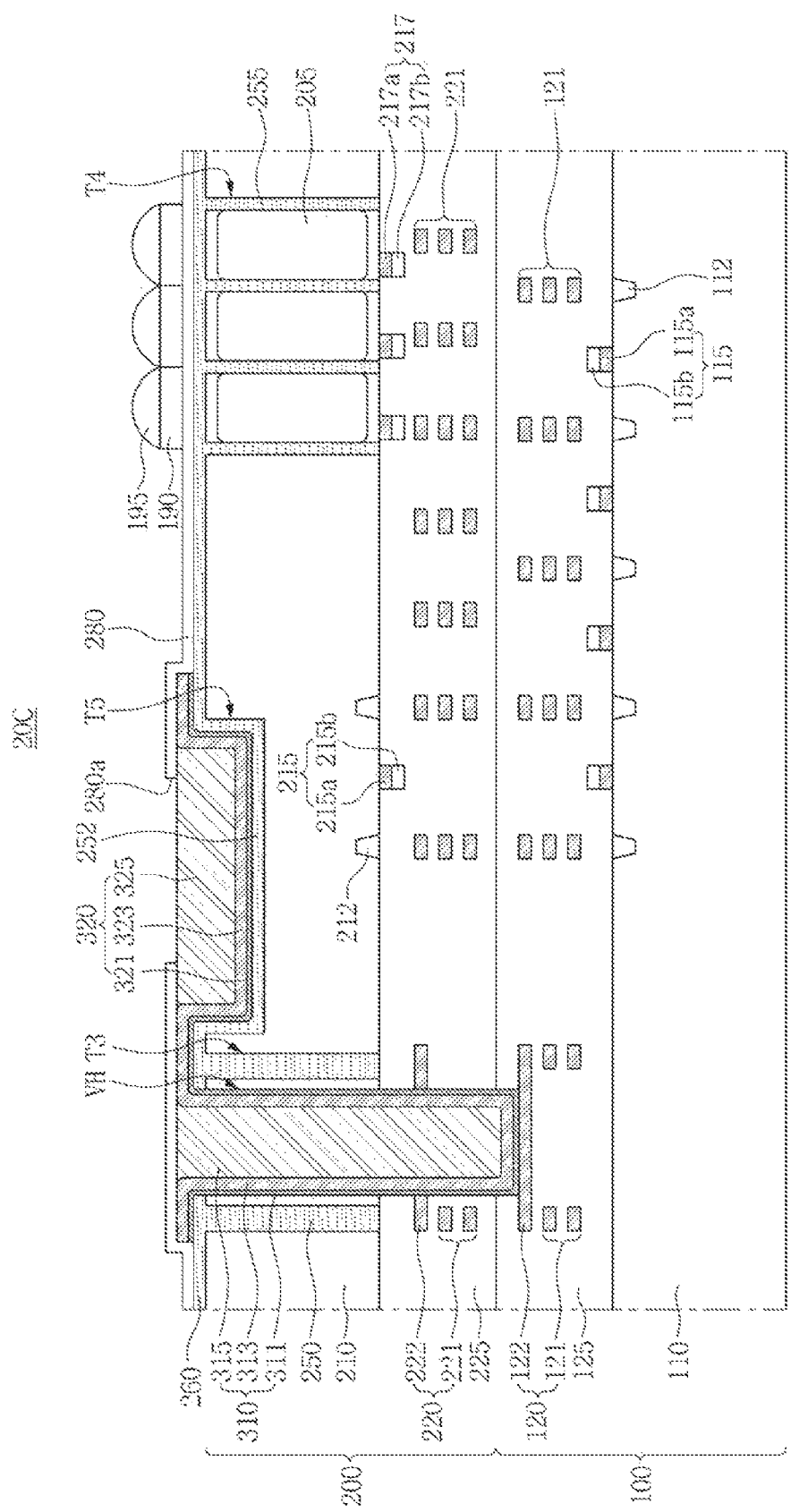

FIG. 2C is a longitudinal cross-sectional view of a semiconductor device according to certain exemplary embodiments. In the embodiment illustrated in FIG. 2C, detailed descriptions of the same content as those of the above-described embodiments will be omitted.

Referring to FIG. 2C, the semiconductor device 20C may include a via structure 310 having a second via pattern 315 which fully fills a via hole VH, as compared to, for example, the semiconductor device 20A in FIG. 2A. The second via pattern 315 may include a different metal material from a second via pattern 315 of the semiconductor device 20A in FIG. 2A. For example, the second via pattern 315 may include copper (Cu).

Figure 2D:
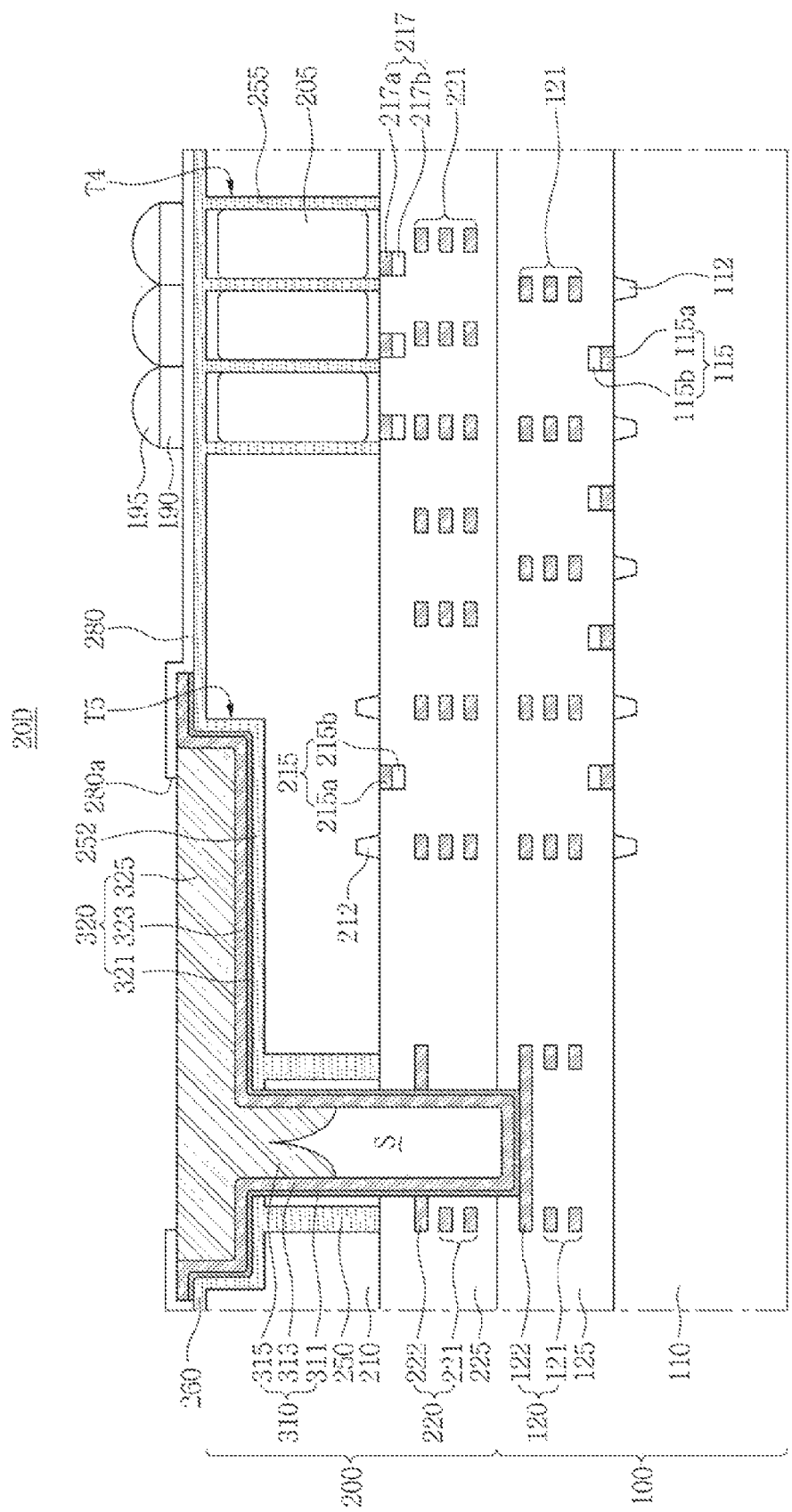

FIG. 2D is a longitudinal cross-sectional view of a semiconductor device according to certain exemplary embodiments. In the embodiment illustrated in FIG. 2D, detailed descriptions of the same content as those of the above-described embodiments will be omitted.

Referring to FIG. 2D, the semiconductor device 20D may include a pad structure 320 vertically overlapping a via structure 310, as compared to, for example, the semiconductor device 20A in FIG. 2A. A portion of a second pad pattern 325 of the pad structure 320 may be materially in continuity with a second via pattern 315 of the via structure 310.

Figure 2E:
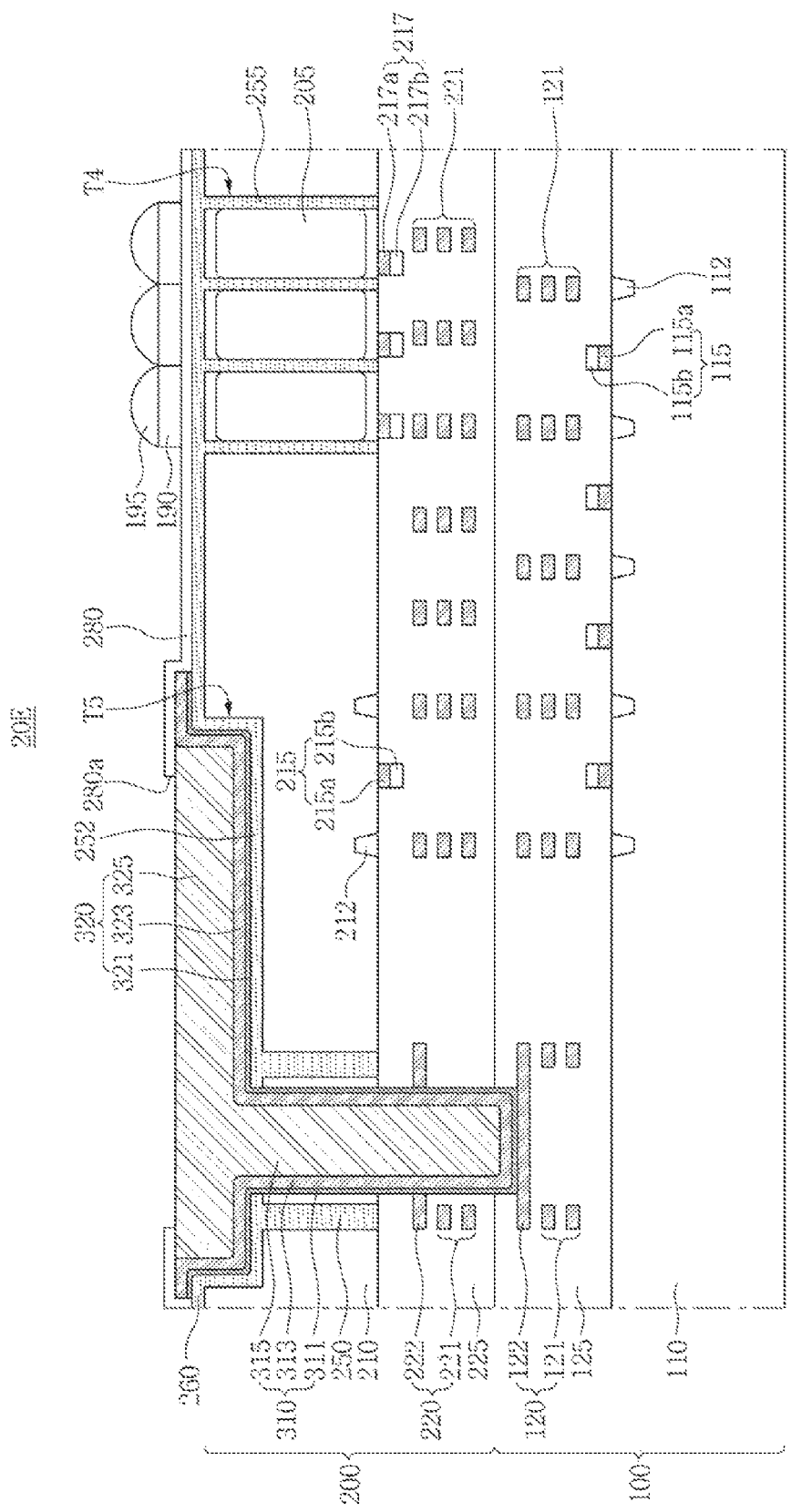

FIG. 2E is a longitudinal cross-sectional view of a semiconductor device according to certain exemplary embodiments. In the embodiment illustrated in FIG. 2E, detailed descriptions of the same content as those of the above-described embodiments will be omitted.

Referring to FIG. 2E, the semiconductor device 20E may include a via structure 310 having a second via pattern 315 which fully fills a via hole VH, as compared to, for example, the semiconductor device 20D in FIG. 2D. The second via pattern 315 may include a different metal material from a second via pattern 315 of the semiconductor device 20A in FIG. 2A. For example, the second via pattern 315 may include copper (Cu).

Figure 2F:
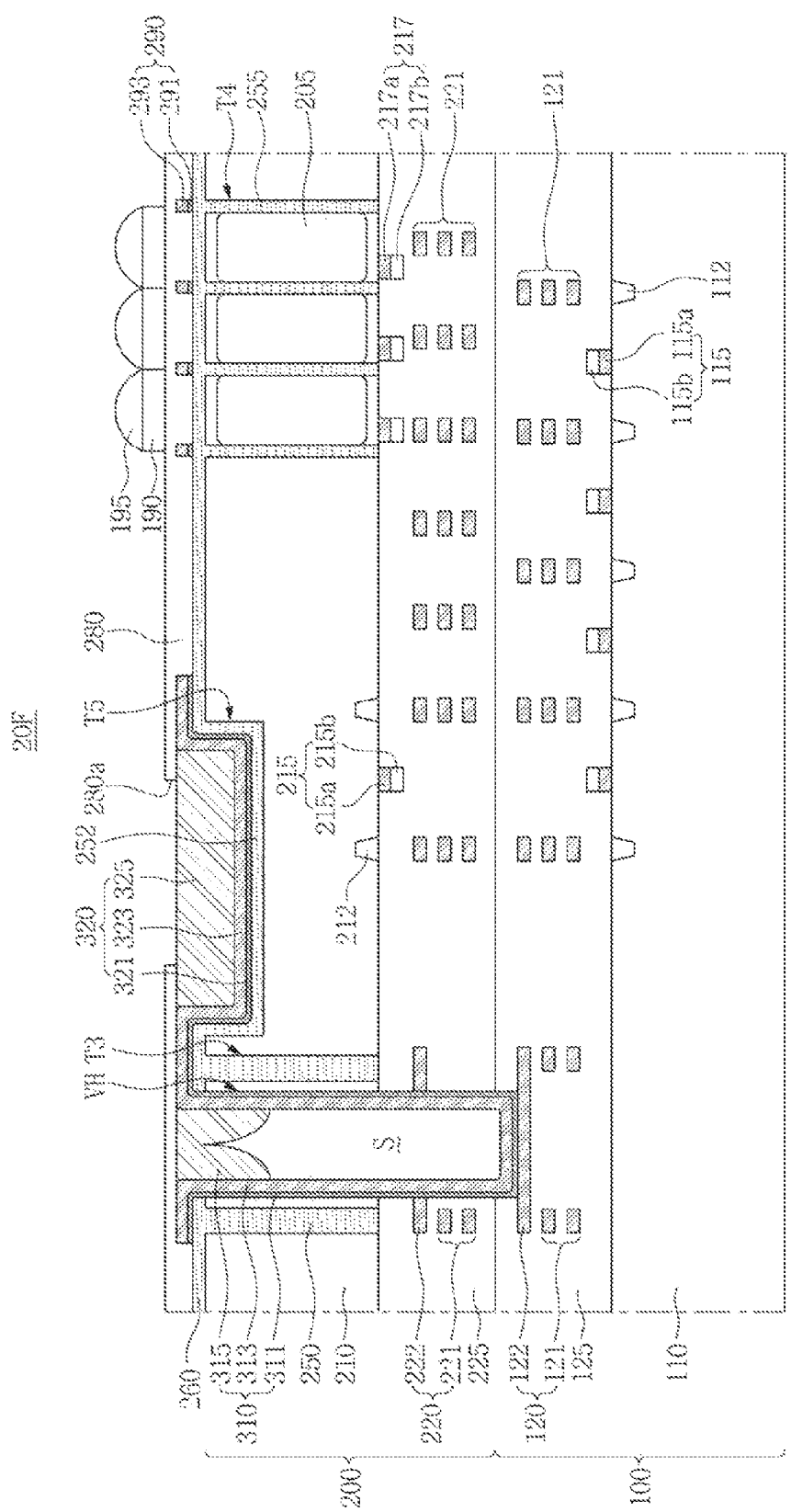

FIG. 2F is a longitudinal cross-sectional view of a semiconductor device according to certain exemplary embodiments. In the embodiment illustrated in FIG. 2F, detailed descriptions of the same content as those of the above-described embodiments will be omitted.

Referring to FIG. 2F, the semiconductor device 20F may include light shielding patterns 290 vertically overlapping a pixel isolation insulating layer 255, as compared to, for example, the semiconductor device 20A in FIG. 2A. The light shielding patterns 290 may include lower light shielding patterns 291 and upper light shielding patterns 293. The lower light shielding patterns 291 may include the same metal material as the via barrier pattern 311 of the via structure 310 and the pad barrier pattern 321 of the pad structure 320. The upper light shielding patterns 293 may include the same metal material as the first via pattern 313 of the via structure 310 and the first pad pattern 323 of the pad structure 320.

FIGS. 3A to 3F are views for describing a method of fabricating semiconductor device according to certain exemplary embodiments.

Figure 3A:
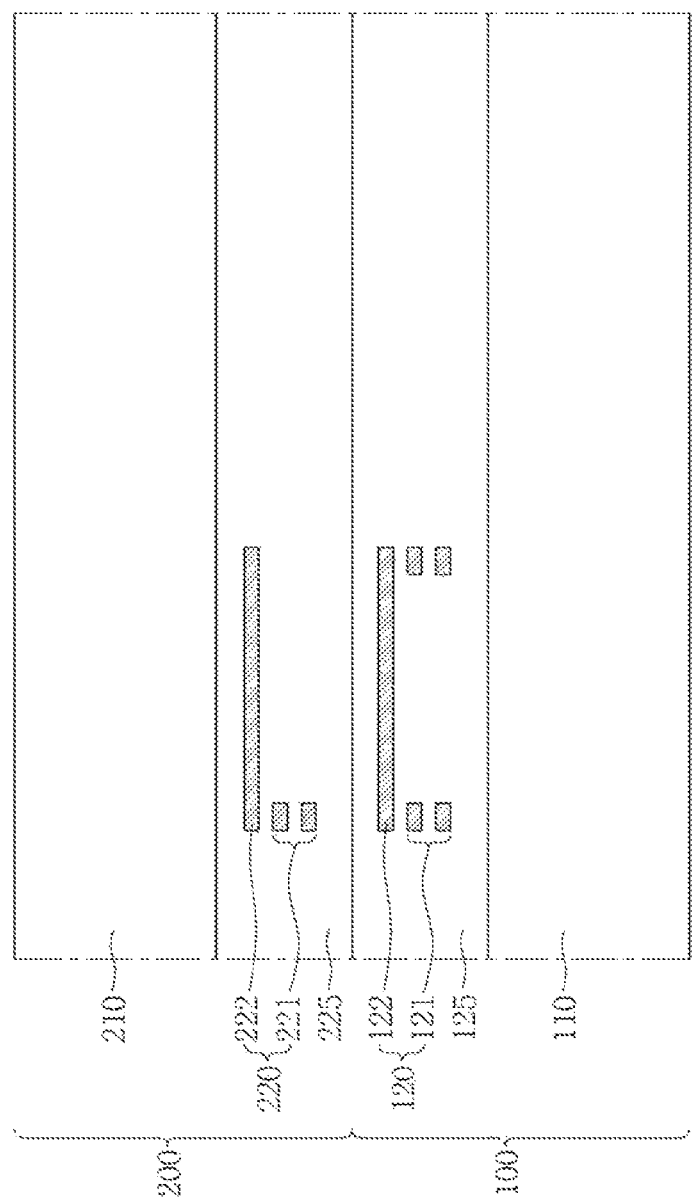

Referring to FIG. 3A, the method of fabricating semiconductor device may include forming a lower device 100, forming an upper device 200, and bonding the lower device 100 and the upper device 200.

The forming of the lower device 100 may include forming a lower circuit 120 and a lower interlayer insulating layer 125 covering the lower circuit 120. The lower circuit is formed on the lower substrate 110.

The lower substrate 110 may include a bulk single crystalline silicon wafer, an SOI wafer, a compound semiconductor wafer including, for example, a silicon germanium (SiGe), or a wafer on which a silicon epitaxial layer is grown.

The lower circuit 120 may include lower interconnections 121 and a lower via pad 122. The lower circuit 120 may include a metal, a metal silicide, or doped poly-Si formed using a deposition process, a plating process, and/or a patterning process. The lower interlayer insulating layer 125 may include silicon oxide.

The forming of the upper device 200 may include forming an upper circuit 220 and an upper interlayer insulating layer 225 covering the upper circuit 220. The upper circuit 220 is formed on the upper substrate 210.

The upper substrate 210 may include a bulk single crystalline silicon wafer, an SOI wafer, a compound semiconductor wafer including, for example, a silicon germanium (SiGe), or a wafer on which a silicon epitaxial layer is grown.

The upper circuit 220 may include upper interconnections 221 and an upper via pad 222. The upper circuit 220 may include a metal, a metal silicide, or doped poly-Si formed using a deposition process, a plating process, and/or a patterning process. The upper interlayer insulating layer 225 may include silicon oxide.

The bonding of the lower device 100 and the upper device 200 may be performed so that the lower interlayer insulating layer 125 of the lower device 100 contacts the upper interlayer insulating layer 225 of the upper device 200. The lower device 100 and the upper device 200 may be bonded using any known method or technique for connecting the two layers.

Figure 3B:
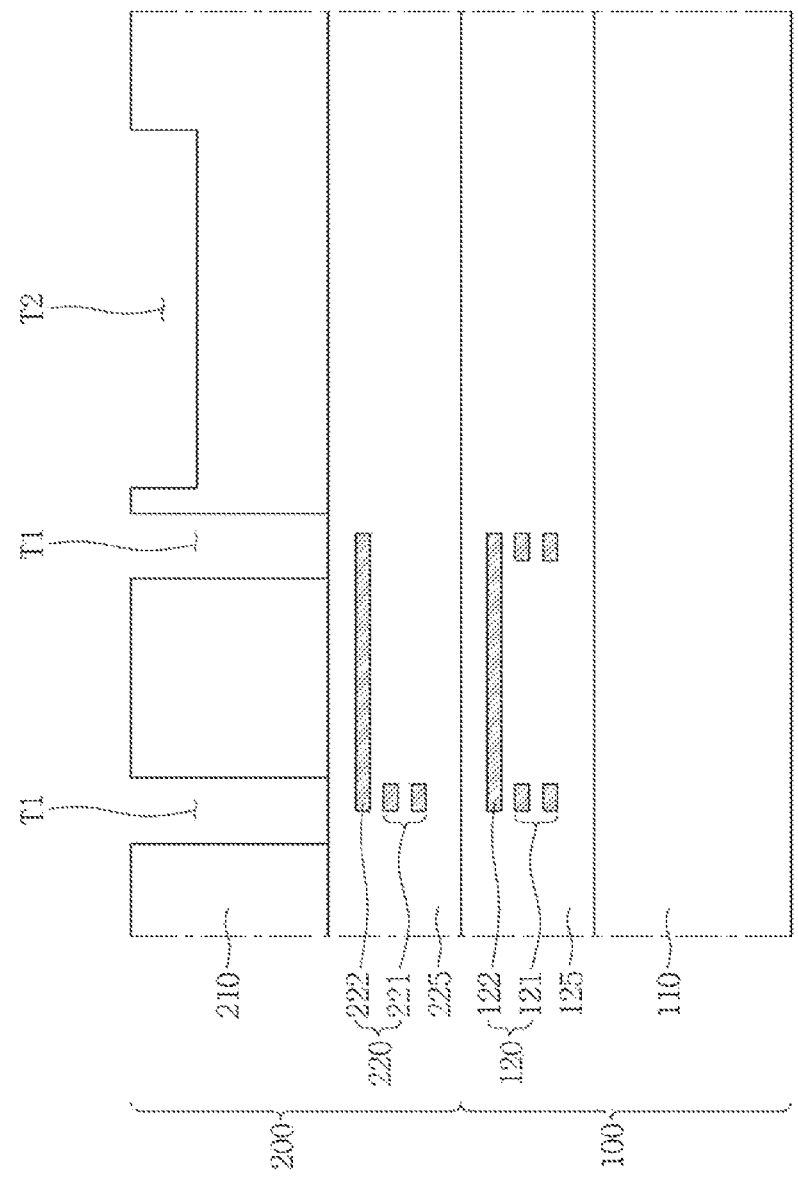

Referring to FIG. 3B, the method may include forming a via isolation trench T1 and a pad trench T2 in the upper substrate 210.

A vertical depth of the via isolation trench T1 may be substantially the same as a vertical thickness of the upper substrate 210. For example, the via isolation trench T1 may pass through the upper substrate 210 to a depth of the surface of upper insulating layer 225. Accordingly, a surface of the upper interlayer insulating layer 225 may be exposed on a bottom surface of the via isolation trench T1.

The pad trench T2 may be formed to be spaced apart from the via isolation trench T1 in a horizontal direction. A bottom surface of the pad trench T2 may be located at a higher level than the bottom surface of the via isolation trench T1. For example, the pad trench T2 may pass through only a portion of the upper substrate 210 in the vertical direction. Accordingly, a surface of the upper substrate 210 may be exposed in the bottom surface of the pad trench T2. A horizontal width of the pad trench T2 may be greater than a horizontal width of the via isolation trench T1.

In some embodiments, after forming the via isolation trench T1, the pad trench T2 may be formed. In some embodiments, after forming the pad trench T2, the via isolation trench T2 may be formed. In some embodiments, the via isolation trench T1 and the pad trench T2 may be formed at the same time.

Referring to FIG. 3C, the method may further include forming a via isolation insulating layer 250 which fills the via isolation trench T1, a pad insulating layer 252 which conformally covers the bottom surface and inner sidewalls of the pad trench T2, and a capping insulating layer 260 which conformally covers the top surface of the upper substrate 210. The via isolation insulating layer 250, the pad insulating layer 252, and the capping insulating layer 260 may be formed by performing a deposition process. The via isolation insulating layer 250, the pad insulating layer 252, and the capping insulating layer 260 may include silicon oxide. In some embodiments, the via isolation insulating layer 250, the pad insulating layer 252, and the capping insulating layer 260 may be in material continuity with one another.

Figure 3D:
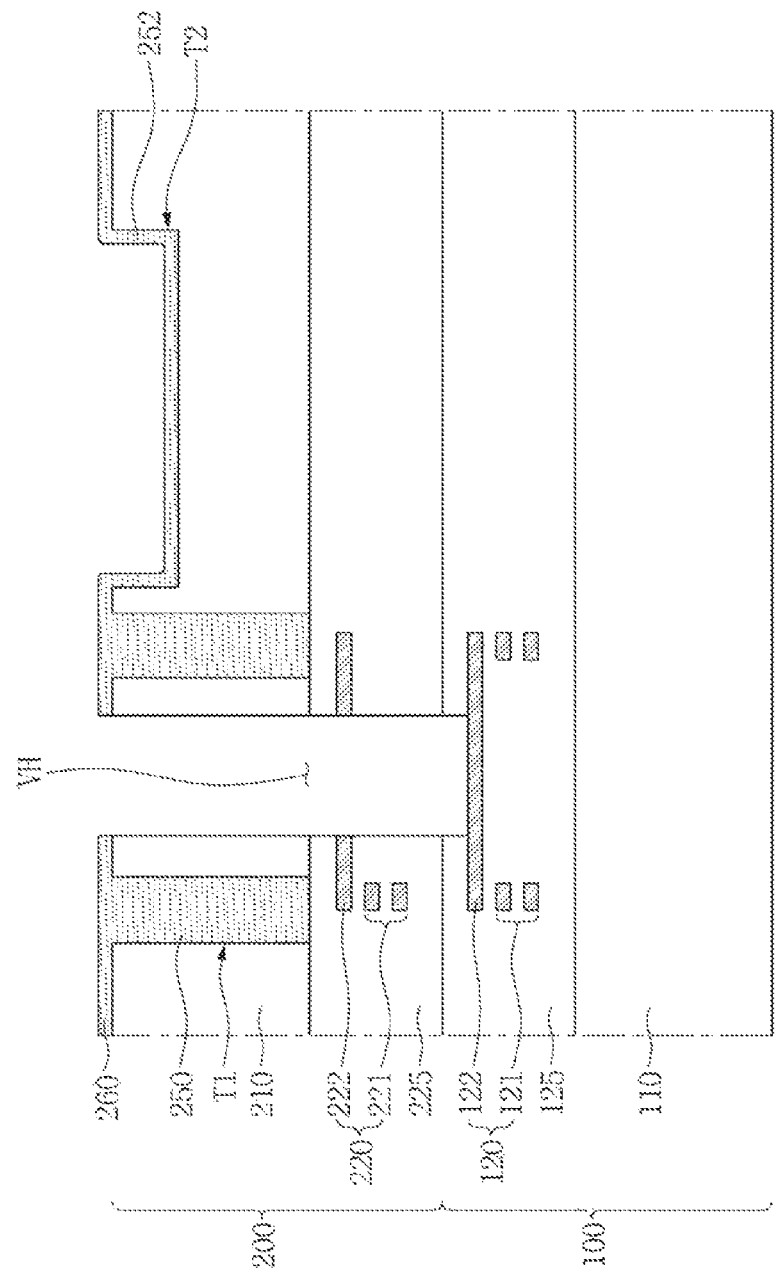

Referring to FIG. 3D, the method may include forming a via hole VH configured to fully pass through the upper substrate 210 and the upper interlayer insulating layer 225, and partially pass through the lower interlayer insulating layer 125, exposing the lower via pad 122. The via hole VH may be formed by an etching process. In some embodiments, the via hole VH may pass through the upper via pad 222 of the upper device 200.

Figure 3E:
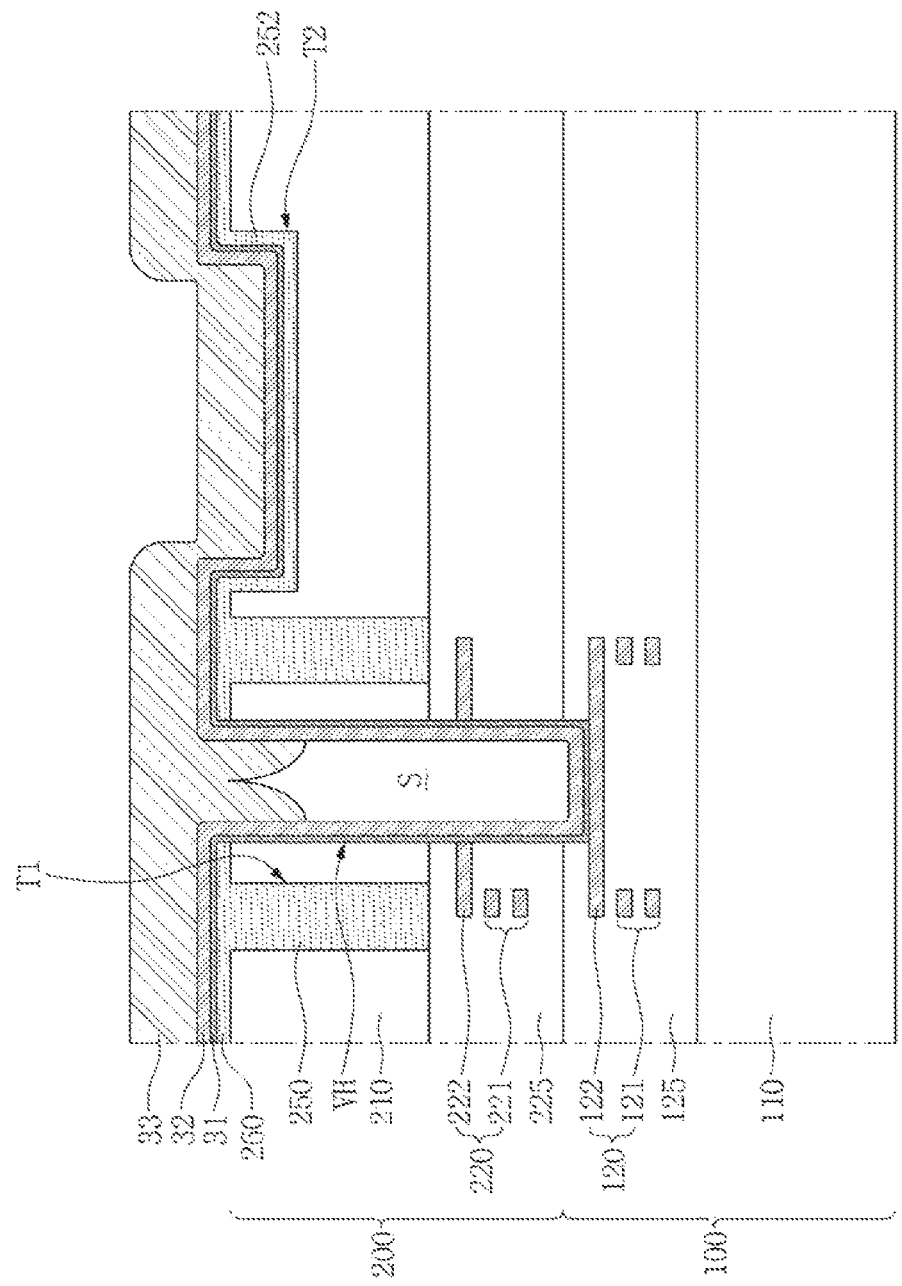

Referring to FIG. 3E, the method may include conformally forming a barrier metal layer 31 on the bottom surface and inner sidewalls of the via hole VH, the pad insulating layer 252, and the capping insulating layer 260, conformally forming a first metal layer 32 on the barrier metal layer 31, and forming a second metal layer 33 which partially fills the via hole VH and fully fills the pad trench T2 on the first metal layer 32.

For example, the barrier metal layer 31 and the first metal layer 32 may be formed by performing an atomic layer deposition (ALD) process. The second metal layer 33 may be formed by performing a physical vapor deposition (PVD) process.

The barrier metal layer 31 may include a barrier metal, such as, for example, titanium (Ti), titanium nitride (TiN), tantalum (Ta), tantalum nitride (TaN), titanium tungsten (TiW), etc. The first metal layer 32 and the second metal layer 33 may include metal materials that are different from each other. For example, the first metal layer 32 may include tungsten (W), and the second metal layer 33 may include aluminum (Al). The second metal layer 33 may be formed only in an upper portion of the via hole VH. Accordingly, an air space S may be formed in a lower portion of the via hole VH.

Figure 3F:
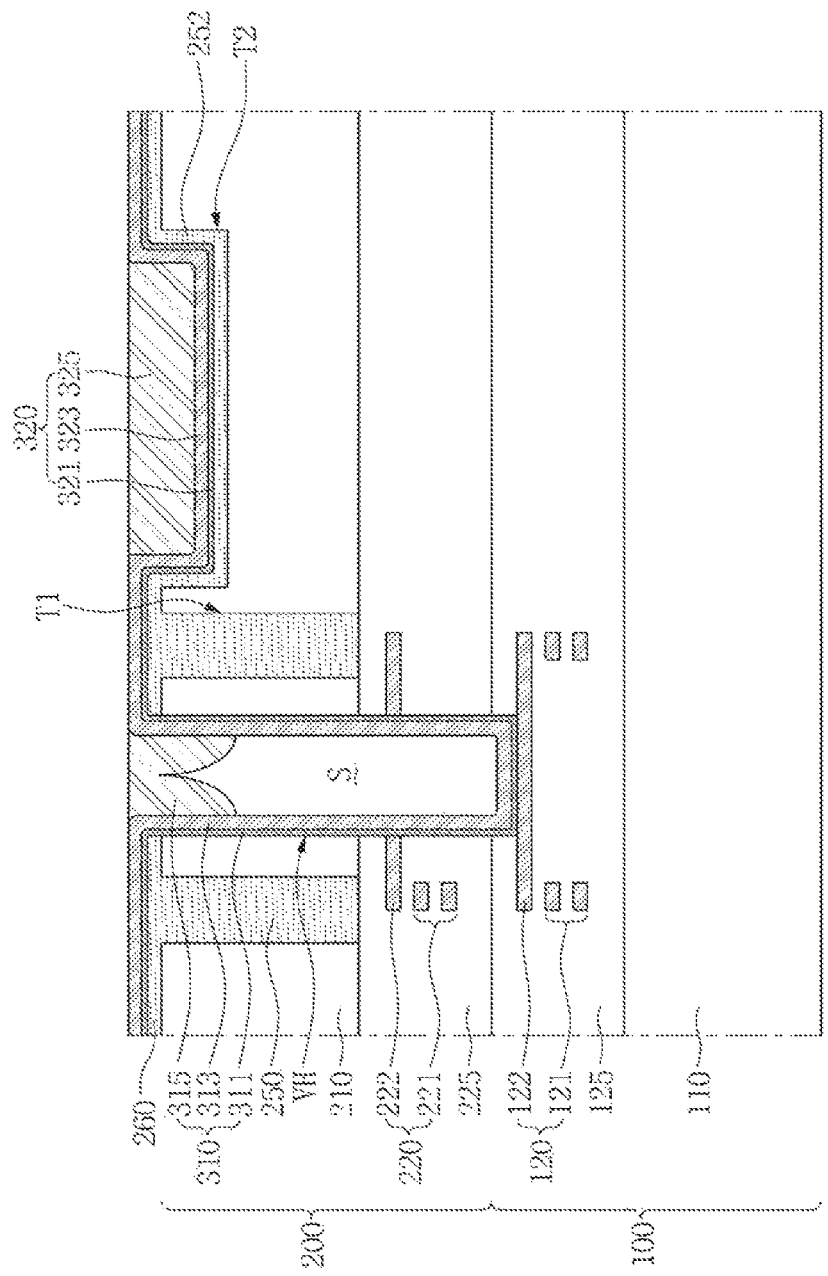

Referring to FIG. 3F, the method may include removing the second metal layer 33 (see FIG. 3E) by performing a planarization process to expose a surface of the first metal layer 32 (see FIG. 3E) formed on the capping insulating layer 260. In this process, a via structure 310 disposed in the via hole VH and a pad structure 320 disposed in the pad trench T2 may be formed.

The via structure 310 may include a via barrier pattern 311, a first via pattern 313, and the second via pattern 315. The via barrier pattern 311 may be conformally formed on a bottom surface and inner sidewalls of the via hole VH. The via barrier pattern 311 may extend onto a surface of the capping insulating layer 260. The first via pattern 313 may be conformally formed on the via barrier pattern 311. The first via pattern 313 may extend onto the surface of the capping insulating layer 260. In some embodiments, at least a portion of the via barrier pattern 311 may be between the first via pattern 313 and the top surface of the capping insulating layer 260. The second via pattern 315 may be formed to partially fill the via hole VH on the first via pattern 313. For example, the second via pattern 315 may be formed in the upper portion of the via hole VH. Accordingly, the via structure 310 may include the air space S. In some embodiments, the air space S may form more than one-half the space in the via hole VH. The air space S may be defined by the second via pattern 315 and the first via pattern 313. For example, the first via pattern 313 and the second via pattern 315 may surround and enclose the air space S.

The pad structure 320 may be formed to fill the pad trench T2 of the upper substrate 210. For example, the pad structure 320 may be almost buried in the upper substrate 210. The pad structure 320 may include a pad barrier pattern 321, a first pad pattern 323, and a second pad pattern 315.

The pad barrier pattern 321 may be conformally formed on the pad insulating layer 252 in the pad trench T2. The pad barrier pattern 321 may be materially in continuity with the via barrier pattern 311. The pad barrier pattern 321 may extend onto the surface of the capping insulating layer 260. The first pad pattern 323 may be conformally formed on the pad barrier pattern 321. The first pad pattern 323 may be materially in continuity with the first via pattern 313. The first pad pattern 323 may extend onto the surface of the capping insulating layer 260. The second pad pattern 325 may be formed on the first pad pattern 323 in the pad trench T2. Side surfaces and a bottom surface of the second pad pattern 325 may be surrounded by the first pad pattern 323. For example, the interior side and top surfaces of the first pad pattern 323 may surround and be in contact with the exterior side and bottom surfaces of the second pad pattern 325.

The pad structure 320 may be electrically connected to the via structure 310 through the first pad pattern 323 and the first via pattern 313, which are materially in continuity with each other, and/or the pad barrier pattern 321 and the via barrier pattern 311, which are materially in continuity with each other. For example, the first pad pattern 323 and the first via pattern 313 may be in material continuity with one another and provide an electrical connection from the pad structure 320 to the via structure 310. Additionally and/or alternatively, the pad barrier pattern 321 and the via barrier pattern 311 may be in material continuity with one another Referring back to FIG. 1A, the method may include patterning the via barrier pattern 311, the first via pattern 313, the pad barrier pattern 321, and the first pad pattern 323, which extend onto the capping insulating layer 260, and forming the passivation layer 280 having the opening 280a which exposes a portion of the surface of the second pad pattern 325 on the capping insulating layer 260, the via structure 310, and the pad structure 320.

FIGS. 4A to 4B are views for describing a method of fabricating semiconductor devices according to certain exemplary embodiments. In the embodiments illustrated in FIGS. 4A and 4B, detailed descriptions of the same content as those of the above-described embodiments will be omitted.

First, referring back to FIGS. 3A to 3E, the method of fabricating semiconductor device may include forming the lower device 100 and the upper device 200, bonding the lower device 100 and the upper device 200, forming the via isolation trench T1 and the pad trench T2 in the upper substrate 210 of the upper device 200. Additionally, the method may include forming the via isolation insulating layer 250, the pad insulating layer 252, and the capping insulating layer 260 on the via isolation trench T1, the pad trench T2, and a surface of the upper substrate 210, respectively. The method may further include forming the via hole VH, which exposes the lower via pad 122 of the lower device 100, and sequentially forming the barrier metal layer 31, the first metal layer 32, and the second metal layer 33.

Next, referring to FIG. 4A, the method may include forming a mask pattern M on the second metal layer 33. The mask pattern M may partially expose the second metal layer 33. For example, the mask pattern M may be formed to cover from a portion that vertically overlaps the via hole VH to a portion formed in the pad trench T2 of the second metal layer 33, and to expose another portion of the second metal layer 33. For example, the mask pattern M may extend from a portion vertically overlapping the via hole VH to a portion formed in the pad trench T2 of the second metal layer 33. Here, the mask pattern M may not completely cover the second metal layer 33 in the pad trench T2.

Referring to FIG. 4B, the method may include removing the second metal layer 33 exposed through the mask pattern M by performing an etching process, and removing the mask pattern M. In some embodiments, the second metal layer 33 exposed through the mask pattern M, and the first metal layer 32 and barrier metal layer 31 under the exposed second metal layer 33 may be removed at the same time. For example, the etching process may remove portions of the second metal layer 33 exposed through the mask pattern M and, at the same time, remove the first metal layer 32 and the barrier metal layer 31 that are disposed under the removed portions of the second metal layer 33.

In the above process, the via structure 310 and the pad structure 320 may be formed. The pad structure 320 may include a second pad pattern 325 having a first portion 325a and a second portion 325b. The first portion 325a of the second pad pattern 325 may not vertically overlap the via structure 310 and be almost buried in the upper substrate 210. For instance, a large proportion of the first portion 325a of the second pad pattern 325 may be formed in the upper substrate 210. The second portion 325b of the second pad pattern 325 may extend onto the via structure 310 and protrude from a top surface of the upper substrate 210.

Referring again to FIG. 1B, the method may include forming the passivation layer 280 on the capping insulating layer 260, the via structure 310, and the pad structure 320. The passivation layer 280 may include an opening 280a exposing a portion of the surface of the second pad pattern 325.

Figure 5A:
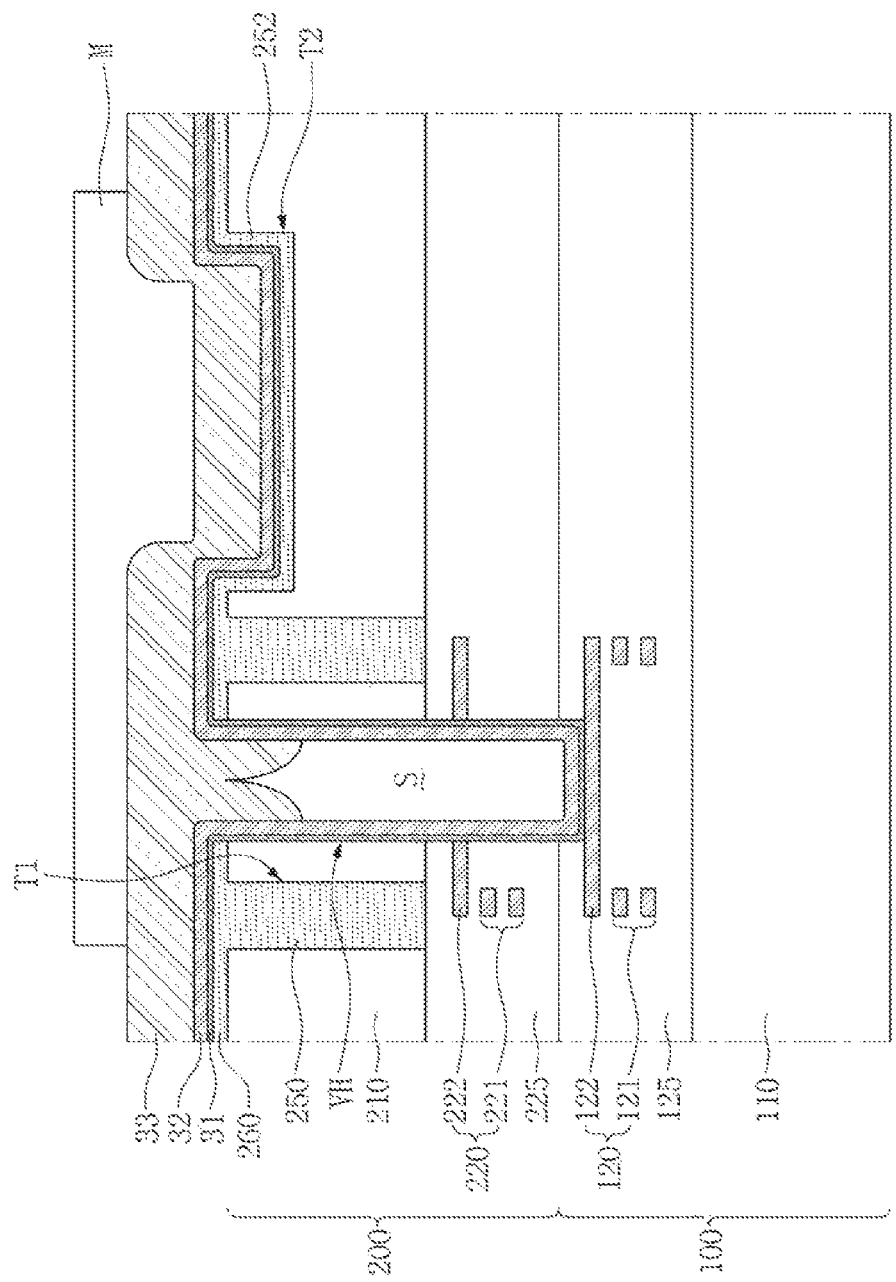
Figure 5B:
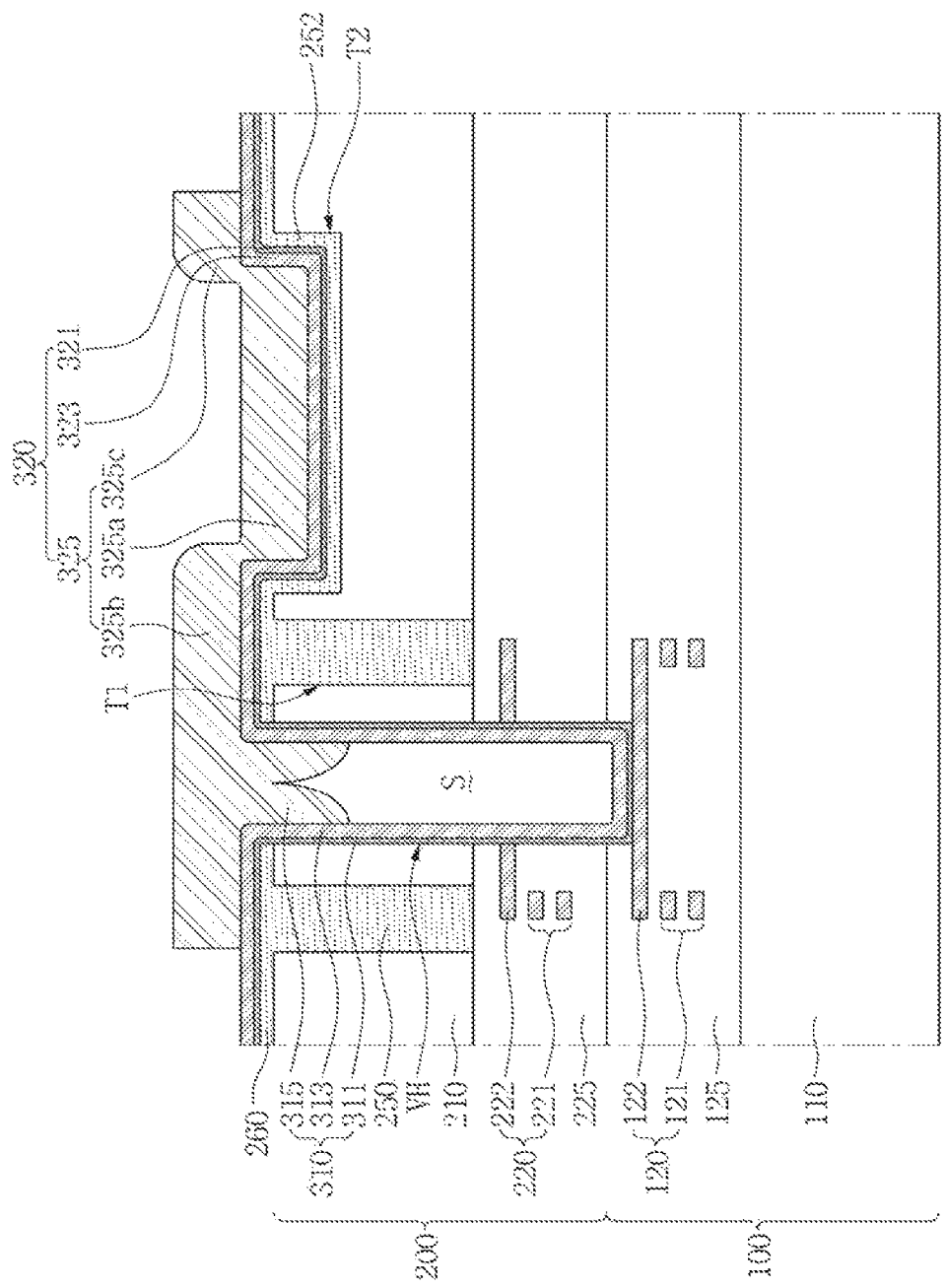

FIGS. 5A to 5B are views for describing a method of fabricating semiconductor device according to certain exemplary embodiments. In the embodiments illustrated in FIGS. 5A and 5B, detailed descriptions of the same content as those of the above-described embodiments will be omitted.

Referring to FIG. 5A, the method of fabricating semiconductor device may include forming a mask pattern M configured to fully cover the second metal layer 33 in the pad trench T2 and partially cover the second metal layer 33 on the upper substrate 210, as compared to, for example, the method of FIG. 4A.

Referring to FIG. 5B, the method may include removing the second metal layer 33 exposed through the mask pattern M by performing an etching process, and removing the mask pattern M. The mask pattern M may be removed at the same time and by the same etching process as the etching process that removes the exposed second metal layer 33 and/or the at a later time and by a different etching process from the one that removes the exposed second metal layer 33. In the process, a via structure 310 and a pad structure 320 may be formed.

The pad structure 320 may include a second pad pattern 325 having a first portion 325a and a second portion 325b. The first portion 325a of the second pad pattern 325 may not vertically overlap the via structure 310, and may be almost buried in the upper substrate 210. The second portion 325b of the second pad pattern 325 may extend onto the via structure 310.

Referring again to FIG. 1C, the method may include forming the passivation layer 280 having the opening 280a, which exposes a portion of the surface of the second pad pattern 325 on the capping insulating layer 260, the via structure 310 and the pad structure 320.

Figure 6A:
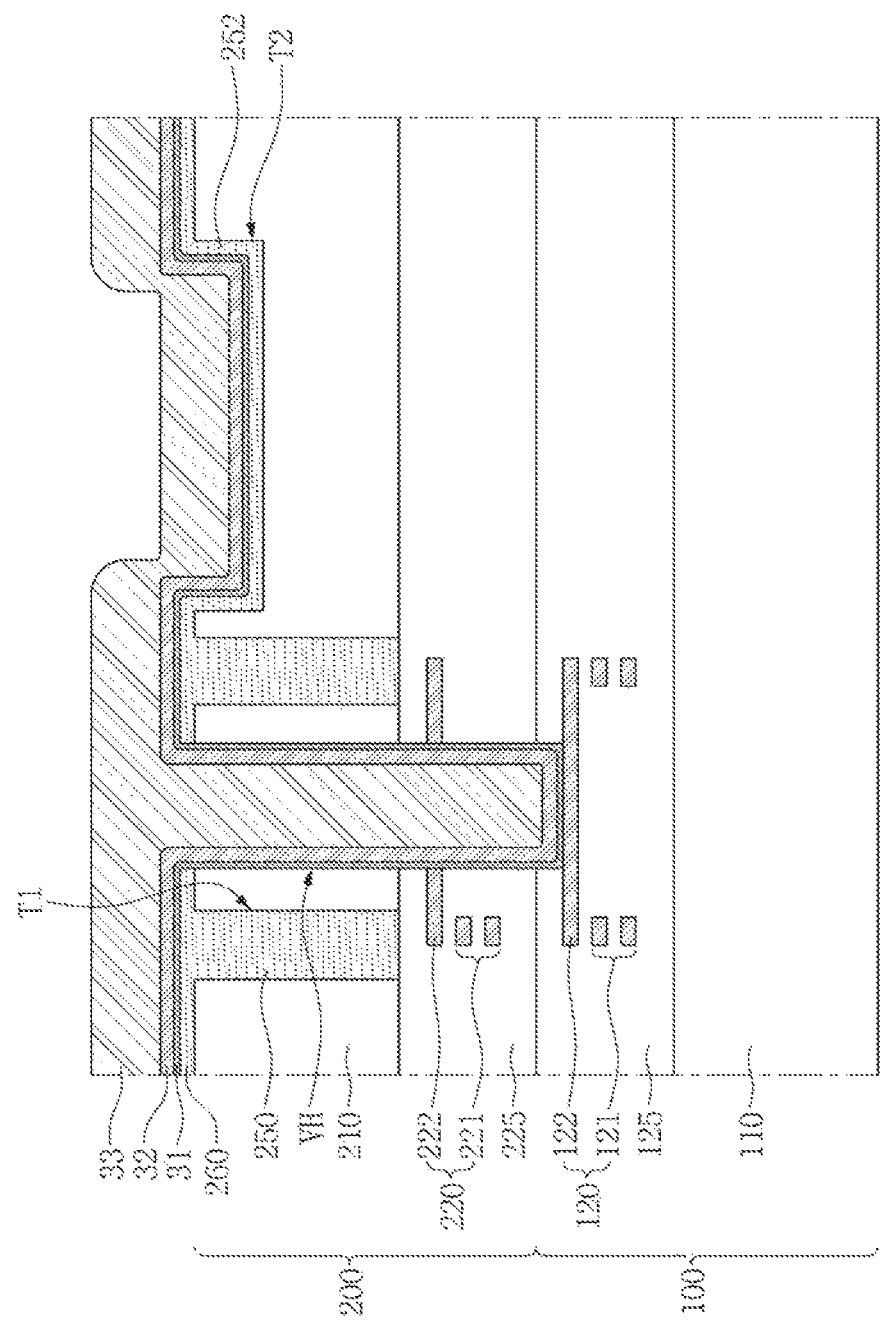
Figure 6B:
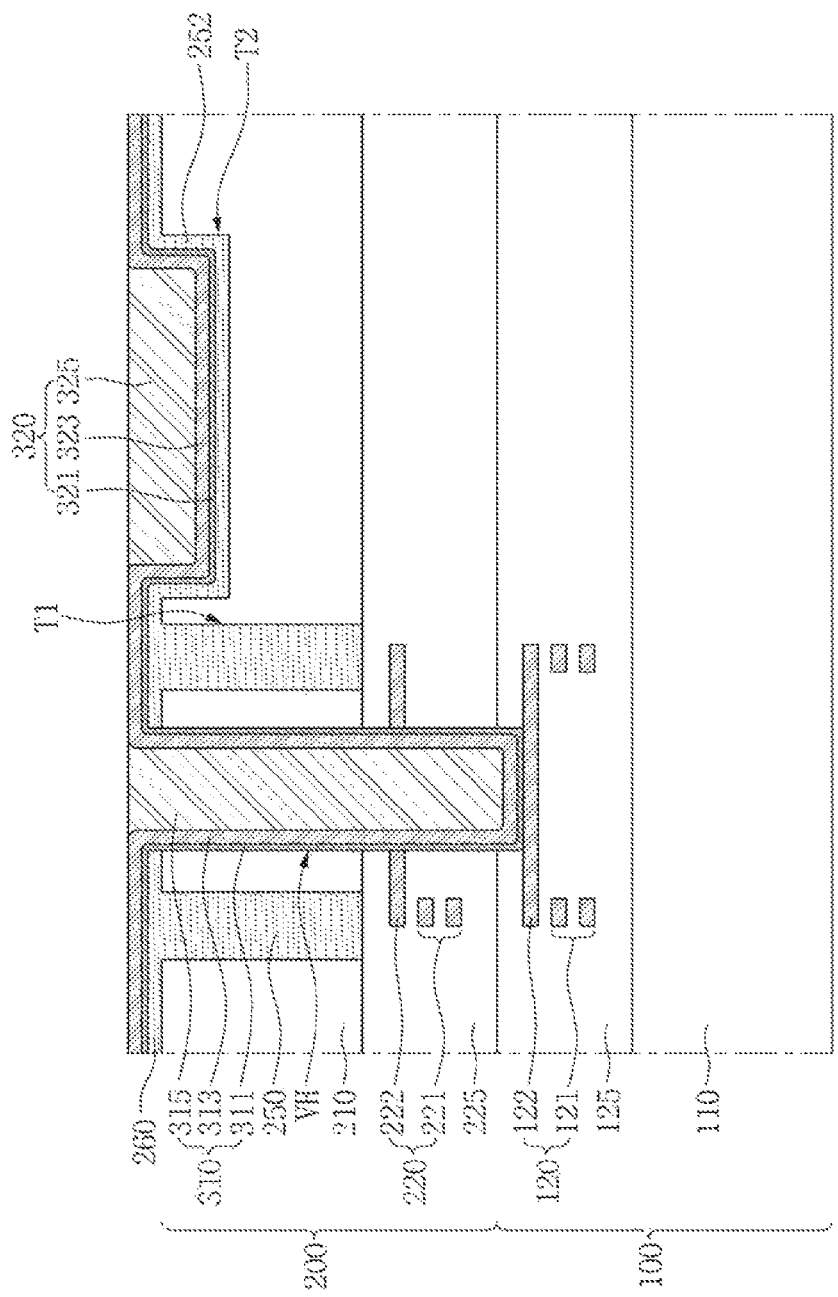

FIGS. 6A to 6B are views for describing a method of fabricating semiconductor device according to certain exemplary embodiments. In the embodiments illustrated in FIGS. 6A and 6B, detailed descriptions of the same content as those of the above-described embodiments will be omitted.

First, referring back to FIGS. 3A to 3D, the method of fabricating semiconductor device may include forming a lower device 100 and an upper device 200, bonding the lower device 100 and the upper device 200, forming a via isolation trench T1 and a pad trench T2 in an upper substrate 210 of the upper device 200. Additionally, the method may include forming a via isolation insulating layer 250, a pad insulating layer 252, and a capping insulating layer 260 on the via isolation trench T1, the pad trench T2, and a surface of the upper substrate 210, respectively. The method may further include forming a via hole VH which exposes a lower via pad 122 of the lower device 100.

Next, referring to FIG. 6A, the method may include conformally forming a barrier metal layer 31 on the bottom surface and inner sidewalls of the via hole VH, the pad insulating layer 252, and the capping insulating layer 260. The method may further include conformally forming a first metal layer 32 on the barrier metal layer 31, and forming a second metal layer 35, which fully fills the via hole VH and the pad trench T2 on the first metal layer 32. The second metal layer 35 may include a different metal material from the second metal layer 33 in FIG. 3E. For example, the second metal layer 35 may include copper (Cu). In the embodiment, the second metal layer 35 may be formed by performing a CVD process.

Referring to FIG. 6B, the method may include removing the second metal layer 35 by performing a planarization process to expose a surface of the first metal layer 32. In this process, a pad structure 320 in the pad trench T2 and a via structure 310 in the via hole VH may be formed. A second via pattern 315 of the via structure 310 may fully fill the via hole VH.

Referring again to FIG. 1D, the method may include forming the passivation layer 280 having the opening 280a which exposes a portion of the surface of the second pad pattern 325 on the capping insulating layer 260, the via structure 310, and the pad structure 320.

FIGS. 7A to 7E are views for describing a method of fabricating semiconductor device according to certain exemplary embodiments. In the embodiment illustrated in FIGS. 7A to 7E, detailed descriptions of the same content as those of the above-described embodiments will be omitted.

First, referring back to FIG. 3A, the method of fabricating semiconductor device according to the embodiment may include forming the lower device 100 and the upper device 200, and bonding the lower device 100 and the upper device 200.

Next, referring to FIG. 7A, the method may include forming the via isolation trench T2 passing through the upper substrate 210, and forming the pad trench T2 that vertically overlapping the via isolation trench T1. An inside space of the via isolation trench Ti may be exposed in a bottom surface of the pad trench T2.

Figure 7B:
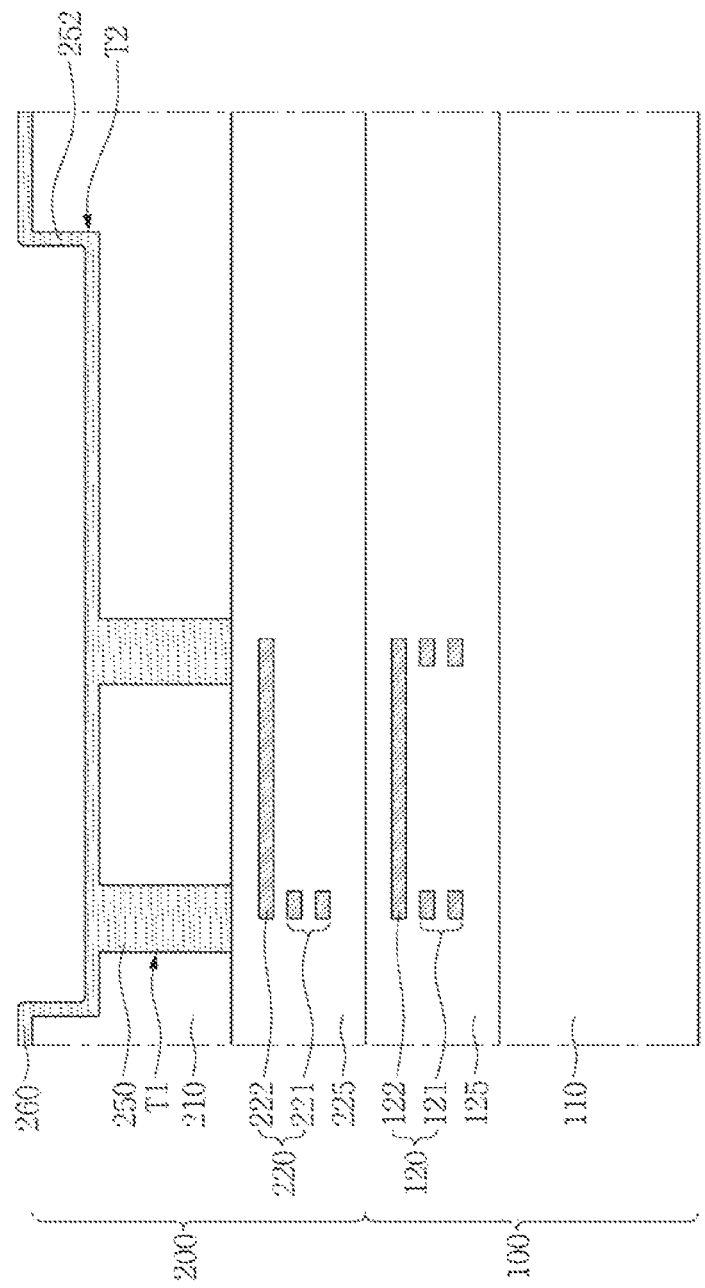

Referring to FIG. 7B, the method may include forming a via isolation insulating layer 250 filling the via isolation trench T1, a pad insulating layer 252 conformally covering the bottom surface and inner sidewalls of the pad trench T2, and a capping insulating layer 260 conformally covering the top surface of the upper substrate 210.

Referring to FIG. 7C, the method may include forming a via hole VH fully passing through the upper substrate 210 and the upper interlayer insulating layer 225, partially passing through the lower interlayer insulating layer 125, and exposing the lower via pad 122.

Figure 7D:
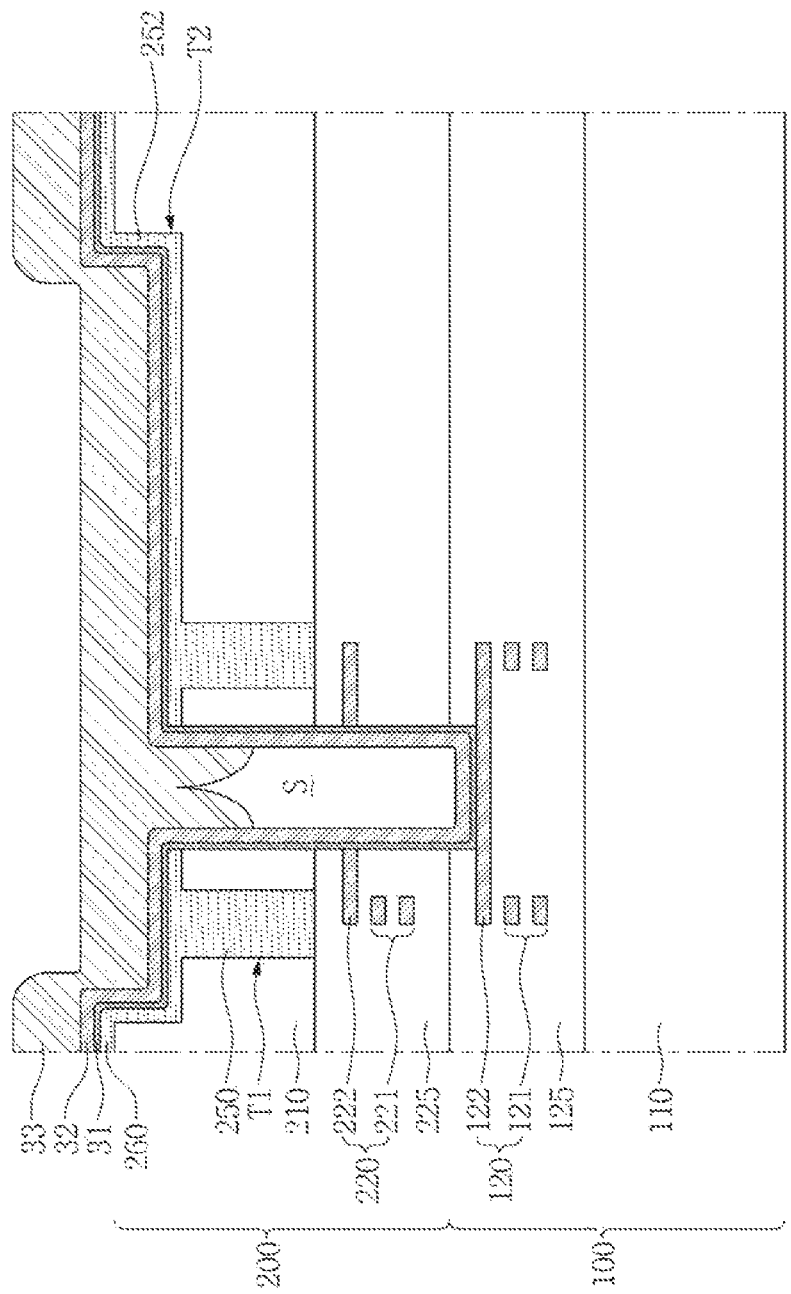

Referring to FIG. 7D, the method may include conformally forming a barrier metal layer 31 on a bottom surface and inner sidewalls of the via hole VH, the pad insulating layer 252 and the capping insulating layer 260. The method may further include conformally forming a first metal layer 32 on the barrier metal layer 31, and forming a second metal layer 33 that partially fills the via hole VH and fully fills the pad trench T2 on the first metal layer 32.

Figure 7E:
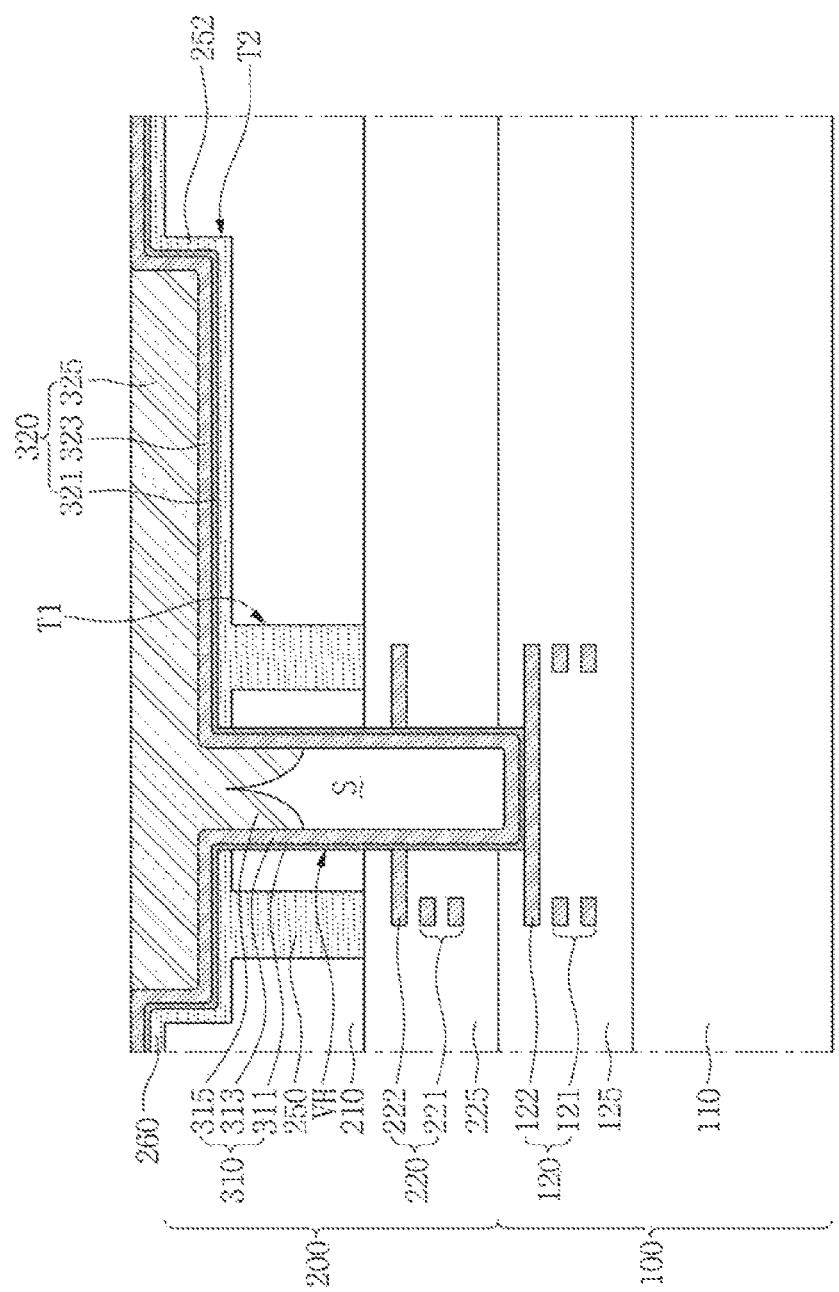

Referring to FIG. 7E, the method may include removing the second metal layer 33 by performing a planarization process to expose a surface of the first metal layer 32 (see FIG. 7D) formed on the capping insulating layer 260.

Referring back again to FIG. 1E, the method may include forming the passivation layer 280 having the opening 280a which exposes a portion of the surface of the second pad pattern 325 on the capping insulating layer 260, the via structure 310, and the pad structure 320.

Figure 8A:
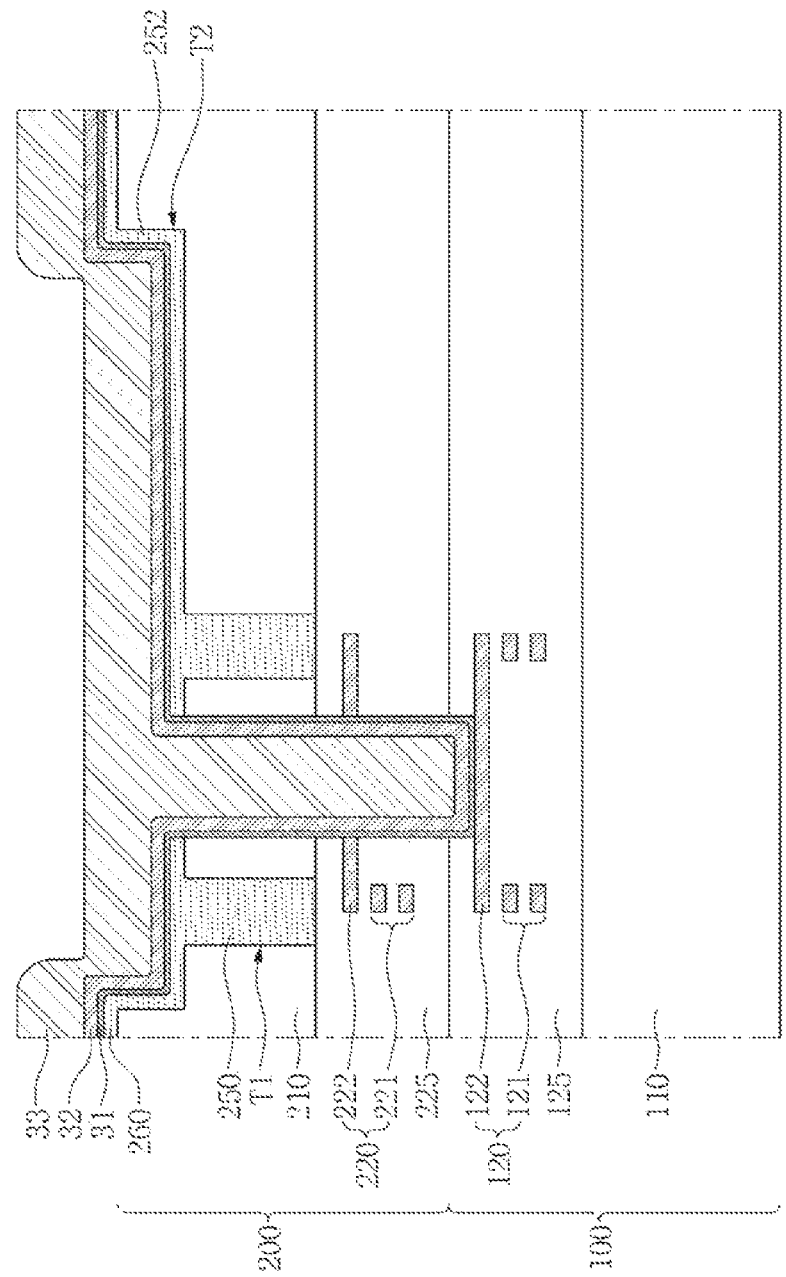
Figure 8B:
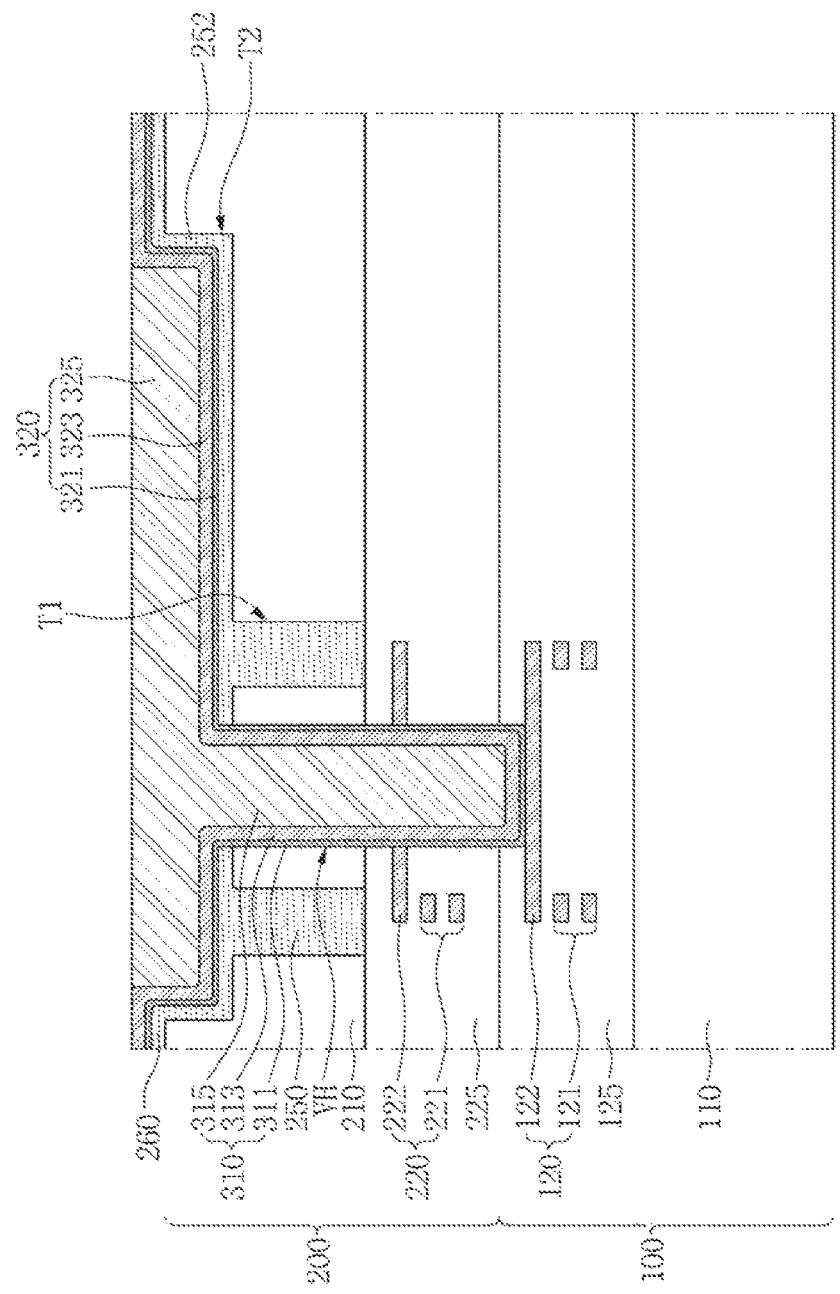

FIGS. 8A to 8B are views for describing a method of fabricating semiconductor device according to certain exemplary embodiments. In the embodiments illustrated in FIGS. 8A and 8B, detailed descriptions of the same content as those of the above-described embodiments will be omitted.

First, referring to FIGS. 3A and 7A to 7C, the method of fabricating semiconductor device may include forming the lower device 100 and the upper device 200, bonding the lower device 100 and the upper device 200, forming the via isolation trench T1 and the pad trench T2, forming the via isolation insulating layer 250, the pad insulating layer 252, and the capping insulating layer 260, and forming the via hole VH exposing the lower via pad 122 of the lower device 100.

Next, referring to FIG. 8A, the method may include conformally forming a barrier metal layer 31 on a bottom surface and inner sidewalls of the via hole VH, the pad insulating layer 252 and the capping insulating layer 260. Additionally, the method may include conformally forming a first metal layer 32 on the barrier metal layer 31, and forming a second metal layer 35 fully filling the via hole VH and the pad trench T2 on the first metal layer 32. The second metal layer 35 may include a different metal material from the second metal layer 33 in FIG. 7D.

Referring to FIG. 8B, the method may include removing the second metal layer 35 by performing a planarization process to expose a surface of the first metal layer 32 (Refer to FIG. 8A) formed on the capping insulating layer 260.

Referring back to FIG. 1F, the method may include forming the passivation layer 280 having the opening 280a which exposes a portion of the surface of the second pad pattern 325 on the capping insulating layer 260, the via structure 310, and the pad structure 320.

FIGS. 9A to 9D are views for describing a method of fabricating semiconductor device according to certain exemplary embodiments. In the embodiment illustrated in FIGS. 9A to 9D, detailed descriptions of the same content as those of the above-described embodiments will be omitted.

First, referring back to FIGS. 3A and 3B, the method of fabricating semiconductor device may include forming the lower device 100 and the upper device 200, bonding the lower device 100 and the upper device 200, and forming the via isolation trench T1 and the pad trench T2.

Next, referring to FIG. 9A, the method may include forming a via isolation insulating layer 250 filling the via isolation trench T1, forming a pad insulating layer 252 conformally covering the bottom surface and inner sidewalls of the pad trench T2, and forming a capping insulating layer 260 conformally covering the top surface of the upper substrate 210.

Figure 9B:
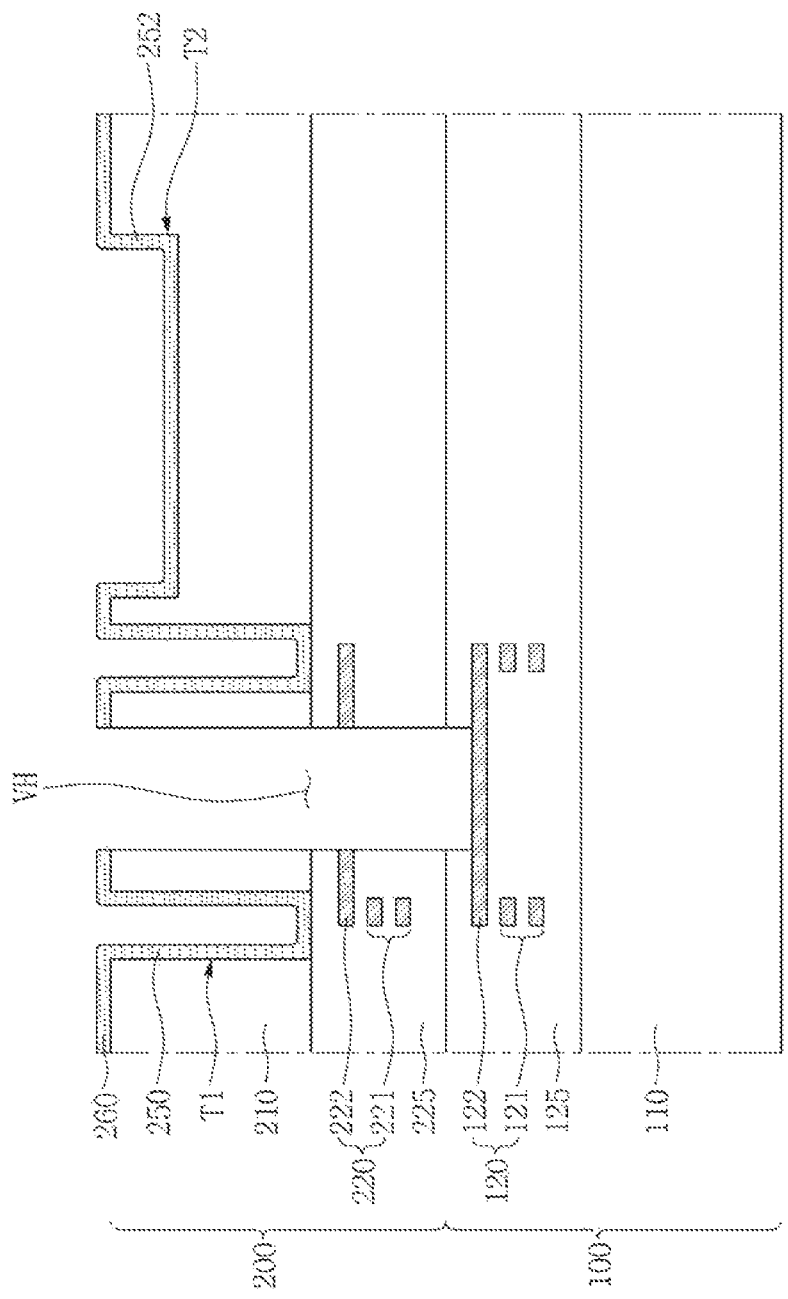

Referring to FIG. 9B, the method may include forming a via hole VH fully passing through the upper substrate 210 and the upper interlayer insulating layer 225, partially passing through the lower interlayer insulating layer 125, and exposing the lower via pad 122.

Figure 9C:
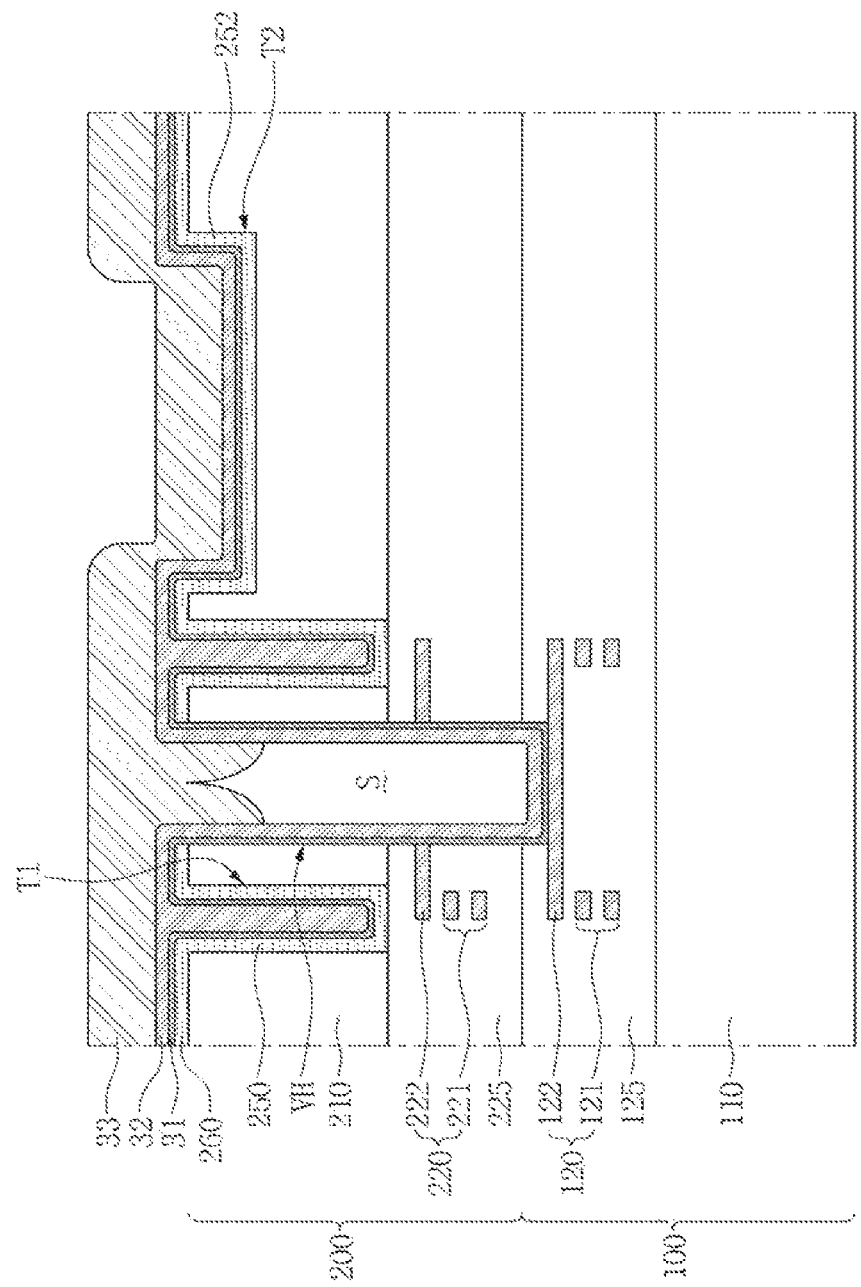

Referring to FIG. 9C, the method may include conformally forming a barrier metal layer 31 on a bottom surface and inner sidewalls of the via hole VH, the pad insulating layer 252 and the capping insulating layer 260. Additionally, the method may include conformally forming a first metal layer 32 on the barrier metal layer 31, and forming a second metal layer 33 partially filling the via hole VH and fully filling the pad trench T2 on the first metal layer 32. In this process, the via isolation trench T1 may be filled by the barrier metal layer 31 and the first metal layer 32.

Figure 9D:
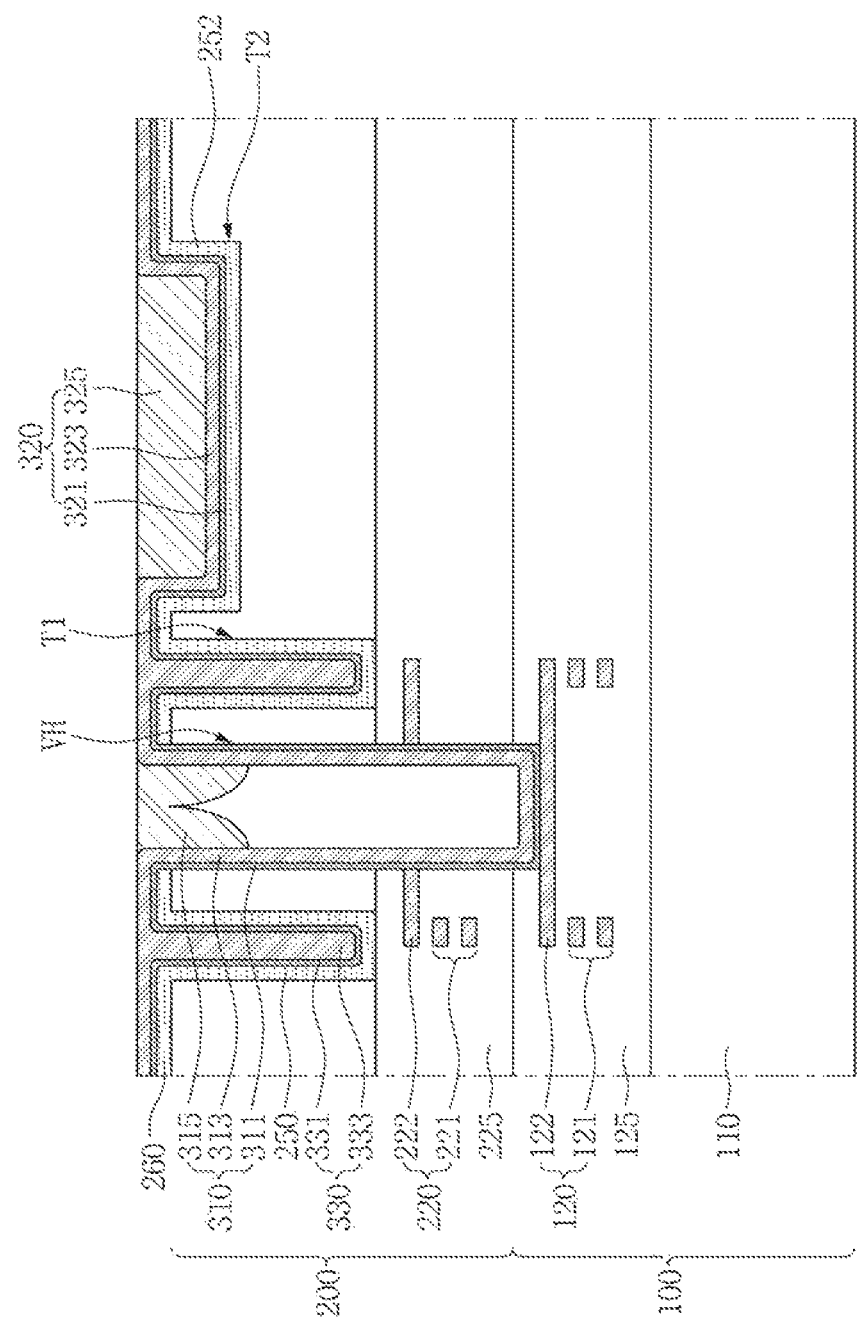

Referring to FIG. 9D, the method may include removing the second metal layer 33 by performing a planarization process to expose a surface of the first metal layer 32 (see FIG. 9C) formed on the capping insulating layer 260.

Referring back to FIG. 1G, the method may include forming the passivation layer 280 having the opening 280a which exposes a portion of the surface of the second pad pattern 325 on the capping insulating layer 260, the via structure 310 and the pad structure 320.

FIGS. 10A to 10F are views for describing a method of fabricating semiconductor device according to certain exemplary embodiments. In the embodiments illustrated in FIGS. 10 to 10F, the semiconductor device may be a backside illuminated image sensor. In the embodiment, detailed descriptions of the same content as those of the above-described embodiments will be omitted.

Figure 10A:
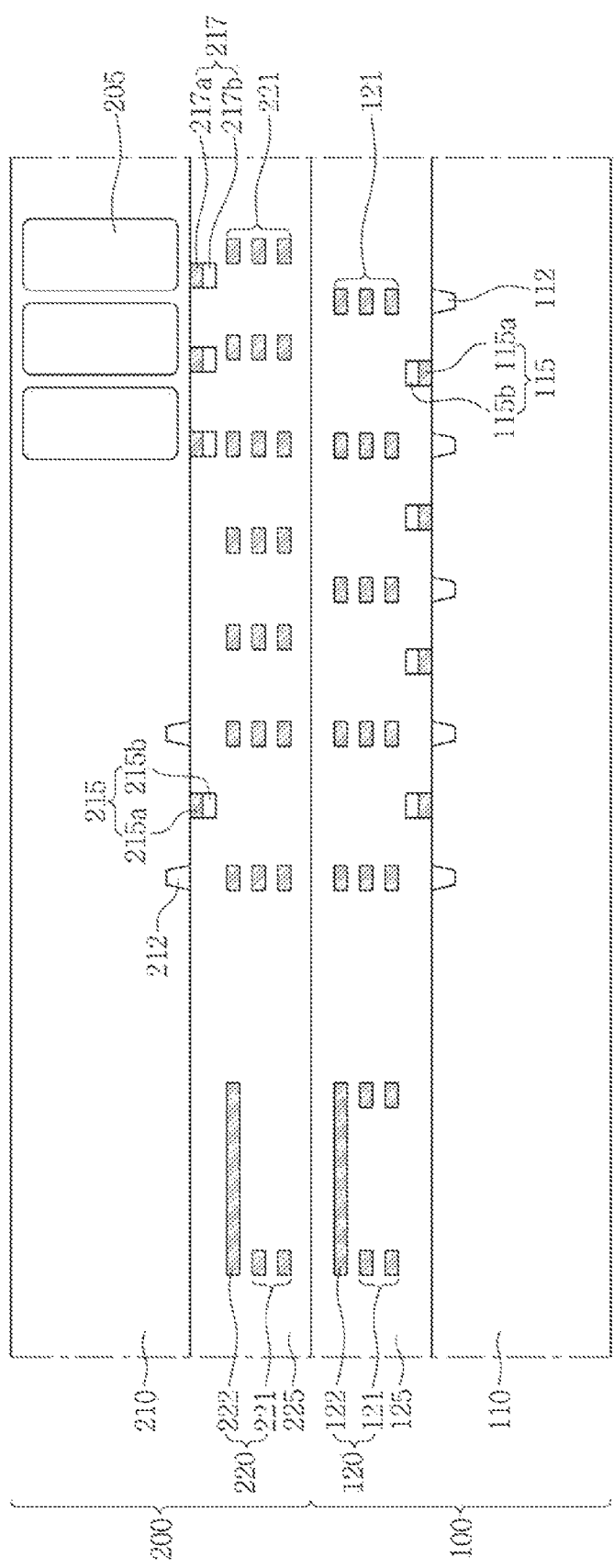

Referring to FIG. 10A, the method of fabricating semiconductor device may include forming a lower device 100, forming an upper device 200, and bonding the lower device 100 and the upper device 200.

The forming of the lower device 100 may include forming a lower device isolation region 112 in a lower substrate 110, forming a lower gate structure 115 on the lower substrate 110, and forming a lower circuit 120 and a lower interlayer insulating layer 125 on the lower substrate 110.

The forming of the lower device isolation region 112 may include forming a trench in the lower substrate 110, and filling the trench with an insulating material.

The forming of the lower gate structure 115 may include forming a lower gate electrode 115a and a lower gate capping layer 115b on the lower substrate 110 using a deposition process, a photolithography process, and/or an etching process. The lower gate electrode 115a may include, for example, doped poly-Si, a metal silicide, or a metal. The lower gate capping layer 115b may include silicon nitride.

The lower circuit 120 may include a lower interconnection 121 and a lower via pad 122. The lower circuit 120 may include, for example, a metal, a metal silicide, or doped poly-Si formed using a deposition process, a plating process, and/or a patterning process. The lower interlayer insulating layer 125 may include silicon oxide.

The forming of the upper device 200 may include forming photodiodes 205 and an upper device isolation region 212 in an upper substrate 210, forming an upper gate structure 215 and a transmission gate structure 217 on the upper substrate 210, and forming an upper circuit 220 and an upper interlayer insulating layer 225 on the upper substrate 210.

The forming of the upper device isolation region 212 may include forming a trench in the upper substrate 210, and filling the trench with an insulating material.

The forming of the upper gate structure 215 may include forming an upper gate electrode 215a and an upper gate capping layer 215b on the upper substrate 210 using a deposition process, a photolithography process, and/or an etching process. In some embodiments, the upper gate capping layer 215b may be formed on the upper gate electrode 215a. The upper gate electrode 215a may include, for example, doped poly-Si, a metal silicide, or a metal. The upper gate capping layer 215b may include silicon nitride.

The forming of the transmission gate structure 217 may include forming a transmission gate electrode 217a and a transmission gate capping layer 217b on the upper substrate 210 using a deposition process, a photolithography process, and/or an etching process. In some embodiments, the transmission gate capping layer 217b may be formed on the transmission gate electrode 217a. The transmission gate electrode 217a may include doped poly-Si, a metal silicide, or a metal. The transmission gate capping layer 217b may include silicon nitride. The upper gate structure 215 may be simultaneously formed with the transmission gate structure 217. In some embodiments, the upper gate structure 215 and the transmission gate structure 217 may be formed using the same deposition process.

The upper circuit 220 may include an upper interconnection 221 and an upper via pad 222. The upper circuit 220 may include a metal, a metal silicide, or doped poly-Si formed using a deposition process, a plating process, and/or a patterning process. The upper interlayer insulating layer 225 may include silicon oxide.

The bonding of the lower device 100 and the upper device 200 may be performed to form a contact between the lower interlayer insulating layer 125 of the lower device 100 and the upper interlayer insulating layer 225 of the upper device 200.

Figure 10B:
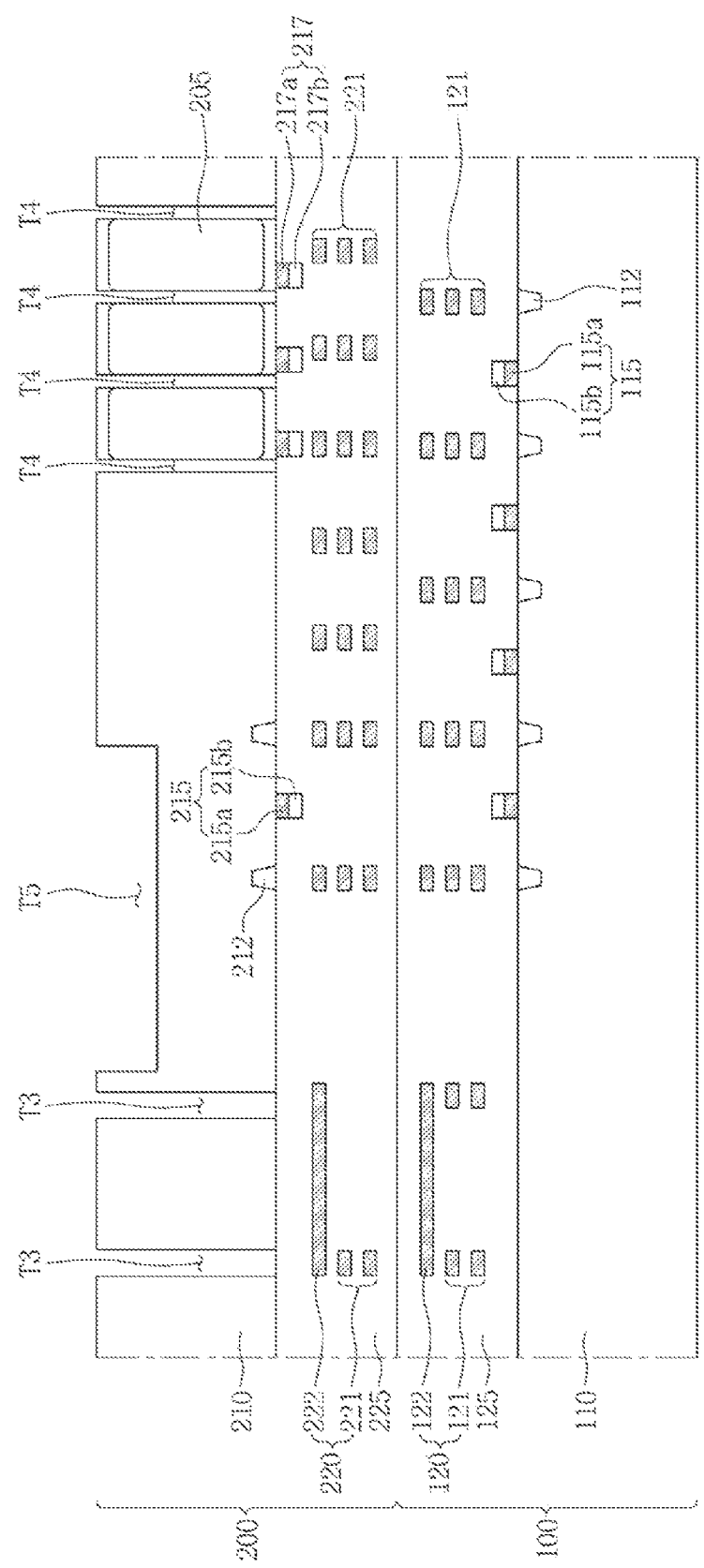

Referring to FIG. 10B, the method may include forming a via isolation trench T3, a pixel isolation trench T4, and a pad trench T5 in the upper substrate 210. The pixel isolation trench T4 may be formed between the photodiodes 205. In some embodiments, a horizontal width of the via isolation trench T3 may be greater than a horizontal width of the pixel isolation trench T4. The pad trench T5 may be spaced apart from the via isolation trench T3 and the pixel isolation trench T4 in a horizontal direction. The pad trench T5 may be formed adjacent to the via isolation trench T3. For example, the pad trench T5 may be formed near the via isolation trench T3.

In some embodiments, the method may include forming the via isolation trench T3, the pixel isolation trench T4, and the pad trench T5 vertically overlapping the via isolation trench T3. For example, referring to the exemplary embodiment of FIG. 7A, the pad trench T2 may be formed to vertically overlap the via isolation trench T1. Hereafter, the semiconductor device 20D in FIG. 2D may be formed by performing processes described with reference to FIGS. 10C to 10F.

Figure 10C:
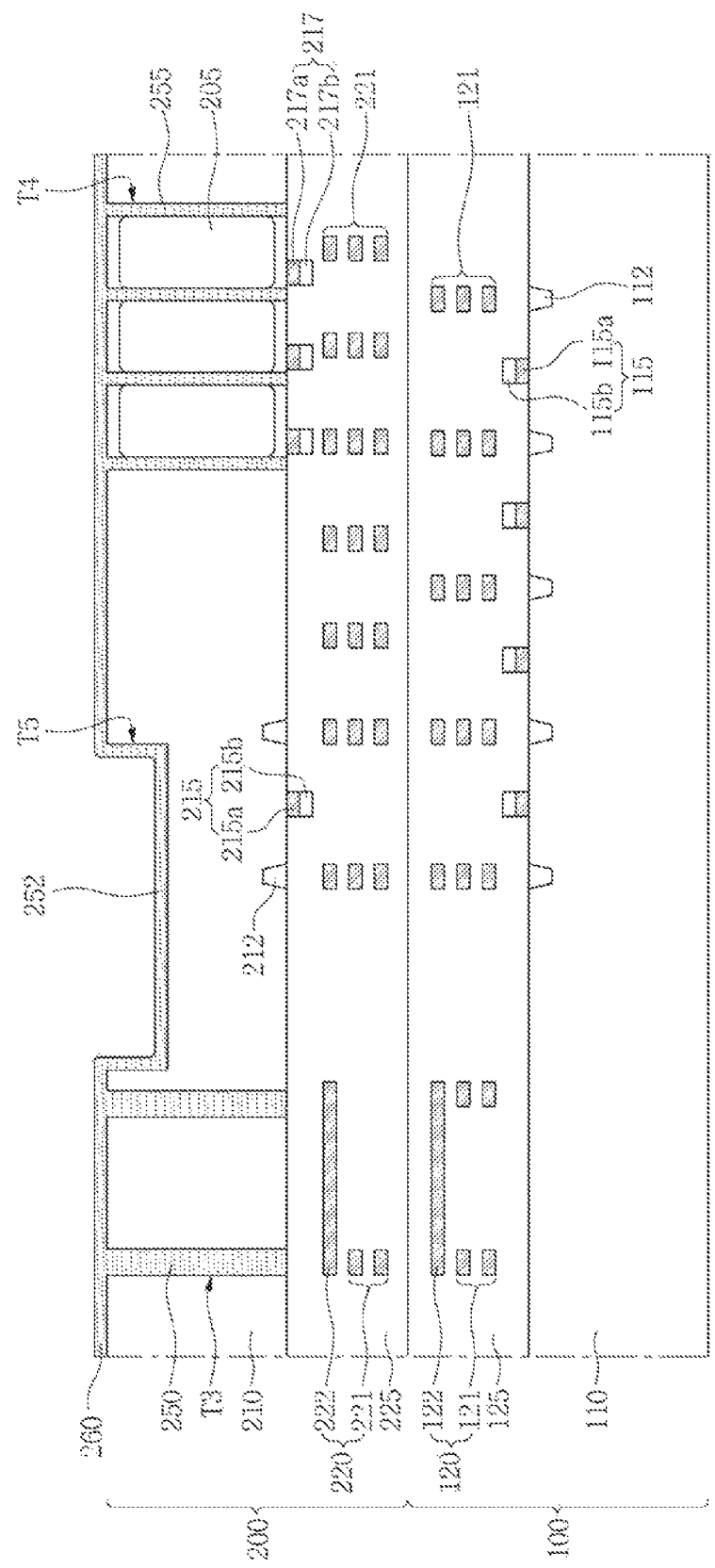

Referring to FIG. 10C, the method may include forming a via isolation insulating layer 250 filling the via isolation trench T3, a pad insulating layer 252 conformally covering the bottom surface and inner sidewalls of the pad trench T5, a pixel isolation insulating layer 255 filling the pixel isolation trench T4, and a capping insulating layer 260 conformally covering the top surface of the upper substrate 210.

Figure 10D:
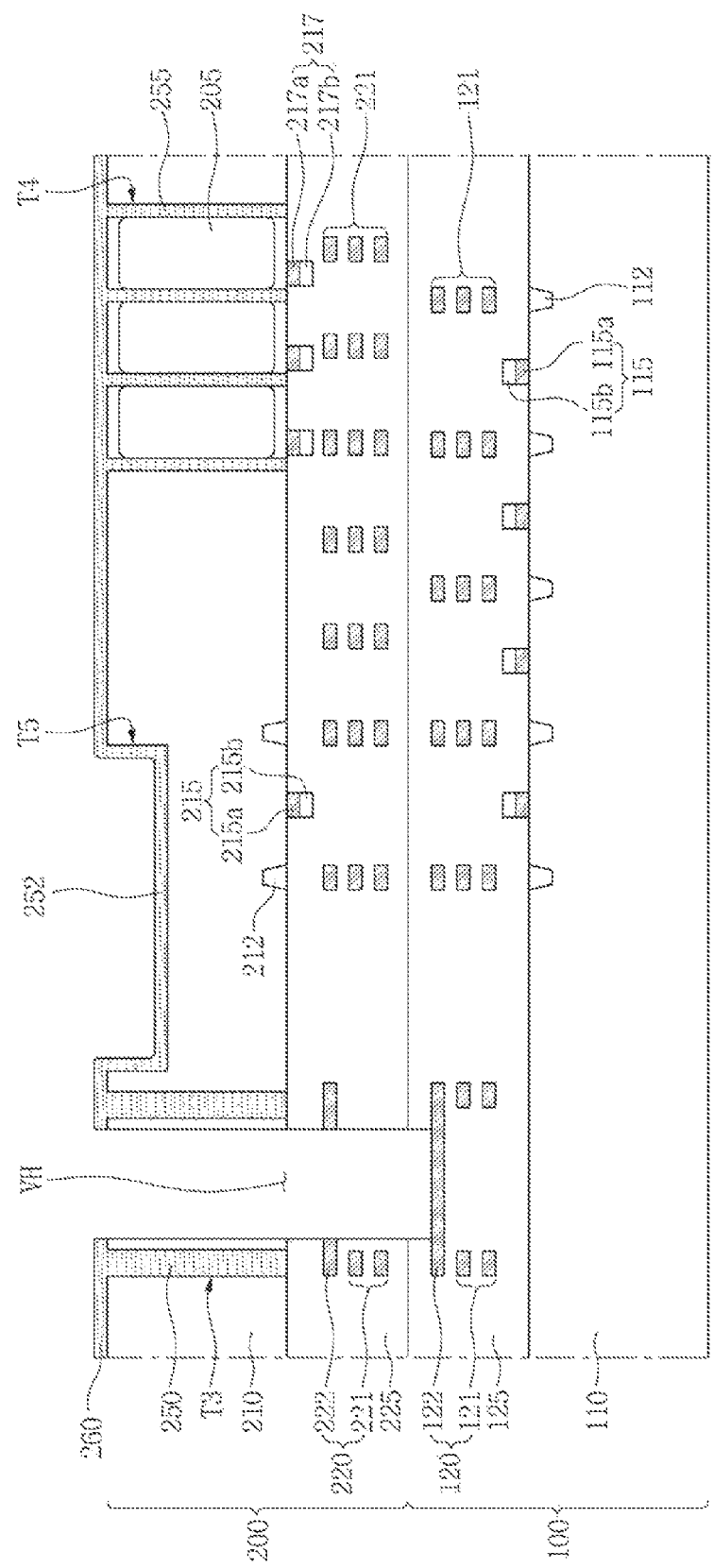

Referring to FIG. 10D, the method may include forming a via hole VH fully passing through the upper substrate 210 and the upper interlayer insulating layer 225, partially passing through the lower interlayer insulating layer 125, and exposing the lower via pad 122.

Referring to FIG. 10E, the method may include conformally forming a barrier metal layer 31 on a bottom surface and inner sidewalls of the via hole VH, the pad insulating layer 252 and the capping insulating layer 260, conformally forming a first metal layer 32 on the barrier metal layer 31, and forming a second metal layer 33 partially filling the via hole VH and fully filling the pad trench T2 on the first metal layer 32. The second metal layer 33 may be formed in only an upper portion of the via hole VH. Accordingly, an air space S may be formed in a lower portion of the via hole VH.

In some embodiments, referring back to FIG. 6A, the method may include conformally forming the barrier metal layer 31 on a bottom surface and inner sidewalls of the via hole VH, the pad insulating layer 252 and the capping insulating layer 260, conformally forming the first metal layer 32 on the barrier metal layer 31, and forming the second metal layer 33 fully filling the via hole VH and the pad trench T2 on the first metal layer 32. Hereafter, the semiconductor device 20C in FIG. 2C may be formed by performing a process described with reference to FIG. 9F.

Figure 10F:
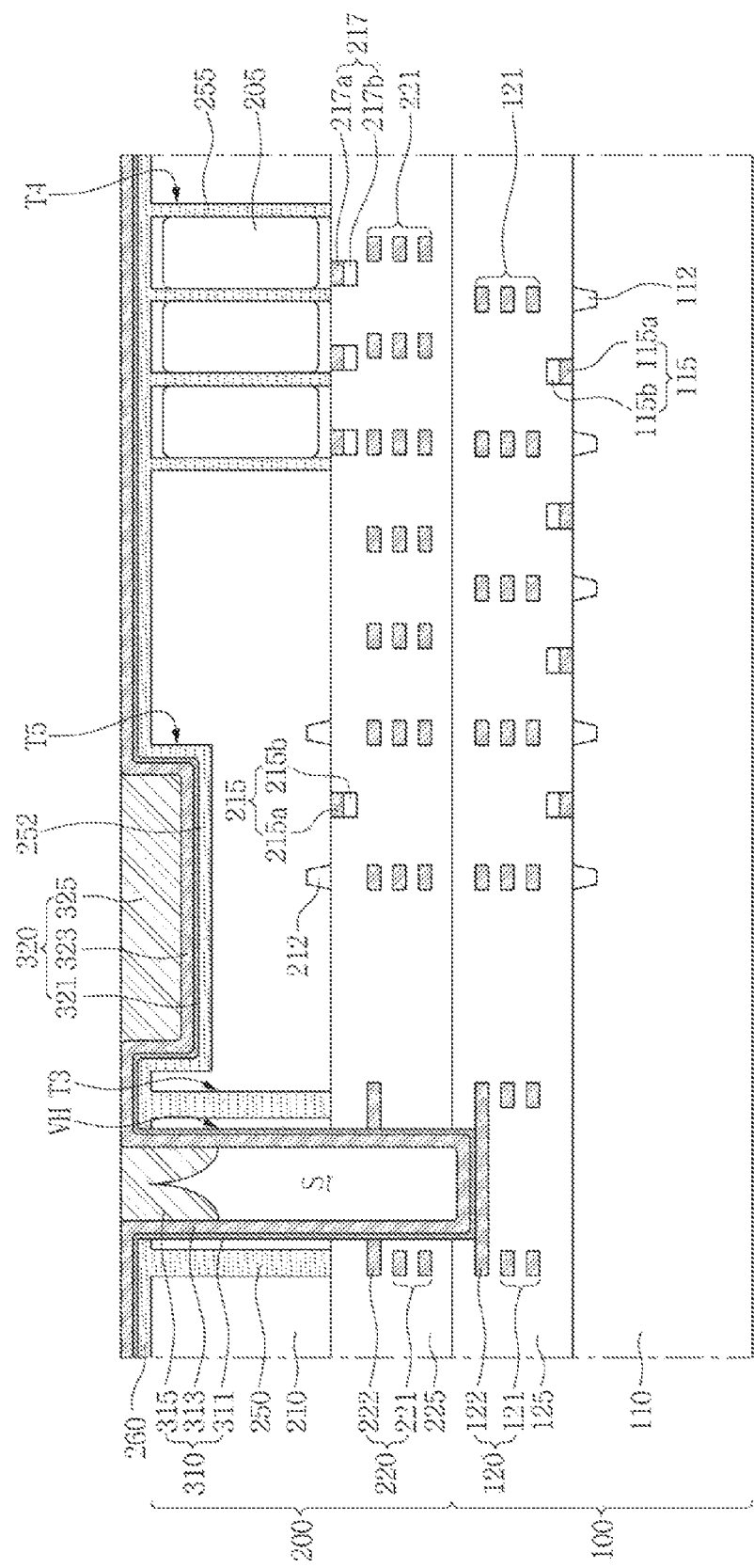

Referring to FIG. 10F, the method may include removing the second metal layer 33 (see FIG. 10E) by performing a planarization process to expose a surface of the first metal layer 32 (see FIG. 10E) formed on the capping insulating layer 260. In this process, a via structure 310 disposed in the via hole VH and a pad structure 320 disposed in the pad trench T2 may be formed.

Referring back to FIG. 2A, the method may include patterning the via barrier pattern 311, the first via pattern 313, the pad barrier pattern 321, and the first pad pattern 323 which extend onto the capping insulating layer 260. The method may further include forming a passivation layer 280 having an opening 280a which exposes a portion of the surface of the second pad pattern 325 on the capping insulating layer 260, the via structure 310, and the pad structure 320.

In some embodiments, referring to FIGS. 4A to 5B, the method may include forming the mask pattern M which partially exposes a surface of the second metal layer 33, and patterning the second metal layer 33 by performing an etching process using the mask pattern M as an etching mask. The semiconductor devices 20B and 20C in FIGS. 2B and 2C may be formed by performing the above process.

Figure 11:
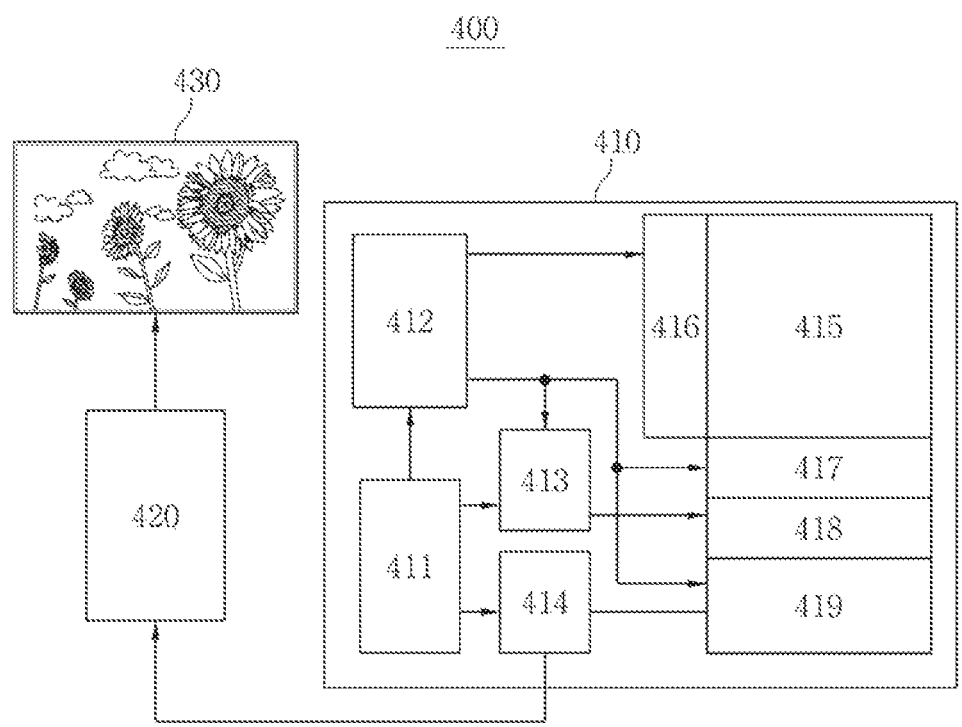
FIG. 11 is a schematic block diagram of a camera system according to certain example embodiments.

FIG. 11 is a schematic block diagram of a camera system 400 according to certain exemplary embodiments. Referring to FIG. 11, the camera system 400 may include an image sensing part 410, an image signal processing part 420, and an image display part 430. The image sensing part 410 may include a control register block 411, a timing generator 412, a lamp generator 413, a buffering part 414, an active pixel sensor array 415, a row driver 416, a correlated double sampler 417, a comparing part 418, and an analog-to-digital converter (ADC) 419. The control register block 411 may control overall operations of the image sensing part 410. For example, the control register block 411 may transmit operating signals to the timing generator 412, the lamp generator 413, and the buffering part 414. The timing generator 412 may generate an operation timing reference signal for several components of the image sensing part 410. The operation timing reference signal generated by the timing generator 412 may be transmitted to the row driver 416, the correlated double sampler 417, the comparing part 418, and/or the ADC 419. The lamp generator 413 may generate and transmit lamp signals for the correlated double sampler 417 and/or the comparing part 418. The buffering part 414 may include a latch circuit. The buffering part 414 may temporarily store an image signal to be transmitted to a device or apparatus that is outside of or external to the image sensing part 410. The active pixel sensor array 415 may sense an external image. The active pixel sensor array 415 may include a plurality of active pixel sensors, each of which may include a backside illuminated image sensor according to certain disclosed embodiments. For example, the active pixel sensor array 415 may include any of the semiconductor devices having a backside illuminated image sensor, such as those disclosed herein.

The row driver 416 may selectively activate a row of the active pixel sensor array 415. The correlated double sampler 417 may sample and output an analog signal generated by the active pixel sensor array 415. The comparing part 418 may compare data transmitted by the correlated double sampler 417 with a slope of a lamp signal fed back in response to analog reference voltages and generate various reference signals. The ADC 419 may convert analog image data into digital image data.

Figure 12:
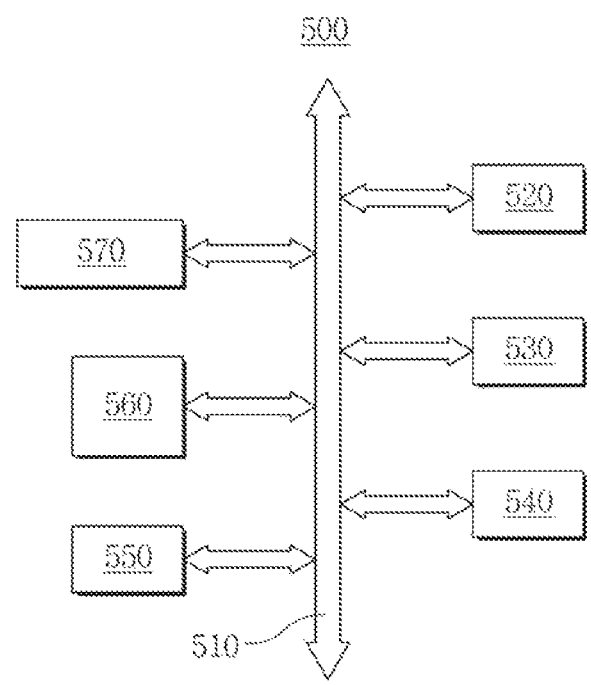
FIG. 12 is a schematic block diagram of an electronic system according to certain example embodiments.

FIG. 12 is a schematic block diagram of an electronic system 500 according to certain exemplary embodiments. Referring to FIG. 12, the electronic system 500 may include a bus 510, and an image sensing part 520, a central processing unit (CPU) 530, and an input/output (I/O) part 540. The electronic system 500 may further include a memory drive 550. The electronic system 500 may further include an optical disk drive (ODD) 560. The electronic system 500 may further include an external communication part 570. The image sensing part 520 may include a backside illuminated image sensor according to certain disclosed embodiments. For example, the image sensing part 520 may include any of the semiconductor devices having a backside illuminated image sensor, such as those disclosed herein.

The CPU 530 may include a microprocessor. The I/O part 540 may include one of various input apparatuses including, for example, an operating button, a switch, a keyboard, a mouse, a keypad, a touch pad, a scanner, a camera, and an optical sensor or include one of a liquid crystal display (LCD) monitor, a light emitting diode (LED) monitor, a cathode-ray tube (CRT) monitor, a printer, a display device for displaying various pieces of visual information, etc. The memory drive 550 may include a dynamic random access memory (DRAM), a static random access memory (SRAM), a phase-changeable random access memory (PRAM), a resistive random access memory (RRAM), a magnetic random access memory (MRAM), a non-volatile memory (NVM), a flash memory, a solid-state disk (SSD), a hard disk (HD) and/or various memory devices, or drivers thereof. The ODD 560 may include, for example, a CD-ROM drive or a DVD drive. The external communication part 570 may include a modem, a local area network (LAN) card, or a Universal Serial Bus (USB) and include an external memory, a wireless broadband (WiBro) communication device, or an infrared communication device.

As can be seen from the foregoing, semiconductor devices according to the disclosed embodiments include a pad structure almost buried in the upper substrate. In some embodiments, a larger portion of the pad structure may be buried in the upper substrate, and a different smaller portion of the pad structure may protrude above a top surface of the substrate. As a result of the burying of the pad structure in the upper substrate, a level difference between the pad structure and the top surface of the upper substrate can be minimized.

Accordingly, when performing a coating process for forming a photo resist pattern, color filter, or the like on the top surface of the upper substrate in a subsequent process, a uniform coating layer can be formed. For example, because of the reduced step difference caused by burying the pad structure, a non-uniform coating layer can be avoided. As a result, pattern defects and image defects can be prevented.

Furthermore, since a level difference between the pad structure and the top surface of the upper substrate is minimized, a situation where a light reflected from the surface of the upper substrate is reflected by a surface of the pad structure and the light reflected from a side surface of the pad structure is incident onto the photodiode can be prevented.

Although a few embodiments have been described, those skilled in the art will readily appreciate that many modifications are possible without materially departing from the novel teachings and advantages. Accordingly, all such modifications are intended to be included within the scope as defined in the claims.

What is claimed is:

1. A semiconductor device comprising:
   a substrate;
   a circuit layer formed on a first surface of the substrate and including a via pad and an interlayer insulating layer covering the via pad;
   a via structure passing fully through the substrate, passing partially through the interlayer insulating layer, and contacting the via pad;
   a via isolation insulating layer passing through the substrate and spaced apart from outer side surfaces of the via structure in a horizontal direction;
   a pad structure buried in the substrate and exposed at a second surface of the substrate opposite the first surface of the substrate;
   a pad insulating layer formed between the substrate and the pad structure; and
   a capping insulating layer formed on the second surface of the substrate,
   wherein the via isolation insulating layer, the pad insulating layer, and the capping insulating layer are in continuity materially.

2. The semiconductor device of claim 1, wherein the pad structure is spaced apart from the via isolation insulating layer in a horizontal direction.

3. The semiconductor device of claim 2,
   wherein the via structure includes:
      a via barrier pattern conformally formed on a bottom surface and inner sidewalls of a via hole which fully passes through the substrate and partially passes through the interlayer insulating layer;
      a first via pattern conformally formed on the via barrier pattern; and
      a second via pattern formed on the first via pattern, and
   wherein the pad structure includes:
      a pad barrier pattern conformally formed on a bottom surface and inner sidewalls of a pad trench formed in the substrate;
      a first pad pattern conformally formed on the pad barrier pattern; and
      a second pad pattern formed on the first pad pattern.

4. The semiconductor device of claim 3, wherein:
   the via barrier pattern is in material continuity with the pad barrier pattern; and the first via pattern is in material continuity with the first pad pattern.

5. The semiconductor device of claim 3, wherein the second via pattern partially fills the via hole.

6. The semiconductor device of claim 3, wherein the second pad pattern includes:
   a first portion spaced apart from the via isolation insulating layer in a horizontal direction and buried in the pad trench; and
   a second portion extending onto the via structure.

7. The semiconductor device of claim 3, wherein the second via pattern fully fills the via hole.

8. The semiconductor device of claim 3, wherein the via barrier pattern, the first via pattern, the pad barrier pattern, and the first pad pattern extend onto the second surface of the substrate.

9. The semiconductor device of claim 1, wherein the pad structure vertically overlaps the via structure and the via isolation insulating layer.

10. The semiconductor device of claim 1, wherein the pad structure includes a buried part buried in the substrate and a protruding part that protrudes from the second surface of the substrate.

11. The semiconductor device of claim 1, wherein the interlayer insulating layer is a lower interlayer insulating layer and the via pad is a lower via pad, the semiconductor device further comprising:
   a lower substrate, wherein the lower interlayer insulating layer is on the lower substrate; and
   an upper interlayer insulating layer on the lower interlayer insulating layer, wherein the upper interlayer insulating layer includes an upper via pad.

12. A semiconductor device comprising:
   a substrate;
   a via structure passing fully through the substrate and contacting a via pad;
   a via isolation insulating layer passing through the substrate and spaced apart from outer side surfaces of the via structure;
   a pad structure having a buried part buried in the substrate and a protruding part protruding from a top surface of the substrate;
   a pad insulating layer between a bottom and side surfaces of the pad structure and a first portion of the top surface of the substrate;
   a passivation layer on the top surface of the substrate and formed to expose a portion of a top surface of the pad structure;
   a photodiode in the substrate;
   a color filter disposed on the passivation layer and vertically aligned with the photodiode;
   a microlens on the color filter; and
   a capping insulating layer formed on a second portion of the top surface of the substrate,
   wherein the via isolation insulating layer, the pad insulating layer, and the capping insulating layer are in continuity materially.

13. The semiconductor device of claim 12, further comprising:
   a circuit layer formed on a bottom surface of the substrate and including the via pad and an interlayer insulating layer covering the via pad.

14. The semiconductor device of claim 12, wherein the pad structure is spaced apart from the via isolation insulating layer in a horizontal direction.

15. A semiconductor device comprising:
   an upper substrate on an upper interlayer insulating layer;
   a via structure passing fully through the upper substrate and the upper interlayer insulating layer, passing partially through a lower interlayer insulating layer, and contacting an upper via pad and a lower via pad;
   a via isolation insulating layer passing through the upper substrate and spaced apart from outer side surfaces of the via structure;
   a pad structure having a buried part buried in the upper substrate and a protruding part that protrudes from a top surface of the upper substrate;
   a pad insulating layer between a bottom and side surfaces of the pad structure and a first portion of the top surface of the upper substrate;
   a passivation layer on the top surface of the upper substrate and formed to expose a portion of a top surface of the pad structure;
   a photodiode in the upper substrate;
   a color filter disposed on the passivation layer and vertically aligned with the photodiode;
   a microlens on the color filter; and
   a capping insulating layer formed on a second portion of the top surface of the upper substrate,
   wherein the via isolation insulating layer, the pad insulating layer, and the capping insulating layer are in continuity materially.

16. The semiconductor device of claim 15, further including:
   a lower substrate;
   a lower interlayer insulating layer on the lower substrate, wherein the lower interlayer insulating layer includes a lower via pad; and
   an upper interlayer insulating layer on the lower interlayer insulating layer, wherein the upper interlayer insulating layer includes an upper via pad.

17. The semiconductor device of claim 15, wherein the pad structure is spaced apart from the via isolation insulating layer in a horizontal direction.

18. The semiconductor device of claim 15, wherein the pad structure vertically overlaps the via structure and the via isolation insulating layer.

19. The semiconductor device of claim 15, wherein a portion of the pad structure extends onto the via structure.

* * * * *